(12) United States Patent
Niwa et al.

(10) Patent No.: US 8,432,169 B2
(45) Date of Patent: Apr. 30, 2013

(54) PROXIMITY SENSOR

(75) Inventors: Masahisa Niwa, Suita (JP); Kunitaka Okada, Hirakata (JP); Fumihiro Kasano, Katano (JP); Sukoya Tawaratsumida, Amagasaki (JP)

(73) Assignee: Panasonic Corporation, Osaka (JP)

( * ) Notice: Subject to any disclaimer, the term of this patent is extended or adjusted under 35 U.S.C. 154(b) by 634 days.

(21) Appl. No.: 12/679,157

(22) PCT Filed: Sep. 19, 2008

(86) PCT No.: PCT/JP2008/066956
§ 371 (c)(1),
(2), (4) Date: Mar. 19, 2010

(87) PCT Pub. No.: WO2009/038159
PCT Pub. Date: Mar. 26, 2009

(65) Prior Publication Data
US 2010/0225332 A1    Sep. 9, 2010

(30) Foreign Application Priority Data

| Sep. 20, 2007 | (JP) | 2007-244337 |
| Feb. 8, 2008 | (JP) | 2008-029500 |
| Feb. 8, 2008 | (JP) | 2008-029501 |
| May 12, 2008 | (JP) | 2008-125238 |
| Aug. 11, 2008 | (JP) | 2008-207266 |

(51) Int. Cl.
*G01R 27/28*        (2006.01)
(52) U.S. Cl.
USPC .................. 324/652; 324/654; 324/686
(58) Field of Classification Search ........ 324/652, 324/654, 686, 207.16, 207.26; 340/539.23; 702/57; 331/65
See application file for complete search history.

(56) References Cited

U.S. PATENT DOCUMENTS

| 4,001,718 | A | * | 1/1977 | Wilson et al. | 331/65 |
| 5,034,704 | A | * | 7/1991 | Tomioka et al. | 331/65 |
| 8,159,234 | B2 | * | 4/2012 | Niwa | 324/686 |
| 2005/0231360 | A1 | | 10/2005 | Fujimori et al. | |

FOREIGN PATENT DOCUMENTS

| JP | 55-39109 A | 3/1980 |
| JP | 5-15536 U | 2/1993 |

(Continued)

OTHER PUBLICATIONS

Notification of Reasons for Refusal for Application No. 2008-125238 from Japan Patent Office mailed Aug. 30, 2011.

(Continued)

*Primary Examiner* — Arleen M Vazquez
(74) *Attorney, Agent, or Firm* — McDermott Will & Emery LLP

(57) ABSTRACT

A proximity sensor has an oscillation circuit, an amplitude measurement circuit, a control circuit and a signal processing circuit. The oscillation circuit has an LC resonant circuit and an oscillation control circuit that is configured to supply an electric current to the LC resonant circuit to generate oscillating voltage across the LC resonant circuit. The amplitude measurement circuit is configured to produce an amplitude signal corresponding to the amplitude of the oscillating voltage. The control circuit is configured to set the negative conductance of the oscillation control circuit to a critical value by which the LC resonant circuit can oscillate based on the amplitude signal. The signal processing circuit is configured to produce a distance signal corresponding to the distance between an object and the sensing coil based on a parameter associated with the negative conductance.

49 Claims, 32 Drawing Sheets

FOREIGN PATENT DOCUMENTS

| | | | |
|---|---|---|---|
| JP | 5-315929 | A | 11/1993 |
| JP | 6-40802 | U | 5/1994 |
| JP | 7-154226 | A | 6/1995 |
| JP | 7-162280 | A | 6/1995 |
| JP | 8-88555 | A | 4/1996 |
| JP | 2005-293892 | A | 10/2005 |
| JP | 2005-295248 | A | 10/2005 |
| JP | 2007-5208 | A | 1/2007 |

OTHER PUBLICATIONS

International Search Report for the Application No. PCT/JP2008/066956 mailed Dec. 16, 2008.

Notification of Reasons for Refusal for Application No. 2008-125238 from Japan Patent Office mailed Apr. 19, 2011.

* cited by examiner

PROXIMITY SENSOR

TECHNICAL FIELD

The present invention relates to a proximity sensor, and more particularly to a proximity sensor that includes an LC resonant circuit having a sensing coil and a capacitor, and is configured to generate a distance signal corresponding to a distance between an object and the sensing coil.

BACKGROUND ART

Japanese Patent Application Laid-Open No. 2005-295248, which was laid open to public inspection on Oct. 20, 2005, discloses a high frequency oscillation type proximity sensor, that is configured such that an object constituted by metal (conductor) or magnetic substance is sensed without contact. In concrete terms, this proximity sensor includes a parallel resonant circuit having a sensing coil and a capacitor. If this object approaches the parallel resonance circuit, an eddy circuit loss is generated in the object due to an electromagnetic induction function, which changes the impedance (effective resistance value) of the sensing coil, and also changes the oscillation conditions of the parallel resonant circuit. Because of these changes, the proximity sensor senses the presence of this object when the oscillation of the oscillation signal, that is supplied to the parallel resonant circuit, stops or when the amplitude of the oscillation signal is attenuated by a specified value or more.

This proximity sensor, however, only generates a binary signal that shows whether the object exists in a sensing range corresponding to this specified value, and cannot provide a distance signal corresponding to the distance between the object and the sensing coil. Therefore this proximity sensor cannot show how close the object approached the sensing coil.

DISCLOSURE OF THE INVENTION

It is an object of the present invention to show a distance between an object and a sensing coil, while at the same time sensing the presence of an object.

A proximity sensor of the present invention comprises an oscillation circuit, an amplitude measurement circuit, a control circuit and a signal processing circuit according to a first aspect of the invention. The oscillation circuit has an LC resonant circuit and an oscillation control circuit. The LC resonant circuit includes a sensing coil and a capacitor. The oscillation control circuit is configured to supply an electric current to the LC resonant circuit to generate oscillating voltage, of which frequency is decided by circuit parameters of the LC resonant circuit, across the LC resonant circuit. The amplitude measurement circuit is configured to produce an amplitude signal corresponding to amplitude of said oscillating voltage. The control circuit is configured to set negative conductance of the oscillation control circuit to a critical value by which the LC resonant circuit can oscillate, based on the amplitude signal. The signal processing circuit is configured to produce a distance signal corresponding to the distance between an object, which changes impedance of the sensing coil by approaching the LC resonant circuit, and the sensing coil based on a parameter associated with said negative conductance. In the configuration, it is possible to show the distance between the object and the sensing coil while at the same time sensing existence of the object.

According to a second aspect of the invention, the oscillation control circuit comprises a current generation circuit, feedback circuit and variable resistor circuit. The current generation circuit has first and second output terminals, and is configured to generate an electric current, which corresponds to the oscillating voltage generated across the LC resonant circuit, between the first and second output terminals. The feedback circuit is connected with the first output terminal of the current generation circuit, and produces feedback current in response to the electric current generated with the current generation circuit to supply the feedback current to the LC resonant circuit. The variable resistor circuit comprises a variable resistor located between the second output terminal of the current generation circuit and ground, and is configured to adjust the magnitude of the electrical current generated with the current generation circuit. The control circuit is configured to set a resistance value of the variable resistor circuit through the variable resistor, so that the negative conductance of the oscillation control circuit is the critical value. The signal processing circuit is configured to produce the distance signal based on the resistance value of the variable resistor circuit. In this configuration, the oscillation condition of the LC resonant circuit is that an absolute value of the negative conductance of the oscillation control circuit is an absolute value of the conductance of the sensing coil or more. Therefore when the negative conductance of the oscillation control circuit is a critical value by which the LC resonant circuit can oscillate, it is regarded that the absolute value of the negative conductance is equal to the absolute value of the conductance of the sensing coil. The conductance of the sensing coil changes according to the change of the eddy current loss due to the distance between the object and the sensing coil (that is, changes according to this distance). The negative conductance of the oscillation control circuit that is equal to the conductance of the sensing coil is decided by the feedback current supplied to the LC resonant circuit, and the amplitude of the oscillating voltage that is generated across the LC resonant circuit. The feedback current that is supplied to the LC resonant circuit increases/decreases according to the electric current generated with the current generation circuit. Hence the resistance value of the variable register circuit for adjusting the magnitude of the electric current can be used as a value to show the distance between the sensing coil and the object. As a consequence, a distance signal (analog signal) to show the distance between the object and the sensing coil can be obtained based on the resistance value. Furthermore a sensing signal (digital signal) to show whether the object exists or not can be obtained by comparing the distance signal with a threshold.

According to a third aspect of the invention, the oscillation control circuit comprises a current generation circuit and a feedback circuit. The current generation circuit has first and second output terminals and is configured to generate an electric current corresponding to the oscillating voltage generated across the LC resonant circuit between the first and second output terminals. The feedback circuit is configured to generate a feedback current in response to the electric current generated with the current generation circuit to supply the feedback current to the LC resonant circuit. The feedback circuit includes a variable resistor circuit that comprises a variable resistor, and is configured to adjust the magnitude of the feedback current with respect to the magnitude of the electric current generated with the current generation circuit. The control circuit is configured to set a resistance value of the variable resistor circuit through the variable resistor so that the negative conductance of the oscillation control circuit is the critical value. The signal processing circuit is configured to produce the distance signal based on the resistance value of the variable resistor circuit. In this configuration, an oscillation condition of the LC resonant circuit is that an absolute value of the negative conductance of the oscillation control circuit is an absolute value of the conductance of the sensing coil or more. Therefore when the negative conductance of the oscillation control circuit is a critical value by which the LC resonant circuit can oscillate, this is regarded that the absolute value of the negative conductance is equal to the absolute value of the conductance of the sensing coil. The conductance of the sensing coil changes according to the change of the eddy current loss due to the distance between the object and the sensing coil (that is, changes according to this distance). The negative conductance of the oscillation control circuit, that is equal to the conductance of the sensing coil, is decided by the feedback current supplied to the LC resonant circuit and the amplitude of the oscillating voltage that is generated across the LC resonant circuit. The resistance value of the variable resistor circuit that adjusts the magnitude of the feedback circuit with respect to the magnitude of the electric current generated with the current generation circuit can be used as a value to show the distance between the sensing coil and the object. Hence a distance signal (analog signal) to show the distance between the object and the sensing coil can be obtained based on the resistance value. Furthermore a sensing signal (digital signal) to show whether the object exists or not can be obtained by comparing the distance signal with a threshold.

According to a fourth aspect of the invention, the oscillation control circuit comprises a current generation circuit and a feedback circuit. The current generation circuit comprises an amplifying circuit and a VI conversion circuit. The amplifying circuit is configured to amplifying the oscillating voltage generated across the LC resonant circuit. The VI conversion circuit is configured to generate an electric current corresponding to the oscillating voltage amplified by the amplifying circuit. The feedback circuit is configured to produce a feedback current in response to the electric current generated with the current generation circuit to supply the feedback current to the LC resonant circuit. The amplifying circuit comprises a variable resistor for adjusting a gain of the oscillating voltage. The control circuit is configured to set a resistance value of the variable resistor circuit through the variable resistor so that the negative conductance of the oscillation control circuit is a critical value. The signal processing circuit is configured to produce the distance signal based on the resistance value of the variable resistor circuit. In this configuration, an oscillation condition of the LC resonant circuit is that an absolute value of the negative conductance of the oscillation control circuit is an absolute value of the conductance of the sensing coil or more. Therefore when the negative conductance of the oscillation control circuit is a critical value by which the LC resonant circuit can oscillate, this is regarded that the absolute value of the conductance is equal to the absolute value of the conductance of the sensing coil. The conductance of the sensing coil changes according to the change of the eddy current loss due to the distance between the object and the sensing coil (that is, changes according to this distance). The negative conductance of the oscillation control circuit, that is equal to the conductance of the sensing coil, is decided by the feedback current supplied to the LC resonant circuit and the amplitude of the oscillating voltage that is generated across the LC resonant circuit. The feedback current supplied to the LC resonant circuit increases/decreases according to a gain of the amplifying circuit. Therefore the resistance value of the variable resistor circuit for adjusting the gain of the amplifying circuit can be used as a value to show the distance between the sensing coil and the object. Hence a distance signal (analog signal) to show the distance between the object and the sensing coil can be obtained based on the resistance value. By comparing the distance signal with a threshold, a sensing signal (digital signal), to show whether the object exists or not, can be obtained.

In an embodiment according to the second to fourth aspects, the variable resistor circuit is a series or parallel circuit of at least one fixed resistor and at least one variable resistor. In this configuration, the resistance value of the fixed resistor can be used as an offset of the resistance value of the variable resistor circuit. Therefore a resolution of the distance (positional accuracy) between an object and the sensing coil can be improved.

In an embodiment according to the second to fourth aspects, the variable resistor is a digital potentiometer capable of setting its own resistance value by a digital code. The control circuit is configured to supply the variable resistor and the signal processing circuit with a digital code that defines the resistance value of the variable resistor for setting the negative conductance of the oscillation control circuit to the critical value. The signal processing circuit is configured to produce the distance signal based on the digital code supplied from the control circuit. In this configuration, the signal processing circuit can obtain a resistance value of the variable resistor circuit only by acquiring a digital code from the control circuit. Therefore a resistance value of the variable resistor circuit can be obtained more easily than a configuration in which the variable resistor circuit sets a resistance value by the ON/OFF of the switch based on a control signal from the control circuit.

According to an embodiment, the amplitude measurement circuit comprises a former circuit and a latter circuit. The former circuit is configured to measure the amplitude of the oscillating voltage generated across the LC resonant circuit to produce an analog signal corresponding to the amplitude. The latter circuit is an A/D convertor configured to convert the analog signal into a digital signal to supply the digital signal to the control circuit. The control circuit is configured to produce the digital code from the digital signal. In this configuration, the processing speed (response and tracking to the change of the resistance value of the variable resistor circuit) can be improved, compared with a configuration in which a resistance value of the variable resistor circuit is changed with an analog circuit. Even if a moving speed of an object is fast, the negative conductance of the oscillation control current can be quickly set to a critical value by which the LC resonant circuit can oscillate.

According to an embodiment, the control circuit comprises a comparison circuit configured to compare the amplitude signal with a threshold. The control circuit is configured to decide whether or not to change the resistance value of the digital potentiometer based on a comparison result of the comparison circuit to increment or decrement the digital code one by one when changing the resistance value. In this configuration, the generation of an overshoot or an undershoot can be prevented when a resistance value of the variable resistor circuit is set to a value by which the negative conductance of the oscillation control circuit becomes a critical value. Since a digital code is incremented one by one, it is not necessary to directly compute a target value of the resistance value of the variable resistor circuit based on the amplitude of the oscillating voltage. Therefore an operational amplifier, that is inexpensive compared with an A/D converter and CPU, can be used for the comparison circuit, and cost can be decreased as a result.

According to an embodiment, the control circuit comprises a timing circuit configured to generate a signal having a frequency for defining an output timing of the digital code. The frequency for defining the output timing is lower than the frequency of the oscillating signal. In this configuration, oscillation of the LC resonant circuit, due to a change of a resistance value of the variable resistor circuit, can be prevented, and stable control is implemented.

According to an embodiment, the signal processing circuit comprises an output adjustment circuit configured to add at least one of an offset and a gain to the digital code supplied from the control circuit. In this configuration, a value of the distance signal can be a value within a desired range. Each offset and gain may be a variable. In this example, dispersion of a range of a value of the distance signal depending on each product can be prevented, even if the characteristics of the sensing coil, relative position of the sensing coil and an object, and the characteristics of such a circuit as the oscillation control circuit disperse depending on the product. Hence a value of the distance signal of the proximity sensor can be determined to be a value within a desired range.

According to a fifth aspect of the invention, the control circuit is configured to produce a digital code for setting the negative conductance of the oscillation control circuit to the critical value. The oscillation control circuit comprises a current control circuit configured to function as a D/A converter which generates an electric current corresponding to the digital code. The oscillation control circuit is configured to supply the LC resonant circuit with a feedback current proportionate to the electric current generated through the current control circuit. The signal processing circuit is configured to produce the distance signal based on the digital code produced through the control circuit. In this configuration, the oscillation condition of the LC resonant circuit is that an absolute value of the negative conductance of the oscillation control circuit is an absolute value of the conductance of the sensing coil or more. Therefore when the negative conductance of the oscillation control circuit is a critical value by which the LC resonant circuit can oscillate, it is regarded that the absolute value of the negative conductance is equal to the absolute value of the conductance of the sensing coil. The conductance of the sensing coil changes according to the change of the eddy current loss due to the distance between the object and the sensing coil (that is, changes according to this distance). The negative conductance of the oscillation control circuit that is equal to the conductance of the sensing coil is decided by the feedback current supplied to the LC resonant circuit and the amplitude of the oscillating voltage that is generated across the LC resonant circuit. The feedback current that is supplied to the LC resonant circuit is directly proportional to the electric current generated with the current control circuit, therefore the distance between the sensing coil and the object can be determined using the digital code that is set with the control circuit. Hence a distance signal (analog signal) to show the distance between the object and the sensing coil can be obtained. Furthermore, by comparing the distance signal with a threshold, a sensing signal (digital signal) to show whether the object exists or not can be obtained. Additionally using a digital code makes it easy to obtain a digital signal that is used for various communications and PWM. In other words, compatibility of digital signals improves. Since a digital signal circuit can be easily downsized using micro patterns, the cost to mount a control circuit and oscillation control circuit on an IC can be decreased, and the influence of dispersion of the IC with respect to sensor characteristics can be eliminated.

According to an embodiment, the current control circuit includes an input transistor and a plurality of output transistors constituting a current mirror circuit, as well as a plurality of switches. The input transistor and the plurality of output transistors are connected with a reference supply. In response to a reference current, each of the plurality of output transistors produces a mirror current that is proportionate to the reference current. The reference current is supplied to the input transistor, and corresponds to the oscillating voltage which is generated across the LC resonant circuit. The plurality of switches are controlled based on the digital code, and if at least one mirror current is obtained from the plurality of output transistors, the plurality of switches produce the feedback current from at least this one mirror current. In this configuration, the circuit can be downsized and cost can be decreased compared with a configuration to dispose the current mirror circuit and D/A converter separately.

According to an embodiment, each of the plurality of switches is connected between a corresponding output transistor and the input transistor, or between the corresponding output transistor and the reference supply. In this configuration, power consumption can be decreased since mirror current is interrupted when the feedback current is decreased (since the mirror current does not flow into an output transistor). According to an embodiment, each of the plurality of switches is configured to draw the reference current produced through a corresponding output transistor out of the feedback current. In this configuration, the mirror current flows into the output transistor regardless the state of the switch, hence fluctuation of the reference current of the input transistor, due to the fluctuation of the electric current at the start or stop of supply of the mirror current in the output transistor, can be suppressed, and stable operation can be performed. According to one embodiment, at least one of the output transistors is different in transistor size from the other output transistors. In this configuration, the types of electric current values can be increased compared with a configuration in which the transistor sizes of all the output transistors are the same (mirror currents of all the output transistors are the same) if a number of the output transistors is the same. Hence the electric currents can be precisely set, and the resolution of the distance (positional accuracy) between an object and the sensing coil can be improved.

According to an embodiment, the current mirror circuit includes a plurality of resistance circuits for limiting mirror currents. The plurality of resistance circuits are connected between the plurality of output transistors and the reference supply respectively. A resistance value of at least one of the resistance circuits is different from each resistance value of the other resistance circuits. In this configuration, the types of electric current values can be increased compared with a configuration in which the resistance values of the resistor circuits for limiting the mirror current of all the output transistors are the same (mirror currents of all the output transistors are the same) if a number of the output transistors is the same. Hence the electric currents can be precisely set and the resolution of the distance (positional accuracy) between an object and the sensing coil can be improved. According to an embodiment, the plurality of the switches are connected between the plurality of resistance circuits and the reference supply, respectively. In this configuration, power consumption can be decreased since the mirror current is interrupted when the current is decreased (since the mirror current does not flow into an output transistor).

According to an embodiment, the plurality of switches are related to a plurality of bits of digital code respectively. Each of the switches is controlled by means of its own related bit value. A ratio of a mirror current produced through each of the output transistors to the reference mirror current is given by $2^{(n-1)}$. The reference mirror current is a mirror current corresponding to a first bit value in the digital code, and n is an ordinal number of each bit in the digital code. In this configuration, electric current can be adjusted by a binary digital code, such as a straight binary code. Therefore a number of output transistors and a number of switches can be decreased, and resolution of the distance (positional accuracy) between an object and the sensing coil can be improved. The hardware configuration becomes simple, which allows downsizing and decreases cost.

According to an embodiment, the output transistors respectively corresponding to the switches include at least one output transistor for offset, which is connected with the reference supply, and constantly produces a mirror current proportionate in magnitude to the reference current. In this configuration, an offset can be set for the current, hence resolution of the distance (positional accuracy) between an object and the sensing coil can be improved, compared with a configuration in which an offset is not set.

According to an embodiment, the oscillation control circuit comprises a feedback circuit. The feedback circuit has an input transistor and an output transistor constituting a current mirror circuit. The input transistor and the output transistor are connected with the reference supply. The output transistor produces a mirror current, that is the feedback current, proportionate in magnitude to the reference current, in response to a reference current that is an electric current from the current control circuit. The current control circuit comprises a plurality of amplifying circuits and a plurality of switches. Each of the plurality of amplifying circuits is configured to produce an amplification current in response to the oscillating voltage generated across the LC resonant circuit. The plurality of switches are controlled based on the digital code and configured, if at least one amplification current is obtained from the plurality of amplifying circuits, to produce the reference current from at least this one amplification current. In this configuration, the circuits can be downsized and cost can be decreased compared with a configuration in which the amplifying circuit and the D/A converter are disposed separately.

According to an embodiment, the oscillation control circuit comprises a level shift circuit configured to perform a level shift of the oscillating voltage. Each of the amplifying circuits comprises an amplifying transistor. The amplifying transistor has a pair of controlled electrodes and a control electrode for controlling an energization amount between the controlled electrodes. The controlled electrodes are electrically connected to the input transistor and the side of reference potential respectively. The control electrode is electrically connected with the output of the level shift circuit. The plurality of switches respectively are connected between the reference potential and the amplifying transistors, or between the output of the level shift circuit and the control electrodes of the amplifying transistors. In this configuration, the amplification current is interrupted (the amplification current does not flow into the amplifying circuit) when the output current is reduced, hence power consumption can be decreased.

According to an embodiment, each of the switches is configured to draw an amplification current produced through a corresponding amplifying circuit out of the reference current. In this configuration, the amplification current flows into the amplifying circuit regardless the state of the switch, hence fluctuation of the reference current of the input transistor, due to the fluctuation of the electric current at the start or stop of supply of the amplification current in the amplifying circuit, can be suppressed, and stable operation can be performed.

According to an embodiment, the oscillation control circuit comprises a level shift circuit configured to perform a level shift of the oscillating voltage. Each of the amplifying circuits comprises an amplifying transistor and a resistor circuit for limiting amplification current. The amplifying transistor has a pair of controlled electrodes and a control electrode for controlling an energization amount between the controlled electrodes. The controlled electrodes are electrically connected to the input transistor and the side of reference potential respectively. The control electrode is electrically connected with the output of the level shift circuit, and the resistor circuit is connected between the amplifying transistor and the reference potential. At least one resistor circuit of the amplifying circuits is different in resistance value from the other resistance circuits. In this configuration, values of the output current that can be output can be increased compared with a configuration in which the resistance values of all the resistor circuits for limiting the amplification current are the same (amplification currents of all the amplifying circuits are the same) if a number of amplifying circuits is the same. Hence the output currents can be precisely set, and resolution of the distance (positional accuracy) between an object and the sensing coil can be improved.

According to an embodiment, the plurality of switches are related to a plurality of bits of the digital code respectively. Each of the switches is controlled by means of its own related bit value. A ratio of an amplification current produced through each of the amplifying transistors to the reference amplification current is given by $2^{(n-1)}$. The reference amplification current is an amplification current corresponding to a first bit value in the digital code, and n is an ordinal number of each bit in the digital code. In this configuration, the output current can be adjusted by a binary digital code, such as a straight binary code. Hence a number of amplifying circuits and a number of switches can be decreased, and the resolution of the distance (positional accuracy) between an object and the sensing coil can be improved. Furthermore the hardware configuration can be simplified, and downsizing and decreasing cost can be expected.

According to an embodiment, the amplifying circuits respectively corresponding to the plurality of switches include an amplifying circuit for offset configured to supply the input transistor with an amplification current in response to the oscillating voltage generated across the LC resonant circuit. In this configuration, offset can be set for the output current, hence the resolution of the distance (positional accuracy) between an object and the sensing coil can be improved compared with a configuration in which an offset is not set.

According to an embodiment, the amplitude measurement circuit comprises a former circuit and a latter circuit. The former circuit is configured to measure the amplitude of the oscillating voltage generated across the LC resonant circuit to produce an analog signal corresponding to the amplitude. The latter circuit is an A/D converter configured to convert the analog signal into a digital signal to supply the digital signal to the control circuit. In this configuration, the processing speed (response and tracking to change of resistance value of the variable resistor circuit) can be improved compared with a configuration to change a feedback current from the oscillation control circuit by an analog circuit. The negative conductance of the oscillation control circuit can be quickly set to a critical value by which the LC resonance circuit can oscillate, even if the moving speed of the object is fast.

According to an embodiment, the current control circuit is configured to monotonically increase the electric current generated with the current control circuit in response to the digital code. The control circuit has a comparison circuit and an arithmetic processing circuit. The comparison circuit is configured to determine whether or not the amplitude signal exceeds a threshold. The arithmetic processing circuit is configured to change the digital code if the amplitude signal exceeds the threshold, and also to keep the digital code if the amplitude signal does not exceed the threshold. The arithmetic processing circuit adds or subtracts "1" to or from the least significant bit of the digital code when changing the digital code. In this configuration, a digital code is changed by adding or subtracting "1" to or from the least significant bit of the digital code. Therefore the generation of an overshoot or an undershoot can be prevented when adjusting the output current. A target value of a digital code need not be directly computed from an amplitude of an oscillating voltage. Hence an inexpensive operational amplifier can be used for the comparison circuit, and cost can be decreased compared with such circuits as an A/D converter and CPU.

According to an embodiment, the current control circuit is configured to monotonically increase the electric current generated with the current control circuit in response to the digital code. The control circuit comprises a comparison circuit and an arithmetic processing circuit. The comparison circuit has an upper limit threshold and a lower limit threshold with respect to the amplitude signal. The comparison circuit is configured to determine that the amplitude signal exceeds the upper limit threshold, falls below the lower limit threshold, or exists between the thresholds. The arithmetic processing circuit is configured: to decrease the digital code if the amplitude signal exceeds the upper limit threshold; to increase the digital code if the amplitude signal falls below the lower limit threshold; or to keep the digital code if the amplitude signal exists between the thresholds. The arithmetic processing circuit is configured: to subtract "1" from the least significant bit of the digital code when decreasing the digital code; and to add "1" to the least significant bit of the digital code when increasing the digital code. In this configuration, the digital code is changed by adding or subtracting "1" to or from the least significant bit of the digital code. Therefore the generation of an overshoot or an undershoot when adjusting the output current can be prevented. It is unnecessary to directly compute the target value of the digital code from an amplitude of the oscillating voltage. Hence an inexpensive window comparator can be used for the comparison circuit, and cost can be decreased compared with such a complicated circuit as an A/D comparator and CPU.

According to an embodiment, the control circuit comprises a timing circuit configured to generate a signal for defining a timing by which the digital code is supplied to the current control circuit, based on a specified frequency. The specified frequency is lower than that of the oscillating signal. In this configuration, oscillation of the LC resonant circuit due to a change of the output current can be prevented, and stable control can be performed.

According to an embodiment, the signal processing circuit is configured to perform at least one of an offset processing for adding a specified addition value to the digital code and a gain processing for multiplying the digital code by a specified multiplication value. In this configuration, a value of the distance signal can be a value within a desired range. According to an embodiment, the addition value and the multiplication value are variable. In this configuration, dispersion of a distance signal value range depending on a product can be prevented even if the characteristics of the sensing coil, relative positions of the sensing coil and an object, and circuit characteristics of the oscillation control circuit disperse depending on a product. Hence a value of the distance signals of any proximity sensor can be defined to a value within a predetermined range.

According to a sixth aspect of the invention, the oscillation control circuit comprises a current generation circuit and a feedback circuit. The current generation circuit is configured to produce an electric current corresponding to the oscillation voltage generated across the LC resonant circuit. The feedback circuit is configured to supply the LC resonant circuit with a feedback current according to the magnitude of the electric current generated with the current generation circuit. The oscillation control circuit and the control circuit comprises a resistance circuit and a PWM control circuit respectively. The resistance circuit has a plurality of resistors, and a semiconductor switching device connected in series or parallel to any resistor of the plurality of registers, and the resistance circuit is configured to adjust the magnitude of the electric current produced with the current generation circuit by adjusting a resistance value of the resistance circuit through the semiconductor switching device. The PWM control circuit is configured: to set a duty ratio of a PWM signal so that the negative conductance of the oscillation control circuit is the critical value; and to supply the PWM signal to the semiconductor switching device to turn the semiconductor switching device ON and OFF by PWM control. The signal processing circuit is configured to produce the distance signal based on an electric signal relevant to the duty ratio. In this configuration, an oscillation condition of the LC resonant circuit is that an absolute value of the negative conductance of the oscillation control circuit is an absolute value of the conductance of the sensing coil or more. Therefore when the negative conductance of the oscillation control circuit is a critical value by which the LC resonant circuit can oscillate, this is regarded that the absolute value of the negative conductance is equal to the absolute value of the conductance of the sensing coil. The conductance of the sensing coil changes according to the change of the eddy current loss due to the distance between an object and the sensing coil (that is, changes according to this distance). The negative conductance of the oscillation control circuit that is equal to the conductance of the sensing coil is determined by the feedback current supplied to the LC resonant circuit and the oscillating voltage generated across the LC resonant circuit. The feedback current that is supplied to the LC resonant circuit increases/decreases according to the electric current generated across the current generation circuit. Hence a signal relevant to a duty ratio of the PWM signal that is supplied to a semiconductor switching device of the resistor circuit for adjusting the magnitude of the electric current, and a duty ratio of an electric signal that is used for setting the duty ratio, can be used for a value to show the distance between the sensing coil and the object. As a consequence, the distance signal (analog signal) to show the distance between the object and the sensing coil can be obtained. Furthermore a sensing signal (digital signal) to show whether the object exists or not can be obtained by comparing the distance signal with a threshold.

According to an embodiment, the PWM signal has a frequency at least three times higher than the oscillating signal. In this configuration, the oscillating waveform of the LC resonant circuit that is pulsed by the PWM signal can be suppressed, hence negative influence of the oscillation control circuit can be eliminated.

According to an embodiment, the PWM control circuit is configured to supply the PWM signal to the semiconductor switching device and the signal processing circuit. The signal processing circuit is configured to produce the distance signal by setting the PWM signal from the PWM control circuit for the distance signal. In this configuration, the signal processing circuit can be simply configured.

According to an embodiment, the PWM control circuit is configured to supply the PWM signal to the semiconductor switching device and the signal processing circuit. The signal processing circuit is configured to convert the PWM signal from the PWM control circuit into a signal having an electrical potential corresponding to a duty ratio of the PWM signal to produce the distance signal. In this configuration, the user need not perform processing to convert the PWM signal into a signal having an electrical potential corresponding to the duty ratio, hence operability improves.

According to an embodiment, the semiconductor switching device is used as a resistor of the resistance circuit. In this configuration, a number of components can be decreased, hence the circuit can be downsized, and manufacturing cost can be decreased.

According to an embodiment, the negative conductance set to the critical value corresponds to the maximum value of conductance of the sensing coil in a variability region of the distance between the object and the sensing coil when the duty ratio is 100%. The negative conductance set to the critical value also corresponds to the minimum value of the conductance of the sensing coil in a variability region of distance between the object and the sensing coil when the duty ratio is 0%. In this configuration, the range of the negative conductance of the oscillation control circuit, that changes depending on the duty ratio, is approximately the same as the range of the conductance of the sensing coil that changes depending on the distance between the sensing coil and an object. Therefore the variability range of the conductance of the sensing coil can be the sensing range, and precision can be increased. In particular, when the duty ratio is set using a digital code, positional resolution can be relatively improved.

According to an embodiment, the amplitude measurement circuit is configured to produce an analog signal corresponding to an amplitude of the oscillating voltage generated across the LC resonant circuit. The PWM control circuit comprises an A/D converter configured to convert the analog signal into a digital signal to generate a digital code, and is configured to set the duty ratio based on the digital code. In this configuration, the processing speed (response and tracking to the change of the duty ratio) can be improved compared with a configuration where a duty ratio is changed by an analog circuit. The negative conductance of the oscillation control circuit can be quickly set to a critical value by which the LC resonance circuit can oscillate, even if the moving speed of the object is fast.

According to an embodiment, the PWM control circuit comprises a comparison circuit, a digital code setting circuit and a duty ratio setting circuit. The comparison circuit is configured to determine whether or not the amplitude signal exceeds a threshold. The digital code setting circuit is configured to adjust the digital code by: adding "1" to the least significant bit of the digital code if the amplitude signal exceeds the threshold; and also subtracting "1" from the least significant bit of the digital code if the amplitude signal falls below a threshold. The duty ratio setting circuit is configured to monotonically increase the duty ratio in response to the digital code adjusted by the digital code setting circuit. In this configuration, a digital code is changed by adding or subtracting "1" to or from the least significant bit of the digital code. Therefore generation of an overshoot or undershoot can be prevented when adjusting the negative conductance of the oscillation control circuit. It is unnecessary to directly compute a target value of a digital code from an amplitude of an oscillating voltage. Hence an inexpensive operational amplifier can be used for the comparison circuit, and cost can be decreased, compared with such a complicated circuit as an A/D converter and CPU.

According to an embodiment, the PWM control circuit comprises a comparison circuit, a digital code setting circuit and a duty ratio setting circuit. The comparison circuit has an upper limit threshold and a lower limit threshold with respect to the amplitude signal. The comparison circuit is configured to determine that the amplitude signal exceeds the upper limit threshold, falls below the lower limit threshold, or exists between the thresholds. The digital code setting circuit is configured to adjust the digital code by: adding "1" to the least significant bit of the digital code if the amplitude signal exceeds the upper limit threshold; subtracting "1" from the least significant bit of the digital code if the amplitude signal falls below the lower limit threshold; or keeping the digital code if the amplitude signal exists between the thresholds. The duty ratio setting circuit is configured to monotonically increase the duty ratio in response to the digital code adjusted by the digital code setting circuit. In this configuration, the digital code is changed by adding or subtracting "1" to or from the least significant bit of the digital code. Therefore generation of an overshoot or an undershoot when adjusting the negative conductance of the oscillation control circuit can be prevented. It is unnecessary to directly compute the target value of the digital code from an amplitude of the oscillating voltage. Hence an inexpensive window comparator can be used for the comparison circuit, and cost can be decreased, compared with such complicated circuits as an A/D converter and CPU.

According to an embodiment, the PWM control circuit comprises an amplifying circuit, a triangular wave generating circuit and a comparison circuit. The amplifying circuit is configured to amplify the amplitude signal. The triangular wave generating circuit is configured to generate triangular wave pulses. The comparison circuit is configured to compare the amplitude signal with triangular wave pulses to thereby produce a PWM signal of which pulse width is adjusted in a period of time during which a level of the amplitude signal exceeds a level of the triangular wave pulses. In this configuration, the circuits can be simplified, and the PWM control circuit can be constituted by all analog circuits. Hence problems unique to digital circuits, such as chattering and hysteresis, are not generated, and stable operation can be implemented.

According to an embodiment, the signal processing circuit is configured to perform at least one of an offset processing for adding a specified addition value to the digital code and a gain processing for multiplying the digital code by a specified multiplication value. In this configuration, a value of the distance signal can be a value within a desired range. According to an embodiment, the addition value and the multiplication value are variable. In this configuration, even if characteristics of the sensing coil, relative positions of the sensing coil and an object, and characteristics of circuits including the oscillation control circuit disposer depending on a product, a change of the range of the distance signal value depending on a product due to this dispersion can be prevented. Hence the distance signal value can be confined to within a desired range for all the proximity sensors.

In an embodiment according to the second to sixth aspects, the proximity sensor comprises a temperature measurement circuit configured to measure an ambient temperature. The signal processing circuit comprises a temperature compensation circuit configured to perform temperature compensation of the digital code by multiplying the digital code by a correction coefficient corresponding to the ambient temperature.

In this configuration, deterioration of sensing accuracy, due to the temperature characteristics of the sensing coil, object and circuits, including the oscillation control circuit, can be prevented, and the sensing accuracy can be improved. According to an embodiment, the correction coefficient is variable. In this configuration, even if the characteristics of the sensing coil, relative positions of the sensing coil and an object, and temperature characteristics of circuits, including an oscillation control circuit, disperse depending on a product, a change of the distance signal value depending on a product, due to this dispersion, can be prevented. Hence an appropriate distance signal can be obtained for all the proximity sensors.

In an embodiment according to the first to sixth aspects, the oscillation control circuit, the amplitude measurement circuit, the control circuit and the signal processing circuit are mounted on a monolithic IC. In this configuration, downsizing and lower cost can be implemented, and noise resistance can be improved, compared with a configuration where the oscillation control circuit, amplitude measurement circuit, control circuit and signal processing circuit are mounted on different ICs respectively.

BRIEF DESCRIPTION OF THE DRAWINGS

Preferred embodiments of the invention will now be described in further details. Other features and advantages of the present invention will become better understood with regard to the following detailed description and accompanying drawings where.

BEST MODE FOR CARRYING OUT THE INVENTION (First Embodiment)

Figure 1:
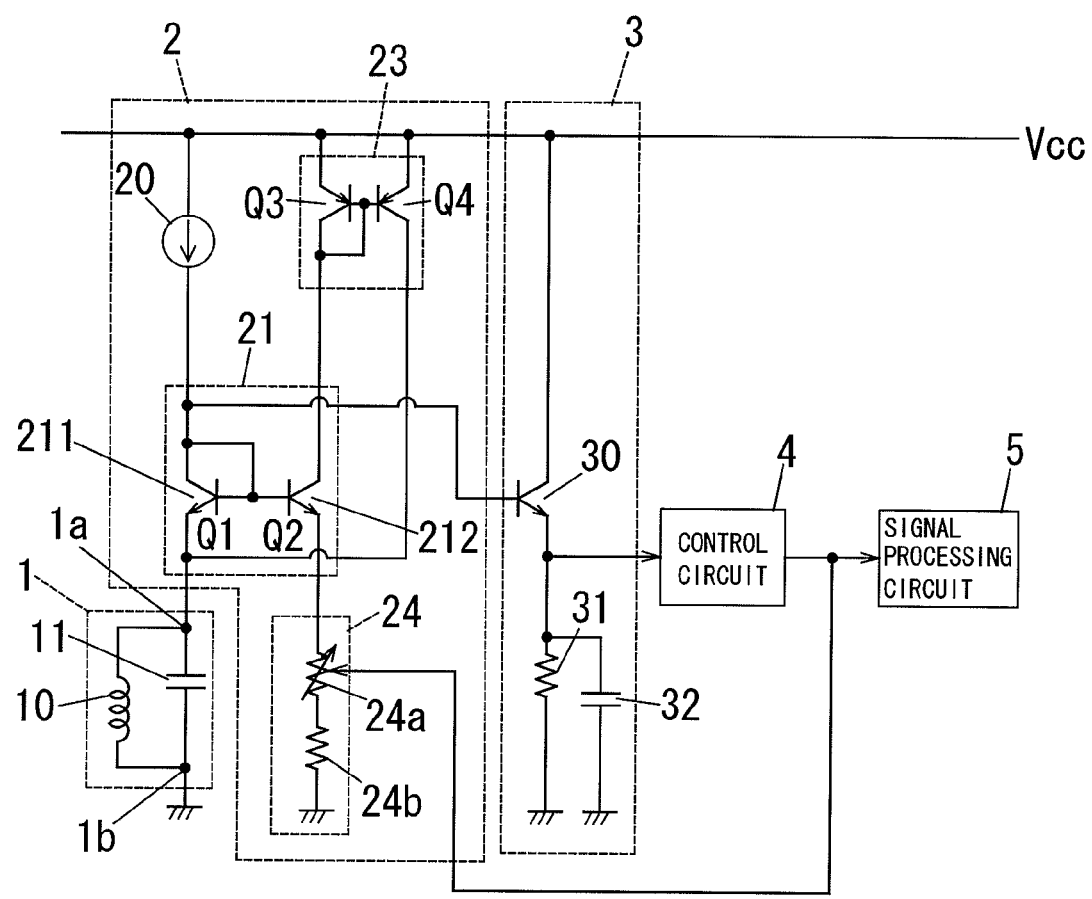
FIG. 1 is a schematic diagram of a proximity sensor according to a first embodiment of the present invention.

FIG. 1 shows a proximity sensor according to a first embodiment of the present invention. The proximity sensor includes an LC resonant circuit 1 and a monolithic IC, and is configured to sense the existence of a specified object (sensing object), as well as to show a distance between an object and the LC resonant circuit 1 (later mentioned sensing coil 10). The monolithic IC includes an oscillation control circuit 2, amplitude measurement circuit 3, control circuit 4 and signal processing circuit 5, which are mounted on this IC. The LC resonant circuit 1 and the oscillation control circuit 2 constitute an oscillation circuit. The object has a characteristic to change the impedance of the sensing coil 10 by approaching the LC resonant circuit 1. The object is a pipe-shaped conductor (metal), for example, and is disposed immediately outside the cylindrical sensing coil 10 so as to pass along the axis direction of the coil. The object can also be a magnetic body.

The LC resonant circuit 1 includes a first and second terminals 1a and 1b, a sensing coil 10 and a capacitor 11, which are connected in parallel between the first and second terminals. The second terminal 1b is connected with a ground. The LC resonant circuit 1 also has a cylindrical coil bobbin (not illustrated), and the sensing coil 10 (e.g. insulating coated wire) is wound around the outer surface of the bobbin. Electric current is supplied from the oscillation control circuit 2 to the LC resonant circuit 1 as positive feedback, whereby the oscillating voltage is generated across the LC resonant circuit 1. The frequency of the oscillating voltage is determined by circuit parameters of the LC resonant circuit 1, that is, the inductance of the sensing coil 10 and the electrostatic capacity of the capacitor 11.

The oscillation control circuit 2 is configured to supply electric current to the LC resonant circuit 1 as positive feedback, and to generate an oscillating voltage across the LC resonant circuit 1. In the case of the example in FIG. 1, the oscillation control circuit 2 is comprised of a bias circuit 20, level shift circuit 211, emitter follower circuit 212, feedback circuit 23 and variable resistor circuit 24.

The bias circuit 20 is a constant current source, and is configured to be connected with an internal power supply (Vcc) and to supply a predetermined bias current to the LC resonant circuit 1 via a level shift circuit 211.

The level shift circuit 211 and the emitter follower circuit 212 constitute a current generation circuit 21. The current generation circuit 21 is configured to generate an electric current corresponding to the oscillating voltage generated across the LC resonant circuit 1.

The level shift circuit 211 is configured to shift the oscillating voltage generated in the LC resonant circuit 1 to a voltage higher by a specified voltage. For example, the level shift circuit 211 includes an NPN transistor (Q1), and the collector and emitter thereof are connected to the output of the bias circuit 20 and the first terminal 1a of the LC resonant circuit 1 respectively. The base and collector of the transistor (Q1) are interconnected. Therefore the output of the bias circuit 20 is connected with the first terminal 1a of the LC resonant circuit 1 via the P-N region (diode element) of the transistor (Q1), and the oscillating voltage generated across the LC resonant circuit 1 is shifted to the total voltage of the oscillating voltage and the base-emitter voltage of the transistor (Q1) in the collector and base of the transistor (Q1).

The emitter-follower circuit 212 is configured to electrically supply the electric current corresponding to the total voltage (level shift voltage) to the feedback circuit 23 via the variable resistor circuit 24. In concrete terms, the emitter-follower circuit 212 includes an NPN transistor (Q2), of which the base is connected to the base of the transistor (Q1). The collector (first output terminal) of the transistor (Q2) is connected with an internal power supply (Vcc) via the feedback circuit 23, and the emitter (second output terminal) of the transistor (Q2) is connected with the ground via the variable resistor circuit 24. Therefore the emitter-follower circuit 212 electrically supplies an electric current corresponding to the amplified oscillating voltage to the feedback circuit 23 via the variable resistor circuit 24. Since the level shift voltage is applied to the base of the transistor (Q2), a voltage equal to the oscillating voltage generated across the LC resonant circuit 1 is applied between the emitter of the transistor (Q2) and the ground during each positive period (half cycle) of the oscillating voltage. This is because the base-emitter voltage of the transistor (Q2) that is equal to the base-emitter voltage of the transistor (Q1) is subtracted from the level shift voltage.

The feedback circuit 23 is configured to generate the feedback current in response to the current generated with the current generation circuit 21, and supply the feedback current to the first terminal 1a of the LC resonant circuit 1 as positive feedback. For example, the feedback circuit 23 includes PNP transistors (Q3) and (Q4) constituting a current mirror circuit. The emitter and collector of the transistor (Q3) are connected with the internal power supply (Vcc) and the collector of the transistor (Q2) respectively. The base and collector of the transistor (Q3) are interconnected. The emitter and collector of the transistor (Q4) are connected with the internal power supply (Vcc) and the first terminal 1a of the LC resonant circuit 1. The base of the transistor (Q4) is connected with the base of the transistor (Q3).

The variable resistor circuit 24 is configured to adjust the magnitude of the electric current generated with the current generation circuit 21. For example, the variable resistor circuit 24 includes a variable resistor 24a and a resistor (fixed resistor) 24b. The variable resistor 24a includes a first and second terminals, and a plurality of series circuits that are connected between the first and second terminals in parallel. The first terminal of the variable resistor 24a is connected with the emitter of the transistor (Q2), and the second terminal of the variable resistor 24a is connected with the ground via the resistor 24b. Each of the plurality of series circuits includes a resistor (fixed resistor) and a semiconductor switching device (e.g. transistor). Hence the resistance value of the variable resistor 24a, that is, the resistance value of the variable resistor circuit 24, can be adjusted by turning each of the plurality of semiconductor switching devices ON/OFF, whereby the magnitude of the current generated with the current generation circuit 21 can be adjusted. In other words, the electric current, that is generated with the current generation circuit 21 and is supplied to the feedback circuit 23, is adjusted by the combined resistance value of the variable resistor 24a and the resistor 24b.

Since the magnitude of the electric current generated with the current generation circuit 21 is adjusted through the variable resistor circuit 24, the adjusted electric current flows through the P-N region of the transistor (Q3). Therefore the transistor (Q4) generates the feedback current in response to this electric current that flows through the P-N region, and supplies the feedback current to the first terminal 1a of the LC resonant circuit 1 as positive feedback. In this case, the transistor (Q4) generates the feedback current equal to the electric current that flows through the P-N region. Thereby the oscillation of the LC resonant circuit 1 is maintained.

The amplitude measurement circuit 3 is configured to generate an amplitude signal corresponding to the amplitude of the oscillating voltage generated across the LC resonant circuit 1. For example, the amplitude measurement circuit 3 is a detection circuit, which includes an NPN transistor 30, resistor 31 and capacitor 32. The base and collector of the transistor 30 are connected with the collector of the transistor (Q1) and the internal power supply (Vcc) respectively. The resistor 31 is connected with the capacitor 32 in parallel, and the parallel circuit of the resistor 31 and the capacitor 32 is between the emitter of the transistor 30 and the ground. As a result, the collector-emitter current flows through the parallel circuit of the resistor 31 and the capacitor 32 in response to the oscillating voltage shifted through the level shift circuit 211 (that is, the level shift voltage), and the capacitor 32 is charged by the collector-emitter current. Thereby the capacitor 32 generates an amplitude signal (voltage of the capacitor 32)

corresponding to the amplitude of the oscillating voltage generated across the LC resonant circuit 1.

The control circuit 4 is configured to set a critical value by which the LC resonant circuit 1 can oscillate the negative conductance of the oscillation control circuit 2 based on this amplitude signal. For example, the control circuit 4 includes a CPU, and the operation thereof is implemented by a program or logic circuit.

According to the first embodiment, the control circuit 4 is configured to set a resistance value of the variable resistor circuit 24 through the variable resistor 24a so that the negative conductance of the oscillation control circuit 2 becomes a critical value. The negative conductance ($G_{OSC}$) is given by $$|G_{OSC}|=I_{fb}/V_T \quad \text{[Expression 1]}$$

where $G_{OSC}$ is a negative value, $I_{fb}$, denotes a feedback current, and $V_T$ denotes an amplitude of the oscillating voltage. The negative conductance ($G_{OSC}$) can be adjusted by setting the feedback current ($I_{fb}$) based on the amplitude ($V_T$).

the electric current ($I_O$) generated with the current generation circuit 21 is given by $$I_O=I_{fb}=V_T/R_e \quad \text{[Expression 2]}$$

where $R_e$ denotes a resistance value of the variable resistor circuit 24.

Since a voltage equal to the oscillating voltage generated across the LC resonant circuit 1 is applied between the emitter and ground of the transistor (Q2) during each positive period of the oscillating voltage, the negative conductance ($G_{OSC}$) is given by $$|G_{OSC}|=1/(2R_e) \quad \text{[Expression 3]}$$

based on Expressions 1 and 2, and the positive period and negative period. Therefore the negative conductance ($G_{OSC}$) can be adjusted using the resistor value ($R_e$) of the variable resistor circuit 24.

The oscillation conditions of the LC resonant circuit 1 is given by $$G_{coil} \leq |G_{OSC}|$$

where $G_{coil}$ denotes a conductance of the sensing coil 10. If the absolute value of the negative conductance ($G_{OSC}$) is equal to the conductance ($G_{coil}$), then the negative conductance ($G_{OSC}$) is the maximum value by which the LC resonant circuit 1 can oscillate. In other words, the negative value ($-G_{coil}$) of the conductance of the sensing coil 10 has a critical value of the negative conductance ($G_{OSC}$) of the oscillation control circuit 2.

Hence if the negative conductance ($G_{OSC}$) has this critical value, the conductance ($G_{coil}$) is given by $$G_{coil}=1/(2R_e) \quad \text{[Expression 4]}$$

The conductance ($G_{coil}$) of the sensing coil 10 changes in response to the change of eddy current loss due to the distance between an object and the sensing coil 10 (that is, in response to the distance between the object and the sensing coil 10). Therefore if the negative conductance ($G_{OSC}$) has the critical value, the conductance ($G_{coil}$) of the sensing coil 10 is in inverse proportion to the resistance value ($R_e$) of the variable resistance circuit 24. Hence the resistance value ($R_e$) can be used as a value to show the distance between the object and the sensing coil 10.

The control circuit 4 judges whether or not the negative conductance ($G_{OSC}$) is the critical value based on the amplitude ($V_T$) from the amplitude measurement circuit 3, and adjusts the negative conductance ($G_{OSC}$) of the oscillation control circuit 2 in response to the judgment result. For example, the control circuit 4 supplies the control signal for turning each semiconductor switching device of the variable register 24a ON or OFF, to the variable resistor 24a so that the amplitude ($V_T$) from the amplitude measurement circuit 3 becomes a predetermined value. This predetermined value is a value of the amplitude ($V_T$) when the absolute value of the negative conductance ($G_{OSC}$) and the absolute value of the conductance ($G_{coil}$) are the same. As a result, the resistance value ($R_e$) of the variable resistor circuit 24 is adjusted so that the negative conductance ($G_{OSC}$) becomes the above mentioned critical value. Here it is preferable to match the absolute value of the negative conductance ($G_{OSC}$) with the absolute value of the conductance ($G_{coil}$). Or the absolute value of the negative conductance ($G_{OSC}$) may be set to a value within a range substantially the same as the absolute value of the conductance ($G_{coil}$) (e.g. a value slightly smaller than the critical value). Therefore the control circuit 4 sets the resistance value ($R_e$) of the variable resistor circuit 24 so that the amplitude ($V_T$) from the amplitude measurement circuit 3 becomes a value within a predetermined range. The value within the predetermined range is a value of the amplitude ($V_T$) in a range where the absolute value of the negative conductance ($G_{OSC}$) is substantially the same as the absolute value of the conductance ($G_{coil}$).

The signal processing circuit 5 is configured to generate a distance signal corresponding to the distance between an object and the sensing coil 10 based on the resistance value of the variable resistor circuit 24. For example, the signal processing circuit 5 includes a variable resistor circuit (not illustrated) that is configured in the same way as the variable resistor circuit 24. Hence the resistance value of the variable resistor circuit in the signal processing circuit 5 changes in the same manner as the resistance value of the variable resister circuit 24 according to the control signal to each semiconductor switching device of the variable resistor 24a. In other words, the resistor value of the variable resistance circuit in the signal processing circuit 5 is the same as the resistance value of the variable resistor circuit 24. The signal processing circuit 5 measures the resistance value of its own variable resistor circuit, generates an analog signal (distance signal) based on the measured resistance value (that is, resistance value of the variable resistor circuit 24), and supplies this analog signal to an external device. The distance signal is a signal of which value increases proportionately to the distance between an object and the sensing coil 10.

Here the operation of the first embodiment is described. The oscillation control circuit 2 supplies electric current to the LC resonant circuit 1 as positive feedback, whereby the LC resonant circuit 1 generates an oscillating voltage. The frequency of the oscillating voltage is determined by the inductance of the sensing coil 10 and the electrostatic capacity of the capacitor 11. The oscillating voltage is maintained by the positive feedback current from the transistor (Q4) of the feedback circuit 23. The amplitude ($V_T$) of the oscillating voltage is detected through the amplitude measurement circuit 3. The control circuit 4 supplies a control signal to the variable resistor circuit 24 and each semiconductor switching device in the variable resistor circuit of the signal processing circuit 5, and sets the resistance value ($R_e$) so that the negative conductance ($G_{OSC}$) of the oscillation control circuit 2 becomes the above mentioned critical value based on the amplitude ($V_T$). The signal processing circuit 5 generates the distance signal based on the resistance value of its own variable resistor circuit.

If the object approaches the sensing coil 10 and the eddy current loss in the sensing coil 10 increases in this state, the absolute value of the conductance ($G_{coil}$) of the sensing coil 10 becomes greater than the absolute value of the negative conductance ($G_{OSC}$). Because of this, the above mentioned oscillation condition is no longer satisfied, and the LC resonant circuit 1 stops oscillation and the amplitude ($V_T$) decreases. If the amplitude ($V_T$) detected by the amplitude measurement circuit 3 is no longer within the above mentioned predetermined range, the control circuit 4 sets the resistance value ($R_e$) of the variable resistor circuit 24 so that the amplitude ($V_T$) becomes a value within the predetermined range. In other words, the control circuit 4 adjusts the negative conductance ($G_{OSC}$) and decreases the resistance value ($R_e$) to increase the absolute value of the negative conductance ($G_{OSC}$). Th signal processing circuit 5 generates a distance signal based on the resistance value ($R_e$) that was set by the control circuit 4.

If the object moves away from the sensing coil 10 and the eddy current loss in the sensing coil 10 decreases, on the other hand, the absolute value of the conductance ($G_{coil}$) of the sensing coil 10 becomes smaller than the absolute value of the negative conductance ($G_{OSC}$), and the amplitude ($V_T$) of the LC resonant circuit 1 increases. If the amplitude ($V_T$) detected by the amplitude measurement circuit 3 is no longer within the above mentioned predetermined range, the control circuit 4 sets the resistance value ($R_e$) of the variable resistor circuit 24 so that the amplitude ($V_T$) becomes a value within the predetermined range. In other words, the control circuit 4 adjusts the negative conductance ($G_{OSC}$) and increases the resistance value ($R_e$) so as to decrease the absolute value of the negative conductance ($G_{OSC}$). The signal processing circuit 5 generates a distance signal based on the resistance value ($R_e$) that was set by the control circuit 4.

Since the distance signal based on the resistance value ($R_e$) is generated by the signal processing circuit 5 like this, the distance between an object and the sensing coil 10, that is a positional relationship thereof, can be detected by the distance signal.

An oscillation condition of the LC resonant circuit 1 is that the absolute value of the negative conductance ($G_{OSC}$) of the oscillation control circuit 2 is the absolute value of the conductance ($G_{coil}$) of the sensing coil 10 or more. Therefore if the negative conductance ($G_{OSC}$) of the oscillation control circuit 2 is the critical value by which the LC resonant circuit 1 can oscillate, this can be regarded that the absolute value of the negative conductance ($G_{OSC}$) is equal to the absolute value of the conductance ($G_{coil}$) of the sensing coil 10. In this case, the conductance ($G_{coil}$) of the sensing coil 10 changes according to the change of the eddy current loss due to the distance between the object and the sensing coil 10 (that is, changes according to the distance of the sensing coil 10 and the object). The negative conductance ($G_{OSC}$) of the oscillation control circuit 2, that is equal to the conductance ($G_{coil}$) of the sensing coil 10, is determined by the feedback current ($I_{fb}$) supplied to the LC resonant circuit 1 and the amplitude ($V_T$) of the LC resonant circuit 1. The feedback current ($I_{fb}$) supplied to the LC resonant circuit 1 increases or decreases in response to the output current of the emitter-follower circuit 212. Therefore the resistance value ($R_e$) of the variable resistor circuit 24 for adjusting the magnitude of the output current of the emitter-follower circuit 212 can be used as a value to show the distance between the sensing coil 10 and the object. By using the resistance value ($R_e$) of the variable resistor circuit 24, existence of an object can be detected, also an analog distance signal to show the distance between the object and the sensing coil 10 can be obtained.

In other words, a digital sensing signal, to show whether or not an object exists, can be obtained by comparing the distance signal and a threshold, so the distance between the sensing coil 10 and the object can be detected in addition to detection of the existence of an object. For example, the signal processing circuit 5 may decide that an object exists in the sensing range of the sensing coil 10 if a value of the distance signal is a predetermined threshold or more. If not, the signal processing circuit 5 may decide that an object exists outside the sensing range of the sensing coil 10. The signal processing circuit 5 may output a signal to show the presence or absence of an object.

The signal processing circuit 5 acquires the resistance value ($R_e$) of the variable resistor circuit 24 from the control circuit 4 and generates the distance signal using the resistance value ($R_e$), which is different from the technology of using the feedback current ($I_{fb}$) to acquire the magnitude of the negative conductance ($G_{OSC}$), for example. Furthermore a detection circuit, to detect the magnitude of the feedback current ($I_{fb}$), is not required, hence the circuit configuration can be simplified and downsizing and decrease of manufacturing cost are expected.

Since the variable resistor circuit 24 includes the series circuit of the fixed resistor 24b and the variable resistor 24a, the resistance value of the fixed resistor 24b can be used as an offset of the resistance value of the variable resistor 24a, and the resolution of the distance (positional accuracy) of an object and the sensing coil 10 can be improved compared with a case of having only the variable resistor 24a.

According to an example, the variable resistor circuit 24 may include a series circuit constituted by one or a plurality of fixed resistor(s) 24b and one or a plurality of variable resistor (s) 24a. The variable resistor circuit 24 may include a plurality of fixed resistors 24b and a plurality of variable resistors 24a, which are connected in parallel respectively. In other words, if the variable resistor circuit 24 includes a series or a parallel circuit constituted by one or a plurality of fixed resistor (s) 24b and one or a plurality of variable resistor (s) 24a, the resistance value of the fixed resistor 24b can be used as an offset of the resistance value of the variable resistor circuit 24a. Therefore the resolution of the distance between an object and the sensing coil 10 can be improved compared with only the variable resistor 24a is used. The variable resistor circuit 24 may have only the variable resistor 24a, but it is preferable to have at least one variable resistor 24a and at least one fixed resistor 24b in order to improve resolution Since the oscillation control circuit 2, amplitude measurement circuit 3, control circuit 4 and signal processing circuit 5 are mounted on a monolithic IC, downsizing and a decrease of cost are expected, and the noise resistant performance can be improved.

In the variable resistor circuit 24 including the series circuit of the variable resistor 24a and the fixed resistor 24b, only the variable resistor 24a may be mounted on the monolithic IC. In this example, the variable range of the resistance value ($R_e$) of the variable resistor circuit 24 can be adjusted by replacing the fixed resistor 24b, and the design of the proximity sensor can be easily changed.

According to an example, the value to show the amplitude of the oscillating voltage is not limited to the peak value of the oscillation voltage shown in FIG. 1, but may also be an integral value of the oscillating voltage, or an effective value of the oscillating voltage. In the case of a configuration to detect only the AC components and control the AC components to be constant, the influence of bias current and DC resistance components of the sensing coil 10 (influence of temperature characteristics) can be eliminated.

According to an example, the LC resonant circuit 1 is not limited to a configuration where oscillation is constantly performed and is stopped by the approach of an object, but may have a configuration where oscillation is constantly stopped, and oscillation begins by the approach of an object.

The conductance of the sensing coil 10 according to the first embodiment changes not only by the distance between the sensing coil 10 and an object, but also by the oscillating frequency of the LC resonant circuit 1. In other words, if the capacity of the capacitor 11 changes, the conductance of the sensing coil 10 changes. Therefore the proximity sensor of the first embodiment can be used as an electrostatic capacity sensor as well, and can use the resistance value ($R_e$) of the variable resistor circuit 24 as the output.

(Second Embodiment)

Figure 2:
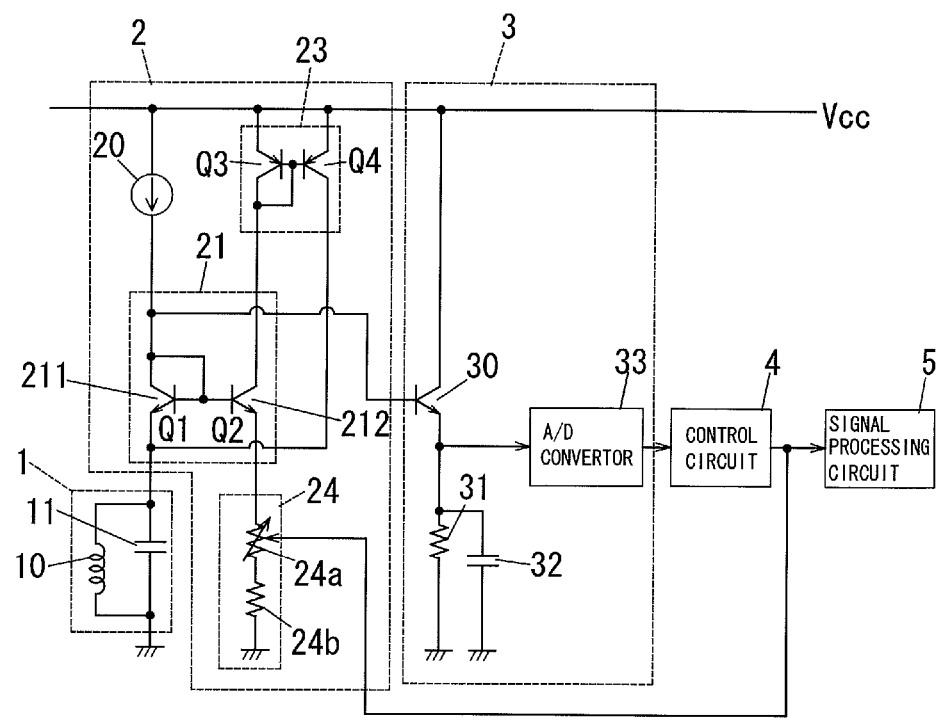
FIG. 2 is a schematic diagram of a proximity sensor according to a second embodiment of the present invention.

FIG. 2 shows a proximity sensor according to a second embodiment of the present invention. The proximity sensor according to the second embodiment is characterized by a variable resistor 24a of a variable resistor circuit 24, amplitude measurement circuit 3, control circuit 4 and signal processing circuit 5, and the other composing elements are configured in the same way as the first embodiment. Similar composing elements are denoted with a same reference symbols used for the first embodiment.

The variable resistor 24a according to the second embodiment is a digital potentiometer that can set a resistance value by a digital code (a bit string, such as "00000111"). This means that the resistance value ($R_e$) of the variable resistor circuit 24 according to the second embodiment is a resistance value of a series circuit of the digital potentiometer (variable resistor 24a) and the fixed resistor 24b, that is, a combined resistance value of the variable resistor 24a and the fixed resistor 24b. The digital potentiometer is well known to those skilled in the art, and is not described in detail here.

The amplitude measurement circuit 3 according to the second embodiment has an A/D converter 33, in addition to the NPN transistor 30, resistor 31 and capacitor 32. The A/D converter 33 is configured to convert an analog signal, to show the amplitude ($V_T$) from the capacitor 32, into a digital signal with a predetermined quantization width, and supply this digital signal to the control circuit 4. The A/D converter is well known to those skilled in the art, and is not described in detail here.

The control circuit 4 according to the second embodiment is configured to generate a digital code to set the resistance value ($R_e$) of the variable resistor circuit 24 so that the negative conductance ($G_{OSC}$) of the oscillation control circuit 2 becomes the above mentioned critical value, and supply this digital code to the variable resistor circuit 24 and signal processing circuit 5. The control circuit 4 generates the digital code from the digital signal to show the amplitude ($V_T$) from the A/D converter 33. For example, the control circuit 4 compares the digital signal from the A/D converter 33 and the digital signal of the amplitude ($V_T$) when the absolute value of the negative conductance ($G_{OSC}$) and the absolute value of the conductance ($G_{coil}$) are the same, and generates a digital code according to this difference.

The signal processing circuit 5 according to the second embodiment is configured to acquire a resistance value ($R_e$) of the variable resistor circuit 24 from the digital code generated by the control circuit 4, and generate a distance signal based on the resistance value.

According to the second embodiment, similar effect as the first embodiment can be implemented, and the signal processing circuit 5 can acquire the resistance value ($R_e$) of the variable resistor circuit 24 through the computing processing of the digital code from the control circuit 4. This computing processing can be easily implemented by programs. Hence the variable resistor circuit of the signal processing circuit 5, according to the first embodiment, is unnecessary, and the resistance value ($R_e$) of the variable resistor circuit 24 can be easily acquired.

Since the control circuit 4 includes the A/D converter 33, the resistance value ($R_e$) can immediately be set to a value with which the absolute value of the negative conductance ($G_{OSC}$) becomes the same as the absolute value of the conductance ($G_{coil}$), compared with a configuration that includes a comparison circuit for judging whether or not the amplitude ($V_T$) exceeds a predetermined value, so as to change the resistance value ($R_e$) according to the comparison result. Hence the processing speed (response and tracking to the change of the resistance value ($R_e$) of the variable resistor circuit 24) can be improved. For example, when the proximity sensor is started up, or even when the moving speed of an object is fast, the negative conductance of the oscillation control circuit 2 can be quickly set to a critical value by which the LC resonant circuit 1 can oscillate, and generation of delay can be suppressed.

(Third Embodiment)

Figure 3:
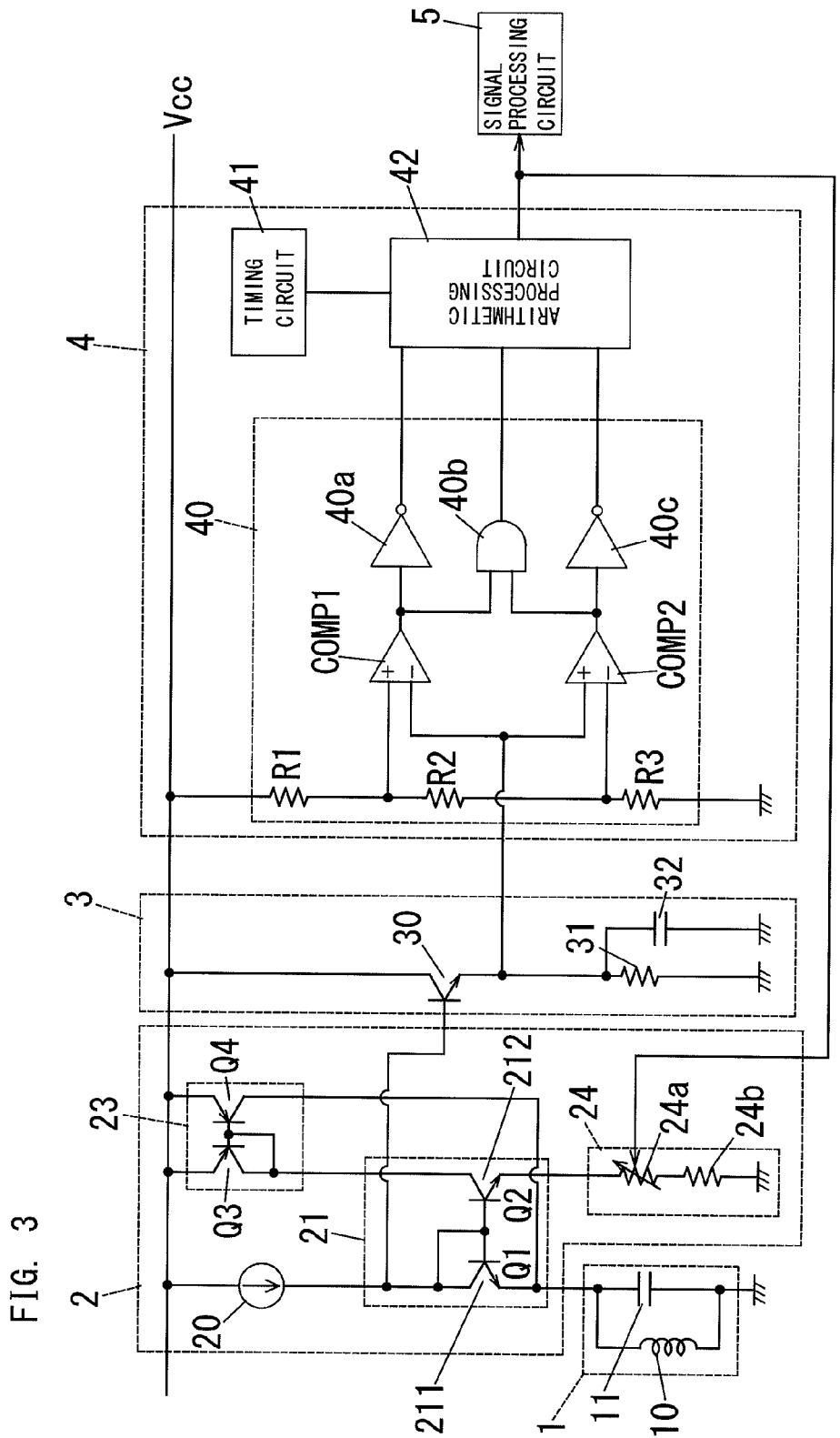
FIG. 3 is a schematic diagram of a proximity sensor according to a third embodiment of the present invention.

FIG. 3 shows a proximity sensor according to a third embodiment of the present invention. The proximity sensor according to the third embodiment is characterized by a variable resistor 24a of a variable resistor circuit 24, control circuit 4 and signal processing circuit 5, and the other composing elements are configured in the same way as the first embodiment. Similar composing elements are denoted with a same reference symbols used for the first embodiment.

The variable resistor 24a according to the third embodiment is a digital potentiometer that can set a resistance value by a digital code, just like the second embodiment. The resistance value ($R_e$) of the variable resistor circuit 24 according to the third embodiment is a resistance value of a series circuit of the variable resistor 24a and the fixed resistor 24b. The signal processing circuit 5 according to the second embodiment, is configured in the same way as the second embodiment, and is not described in detail here.

The control circuit 4 according to the third embodiment has a comparison circuit 40, timing circuit 41 and arithmetic processing circuit 42.

The comparison circuit 40 is configured to compare an amplitude ($V_T$), that is measured by the amplitude measurement circuit 3 at a predetermined cycle, and a predetermined threshold. For example, the comparison circuit 40 includes a voltage dividing circuit, first comparator (COMP1), second comparator (COMP2), first NOT gate 40a, AND gate 40b and second NOT gate 40c.

The voltage dividing circuit is a series circuit of resistors (R1) to (R3) which are connected between the internal power supply (Vcc) and ground, and is configured to provide predetermined thresholds (V1) and (V2) to the first comparator (COMP1) and second comparator (COMP2). The threshold (V1) is a potential of a connection point of the resistors (R1) and (R2), and determines the upper limit value of the amplitude ($V_T$). The threshold (V2) is a potential of a connection point of the resistors (R2) and (R3), and determines the lower limit value of the amplitude ($V_T$).

A non-reverse input terminal and reverse input terminal of the first comparator (COMP1) are connected to the connection point of the resistors (R1) and (R2) and the output terminal of the amplitude measurement circuit 3 respectively. The output terminal of the first comparator (COMP1) is connected with the first NOT gate 40a and the AND gate 40b. Therefore the first comparator (COMP1) outputs a high level signal if the amplitude ($V_T$) from the amplitude measurement circuit 3 falls below a threshold (V1), and outputs a low level signal if the amplitude ($V_T$) exceeds the threshold (V1).

A reverse input terminal and a non-reverse input terminal of the second comparator (COMP2) are connected to the connection point of the resistors (R2) and (R3) and the output terminal of the amplitude measurement circuit 3 respectively. The output terminal of the second comparator (COMP2) is connected with the second NOT gate 40c and the AND gate 40b. Therefore the second comparator (COMP2) outputs a high level signal if the amplitude ($V_T$) from the amplitude measurement circuit 3 exceeds the threshold (V2), and outputs a low level signal if the amplitude ($V_T$) falls below the threshold (V2).

Each output terminal of the first NOT gate 40a, AND gate 40b and second NOT gate 40c is individually connected with the arithmetic processing circuit 42.

In the comparison circuit 40, if the amplitude ($V_T$) exceeds the threshold (V1), the first NOT gate 40a outputs a high level signal, and the AND gate 40b and second NOT gate 40c output a low level signal. If the amplitude ($V_T$) falls below the threshold (V1) and exceeds the threshold (V2), the first NOT gate 40a and second NOT gate 40c output a low level signal, and the AND gate 40b outputs a high level signal. If the amplitude ($V_T$) falls below the threshold (V2), the first NOT gate 40a and the AND gate 40b output a low level signal, and the second NOT gate 40c outputs a high level signal.

The timing circuit 41 has an oscillation circuit that supplies a pulse signal having a predetermined frequency to the arithmetic processing circuit 42. The predetermined frequency is set to a frequency lower than the oscillating frequency of the LC resonant circuit 1.

The arithmetic processing circuit 42 is configured to generate a digital code based on the comparison result of the comparison circuit 40, and supply this digital code to the variable resistor circuit 24 and signal processing circuit 4. For example, if a high level signal is received from the first NOT gate 40a, the arithmetic processing circuit 42 increases the resistance value ($R_e$) of the variable resistor circuit 24. If a high level signal is received from the AND gate 40b, the arithmetic processing circuit 42 maintains the resistance value ($R_e$) of the variable resistor circuit 24 at the current resistance value. If a high level signal is received from the second NOT gate 40c, the arithmetic processing circuit 42 decreases the resistance value ($R_e$) of the variable resistor circuit 24. In other words, the control circuit 4 according to the third embodiment determines whether or not the resistance value of the digital potentiometer (variable resistor 24a), that is the resistance value ($R_e$) of the variable resistor circuit 24, is changed based on the comparison result by the comparison circuit 40.

To change the resistance value ($R_e$) of the variable resistor circuit 24, the arithmetic processing circuit 42 changes a digital code corresponding to the resistance value ($R_e$) of the variable resistor circuit 24 one by one. For example, if the current digital code is "00100110", and a high level signal is received from the first NOT gate 40a, then the arithmetic processing circuit 42 increments the current digital code by "1" to generate digital code "00100111", and outputs this digital code. If a high level signal is received from the second NOT gate 40c at this time, the arithmetic processing circuit 42 decrements the current digital code by "1" to generate digital code "00100101", and outputs this digital code.

The arithmetic processing circuit 42 is also configured to output the digital code when a pulse signal is received from the timing circuit 41. This prohibits the arithmetic processing circuit 42 to output a digital code based on a frequency lower than the frequency of the timing circuit 41.

According to the third embodiment, a similar effect as the first embodiment can be implemented. This control circuit 4 increments or decrements the digital code by "1", when the resistance value ($R_e$) of the variable resistor circuit 24 is set to a value by which the negative conductance ($G_{OSC}$) of the oscillation control circuit 2 becomes the above mentioned critical value. In other words, the resistance value ($R_e$) is changed with a minimum change width. Hence a resistance value ($R_e$) exceeding the target value can be prevented when increasing the resistance value ($R_e$), which prevents the generation of an overshoot. In the same manner, the resistance value ($R_e$) falling below the target value can be prevented when decreasing the resistance value ($R_e$), which prevents the generation of an undershoot. Furthermore, it is not necessary to compute the resistance value ($R_e$) of the variable resistor circuit 24 directly from the amplitude ($V_T$), since the digital code is incremented one by one. Therefore the control circuit 4 can be constructed using an inexpensive comparison circuit 40, and cost can be decreased, compared with a circuit including an A/D converter and CPU.

The control circuit 4 outputs the digital code based on the pulse signal from the timing circuit 41, so the frequency of the pulse signals being output from the timing circuit 41 is lower than the oscillating frequency of the LC resonant circuit 1. Since the digital code is not supplied to the variable resistor circuit 24, with a time interval shorter than the oscillating cycle of the LC resonant circuit 1, the oscillation of the LC resonant circuit 1, due to the change of the resistance value ($R_e$) of the variable resistor circuit 24, can be prevented, and stable control becomes possible.

(Fourth Embodiment)

Figure 4:
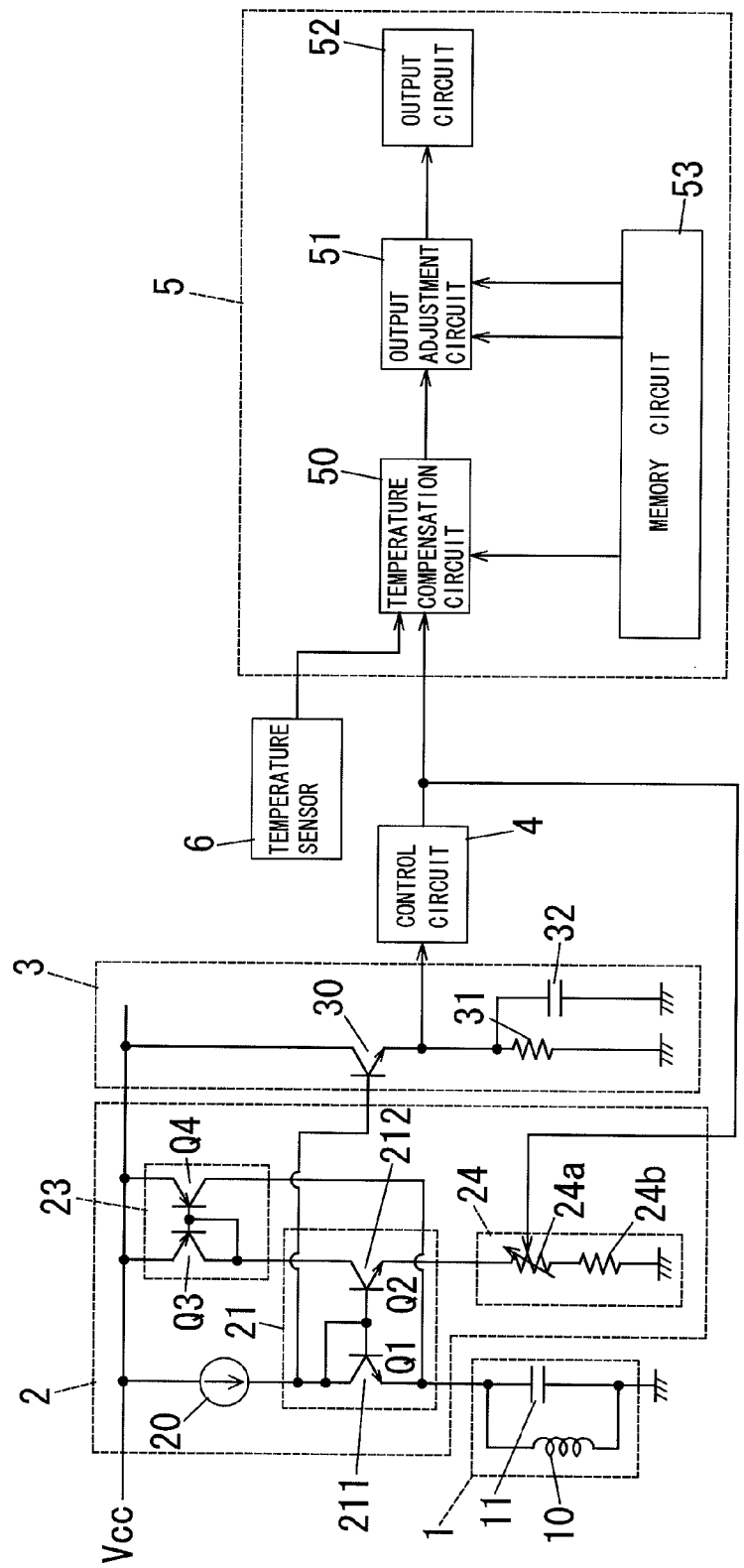
FIG. 4 is a schematic diagram of a proximity sensor according to a fourth embodiment of the present invention.

FIG. 4 shows a proximity sensor according to a fourth embodiment of the present invention. The proximity sensor according to the fourth embodiment is characterized by a temperature sensor 6 (temperature measurement circuit) and a signal processing circuit 5, and the other composing elements are configured in the same way as the third embodiment. Similar composing elements are denoted with a same reference symbol used for the third embodiment.

The temperature sensor 6 includes a thermal element, such as a thermistor. The temperature sensor 6 is disposed near the sensing coil 10 to sense the ambient temperature, such as the ambient temperature of the sensing coil 10, for example. The location of the temperature sensor 6 is not limited to this, but may be any appropriate location.

The signal processing circuit 5 according to the fourth embodiment has a temperature compensation circuit 50, output adjustment circuit 51, output circuit 52 and memory circuit 53. The temperature compensation circuit 50 is configured to perform temperature compensation by multiplying a value of a digital code from the control circuit 4 by a correction temperature coefficient (correction coefficient) corresponding to a temperature detected by the temperature sensor 6. The output adjustment circuit 51 is configured to adjust a value of the temperature-compensated digital code by adding at least one of an offset and a gain to the value of the digital code. The output circuit 52 is configured to compute a resistance value ($R_e$) of the variable resistor circuit 24 based on this adjusted temperature-compensated digital code, and generate a distance signal to show the distance between the sensing coil 10 and an object. The temperature compensation circuit 50 and the output adjustment circuit 51 are implemented by programs.

The memory circuit 53 includes an erasable non-volatile memory, such as an EEPROM, and stores a data table of correction temperature coefficients that are used for the temperature compensation circuit 50, and offsets and gains that are used for the output adjustment circuit 51. The data table of the correction temperature coefficients, offsets and gains can be changed.

When a digital code is input, the temperature compensation circuit 50 acquires a correction temperature coefficient corresponding to the detected temperature of the temperature sensor 6 from the data table of the correction temperature coefficients stored in the memory circuit 53, and outputs a new digital code, that is obtained by multiplying the value of the digital code by the acquired correction temperature coefficient. The correction temperature coefficients used for the temperature compensation circuit 50 are values that are set considering the temperature characteristics of the sensing coil 10, object and circuits, including the oscillation control circuit 2, and can be determined based on the result of the temperature measurement using reference, for example.

The output adjustment circuit 51 generates a new digital code by adding offset or gain, stored in the memory circuit 53, to the value of the digital code from the temperature compensation circuit 50. The offset value is a value that is added to or subtracted from the value of the digital code.

The value of the gain is a number excluding "0", and is a value by which the value of the digital code is multiplied or divided (specified value of multiplying factor). Therefore the value of the offset is set to a positive value to shift the value of the digital code to the positive side. The value of the offset is set to a negative value to shift the value of the digital code to the negative side. The value of the gain is set to a value greater than "1" to increase the difference between the values of the digital codes. The value of the gain is set to a value of "0" or greater and less than "1" to decrease the difference between the values of the digital codes.

For example, the value of the digital code is adjusted by the output adjustment circuit 51 in order to set a possible value of a distance signal that is generated by the output circuit 52, to a value within a desired range. In concrete terms, if a distance signal is greater than the magnitude that can be output by the output circuit 52, and is saturated depending on the operation state of the proximity sensor (e.g. type of material of an object), the distance between the sensing coil 10 and the object may not be obtained. Therefore the value of the digital code is adjusted through the output adjustment circuit 51, so that the magnitude of the distance signal is confined within a range of magnitudes that can be output by the output circuit 52, thereby the saturation (error) of the distance signal can be prevented.

The output circuit 52 receives a digital code from the output adjustment circuit 51, computes a resistance value ($R_e$) of the variable resistor circuit 24 based on this digital code, and generates a distance signal to show the distance between the sensing coil 10 and the object using the resistance value ($R_e$) obtained from the digital code. The distance signal is output to an external device, for example.

According to the fourth embodiment, a similar effect as the third embodiment can be obtained. A value of the digital code from the control circuit 4 is corrected according to the temperature sensed by the temperature sensor 6. Therefore deterioration of the sensing accuracy, due to the temperature characteristics of the sensing coil 10, object and circuits, including the oscillation control circuit 2, can be prevented, and sensing accuracy can be improved. Since an offset and gain can be freely added to the value of the digital code, a distance signal in a desired range can be obtained.

If the characteristics of the sensing coil 10, relative positions of the sensing coil 10 and the object, and the temperature characteristics of circuits including the oscillation control circuit 2 disperse depending on the product, the value of the distance signal disperses depending on the product. According to the fourth embodiment, the correction temperature coefficient in the temperature compensation circuit 50 can be changed (erasable), so dispersion of the distance signal depending on the product can be prevented.

In the same manner, the offset and the gain in the output adjustment circuit 51 can be changed (erasable), so the dispersion of the distance signal depending on the product can be prevented.

According to an example, the signal processing circuit 5 may have only one of the temperature compensation circuit 50 and the output adjustment circuit 51.

(Fifth Embodiment)

Figure 5:
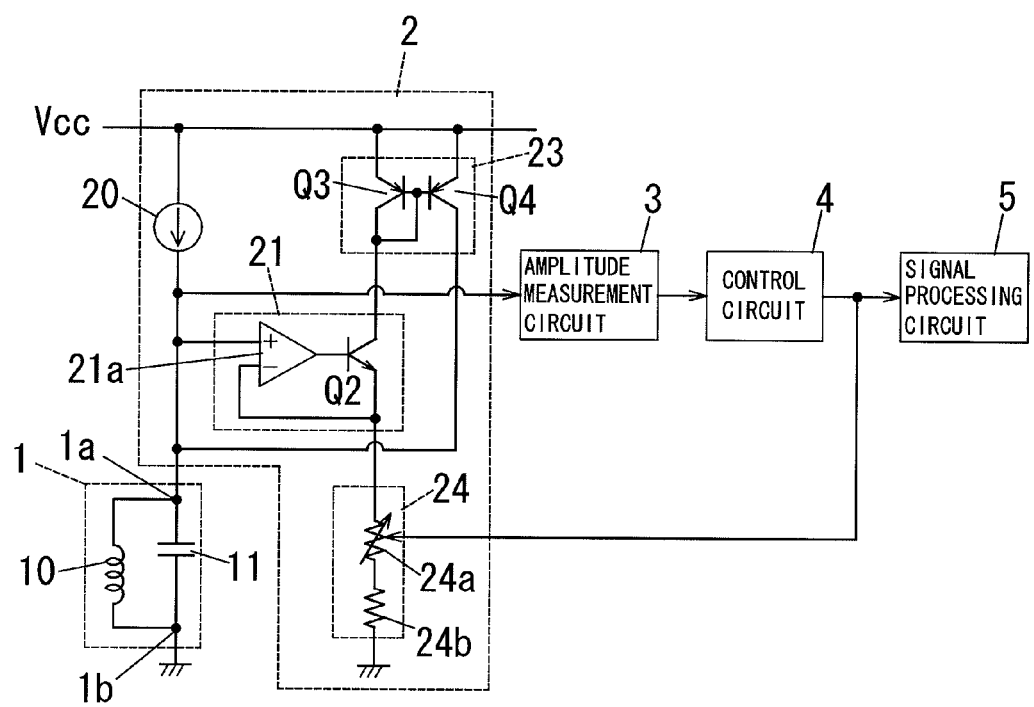
FIG. 5 is a schematic diagram of a proximity sensor according to a fifth embodiment of the present invention.

FIG. 5 shows a proximity sensor according to a fifth embodiment of the present invention. The proximity sensor according to the fifth embodiment is characterized by an oscillation control circuit 2, and the other composing elements are configured in the same way as the first embodiment. Similar composing elements are denoted with a same reference symbol used for the first embodiment.

A current generation circuit 21 of the oscillation control circuit 2 according to the fifth embodiment includes an operational amplifier 21a and an NPN transistor (Q2). In other words, the level shift circuit 211 is replaced with the operational amplifier 21a.

The output terminal of the operational amplifier 21a is connected with the base of the transistor (Q2), and the reverse input terminal and non-reverse input terminal of the operational amplifier 21a are connected to the emitter of the transistor (Q2) and the first terminal 1a of the LC resonant circuit 1 respectively.

Since a voltage equal to the base-emitter voltage of the transistor (Q2) is applied between the reverse input terminal and the output terminal of the operational amplifier 21a, the output voltage of the operational amplifier 21a becomes a total voltage of the oscillating voltage of the LC resonant circuit 1 and the base-emitter voltage of the transistor (Q2). Therefore the transistor (Q2) generates an electric current corresponding to the oscillating voltage, just like the first embodiment.

According to the fifth embodiment, similar effects as the first embodiment are implemented. The current generation circuit 21 of the fifth embodiment can also be applied to the second to fourth embodiments.

(Sixth Embodiment)

Figure 6:
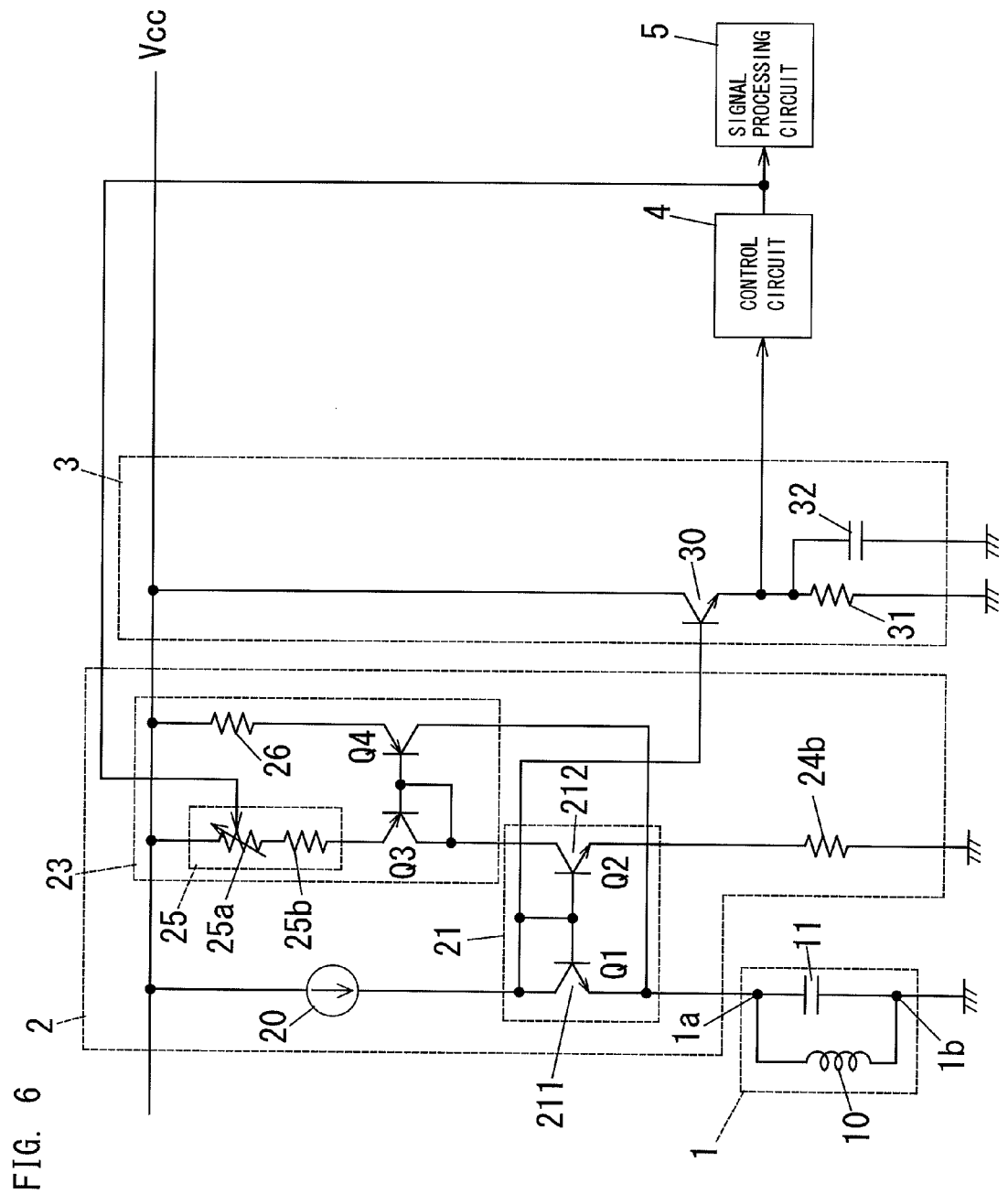
FIG. 6 is a schematic diagram of a proximity sensor according to a sixth embodiment of the present invention.

FIG. 6 shows a proximity sensor according to a sixth embodiment of the present invention. The proximity sensor according to the sixth embodiment is characterized by a feedback circuit 23 and a control circuit 4, compared with the first embodiment. The variable resistor circuit 24 is replaced with a resistor (fixed resistor) 24b for setting the emitter potential (for adjusting electric current) of the emitter-follower circuit 212. The other composing elements are configured in the same way as the first embodiment. Similar composing elements are denoted with a same reference symbol used for the first embodiment.

The feedback circuit 23 furthermore has a variable resistor circuit 25 and a resistor (fixed resistor circuit) 26. The variable resistor circuit 25 is configured to adjust the magnitude of the feedback current with respect to the magnitude of the electric current from the emitter-follower circuit 212. For example, the variable resistor circuit 25 is a series circuit of a variable resistor 25a and a resistor (fixed resistor) 25b. The variable resistor 25a includes first and second terminals and a plurality of series circuits that are connected in parallel between the first and second terminals. The first terminal of the variable resistor 25a is connected with the internal power supply (Vcc), and the second terminal of the variable resistor 25a is connected with the emitter of the transistor (Q3) via the resistor 25b. Each of the plurality of series circuits includes a resistor (fixed resistor) and a semiconductor switching device (e.g. transistor). Therefore the resistance value of the variable resistor 25a, that is, the resistance value of the variable resistor circuit 25, can be adjusted by turning each of the plurality of semiconductor switching elements ON/OFF. The resistor 26 is inserted between the internal power supply (Vcc) and the transistor (Q4). Hence the magnitude of the feedback current from the feedback circuit 23 to the first terminal 1a of the LC resonant circuit 1 is adjusted based on the ratio of a resistance value of the variable resistor circuit 25 and a resistance value of the resistor 26.

In the feedback circuit 23, when an electric current is supplied from the emitter-follower circuit 212, this electric current, that is, a collector current of the transistor (Q2), flows between the emitter and collector of the transistor (Q3). The magnitude of the electric current that flows between the emitter and collector of the transistor (Q4) is determined by the variable resistor circuit 25 and the resistor 26. In other words, the variable resistor circuit 25 and the resistor 26 determines the mirror ratio of the feedback circuit 23, and this mirror ratio is adjusted by the resistance value ($R_v$) of the variable resistor circuit 25.

The electric current that flows between the emitter and collector of the transistor (Q4) is the feedback current that is supplied to the LC resonant circuit 1, and the feedback current ($I_{fb}$) is given by $$I_{fb}=(R_v/R_s)I_c \qquad \text{[Expression 5]}$$

where $R_S$ denotes a resistance value of the resistor 26, and $I_c$ denotes an electric current that flows between the emitter and collector of the transistor (Q3).

The electric current ($I_c$), which is equal to the output current of the emitter-follower circuit 212 is given by $$I_c=V_T/R_e \qquad \text{[Expression 6]}$$

where $V_T$ is an amplitude of the oscillating voltage that is generated across the LC resonant circuit 1, and $R_e$ is a resistance value of the resistor 24b.

Hence the feedback current ($I_{fb}$) can be given by $$I_{fb}=(R_v/(R_e \cdot R_s)) \cdot V_T \qquad \text{[Expression 7]}$$

In this way, the feedback circuit 23 according to the sixth embodiment supplies the feedback current that is adjusted by the resistance value ($R_v$) of the variable resistor circuit 25, to the LC resonant circuit 1.

The control circuit 4 according to the sixth embodiment sets the negative conductance of the oscillation control circuit 2 to a critical value by which the LC resonant circuit 1 can oscillate, by adjusting the resistance value of the variable resistor circuit 25. The negative conductance ($G_{OSC}$) is given by the above mentioned Expression 1. Therefore the negative conductance ($G_{OSC}$) can be adjusted by setting the feedback circuit ($I_{fb}$) based on the amplitude ($V_T$).

Since a voltage equal to the oscillating voltage generated across the LC resonant circuit 1 is applied between the emitter of the transistor (Q2) and the ground during each positive period of this oscillating voltage, the negative conductance ($G_{OSC}$) is given based on Expressions 7 and 1, and the positive period and negative period.

$$|G_{OSC}|=R_v/(2R_e \cdot R_s) \qquad \text{[Expression 8]}$$

Therefore the value of the negative conductance ($G_{OSC}$) of the oscillation control circuit 2 can be adjusted by the resistance value ($R_v$) of the variable resistor circuit 25. If the negative conductance ($G_{OSC}$) is a critical value, the conductance ($G_{coil}$) is given by $$G_{coil}=R_v/(2R_e \cdot R_s) \qquad \text{[Expression 9]}$$

The conductance ($G_{coil}$) of the sensing coil 10 changes according to the change of the eddy current loss due to the distance between an object and the sensing coil 10 (that is, changes according to the distance between the object and the sensing coil 10). Therefore if the negative conductance ($G_{OSC}$) is the above mentioned critical value, the conductance ($G_{coil}$) of the sensing coil 10 is in inverse proportion to the resistance value ($R_v$) of the variable resistance circuit 25. Hence the resistor value of the variable resistor 25a to determine the resistance value ($R_v$) of the variable resistor circuit 25 can be used as a value to show the distance between the sensing coil 10 and the object.

For example, the control circuit 4 supplies a control signal for turning each semiconductor switching device of the variable resistor 25a ON/OFF to the variable resistor 25a so that the amplitude ($V_T$) from the amplitude measurement circuit 3 becomes a predetermined value. This predetermined value is a value of the amplitude ($V_T$) when the absolute value of the negative conductance ($G_{OSC}$) and the absolute value of the conductance ($G_{coil}$) are the same. As a result, the resistance value ($R_v$) of the variable resistor circuit 25 is adjusted so that the negative conductance ($G_{OSC}$) becomes the critical value. Just like the first embodiment, the control circuit 4 also sets the resistance value ($R_v$) of the variable resistor circuit 25 so that the amplitude ($V_T$) from the amplitude measurement circuit 3 becomes a value within a predetermined range.

Therefore the sixth embodiment operates in the same manner as the first embodiment. In other words, the variable resistor circuit 24 and resistance value ($R_e$) in the operation of the first embodiment can be regarded as the variable resistor circuit 25 and the resistance value ($R_v$) respectively.

If the object approaches the sensing coil 10 and the eddy current loss in the sensing coil 10 increases here, the absolute value of the conductance ($G_{coil}$) of the sensing coil 10 becomes greater than the absolute value of the negative conductance ($G_{OSC}$). Because of this, the oscillation conduction is no longer satisfied, and the LC resonant circuit 1 begins to stop oscillation, decreasing the amplitude ($V_T$). If the amplitude ($V_T$) detected by the amplitude measurement circuit 3 is no longer a value within the above mentioned predetermined range, then the control circuit 4 sets the resistance value ($R_v$) in the variable resistor circuit 25 so that the amplitude ($V_T$) becomes a value within the predetermined range. In other words, the control circuit 4 adjusts the negative conductance ($G_{OSC}$) and increases the resistance value ($R_v$) so as to increase the absolute value of the negative conductance ($G_{OSC}$). The signal processing circuit 5 generates the distance signal based on the resistance value ($R_v$) that is set by the control circuit 4.

If the object moves away from the sensing coil 10 and the eddy current loss in the sensing coil 10 decreases, on the other hand, the absolute value of the conductance ($G_{coil}$) of the sensing coil 10 becomes smaller than the absolute value of the negative conductance ($G_{osc}$), and the amplitude ($V_T$) of the LC resonant circuit 1 increases. If the amplitude ($V_T$) detected by the amplitude measurement circuit 3 no longer becomes a value within the above mentioned predetermined range, the control circuit 4 sets the resistance value ($R_v$) of the variable resistor circuit 25 so that the amplitude ($V_T$) becomes a value within the predetermined range. In other words, the control circuit 4 adjusts the negative conductance ($G_{osc}$) and decreases the resistance value ($R_v$) so as to decrease the absolute value of the negative conductance ($G_{osc}$). The signal processing circuit 5 generates the distance signal based on the resistance value ($R_v$) that is set by the control circuit 4.

According to the sixth embodiment, the resistance value ($R_v$) for adjusting the magnitude of the feedback current ($I_{fb}$) with respect to the magnitude of the output current of the emitter-follower circuit 212 can be used for a value to show the distance between the sensing coil 10 and the object. By using the resistance value ($R_v$) of the variable resistor circuit 25, not only can the existence or absence of an object be detected, but also an analog distance signal, to show the distance between the object and the sensing coil 10, can be obtained. Hence an effect similar to the first embodiment is implemented, and various changes similar to the first embodiment can be performed. In other words, the variable resistor circuit 24, variable resistor 24a, resistance value ($R_e$) and resistor 24b in the first embodiment can be regarded as the variable resistor circuit 25, variable resistor 25a, resistance value ($R_v$) and resistor 25b respectively, so these various changes are not described in details here.

When the oscillation control circuit 2, amplitude measurement circuit 3, control circuit 4 and signal processing circuit 5 are mounted on a monolithic IC, the resistor 24 need not be mounted on the monolithic IC. The absolute values of the resistance values of the variable resistor circuit 25 and the resistor (circuit) 26 of the oscillation control circuit 2 disperse (normally about a ±20% dispersion) due to the dispersion of the IC process. The negative conductance ($G_{osc}$) depends on the ratio of the resistance value ($R_v$) of the variable resistor circuit 25 and the resistance value ($R_e$) of the resistor 26 (see Expression 8), and the relative ratio of each resistor in the monolithic IC is approximately constant. As a result, the negative conductance ($G_{osc}$) is not influenced by the dispersion of the IC process. Therefore the dispersion of the negative conductance ($G_{osc}$) can be suppressed by selecting a resistor 24 that has minor dispersion. In other words, dispersion of the negative conductance ($G_{osc}$) can be suppressed by using a discrete resistor for the resistor 24. In addition, the negative conductance ($G_{osc}$) can be adjusted by the resistance values ($R_e$) of the resistor 24, so flexibility in designing various coils can be improved.

(Seventh Embodiment)

Figure 7:
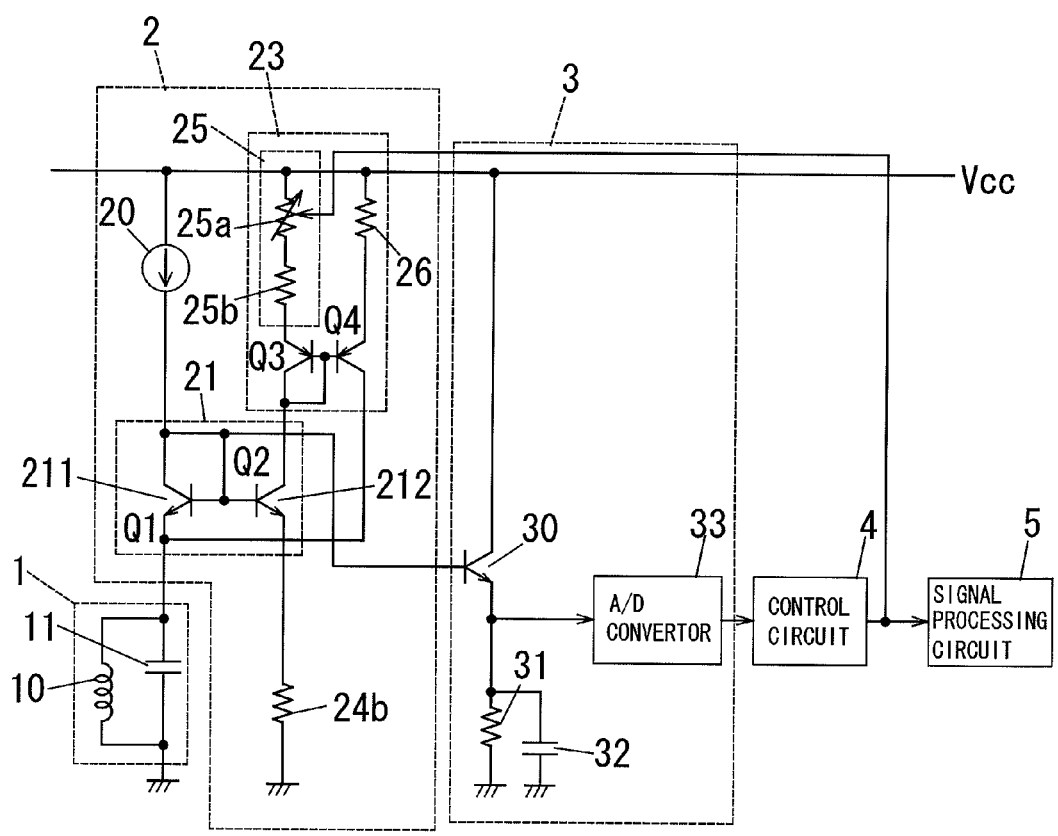
FIG. 7 is a schematic diagram of a proximity sensor according to a seventh embodiment of the present invention.

FIG. 7 shows a proximity sensor according to a seventh embodiment of the present invention. The proximity sensor according to the seventh embodiment is characterized by a variable resistor 25a of a variable resistor circuit 25, amplitude measurement circuit 3, control circuit 4 and signal processing circuit 5, and the other composing elements are configured in the same way as the sixth embodiment. Similar composing elements are denoted with same reference symbols used for the sixth embodiment.

The variable resistor 25a of the variable resistor circuit 25, amplitude measurement circuit 3, control circuit 4 and signal processing circuit 5 according to the seventh embodiment correspond to the variable resistor 24a of the variable resistor circuit 24, amplitude measurement circuit 3, control circuit 4 and signal processing circuit 5 according to the second embodiment respectively. In other words, the variable resistor circuit 24, variable resistor 24a, resistor 24b and resistance value ($R_e$) according to the second embodiment can be regarded as the variable resistor circuit 25, variable resistor 25a, resistor 25b and resistance value ($R_v$) respectively.

(Eighth Embodiment)

Figure 8:
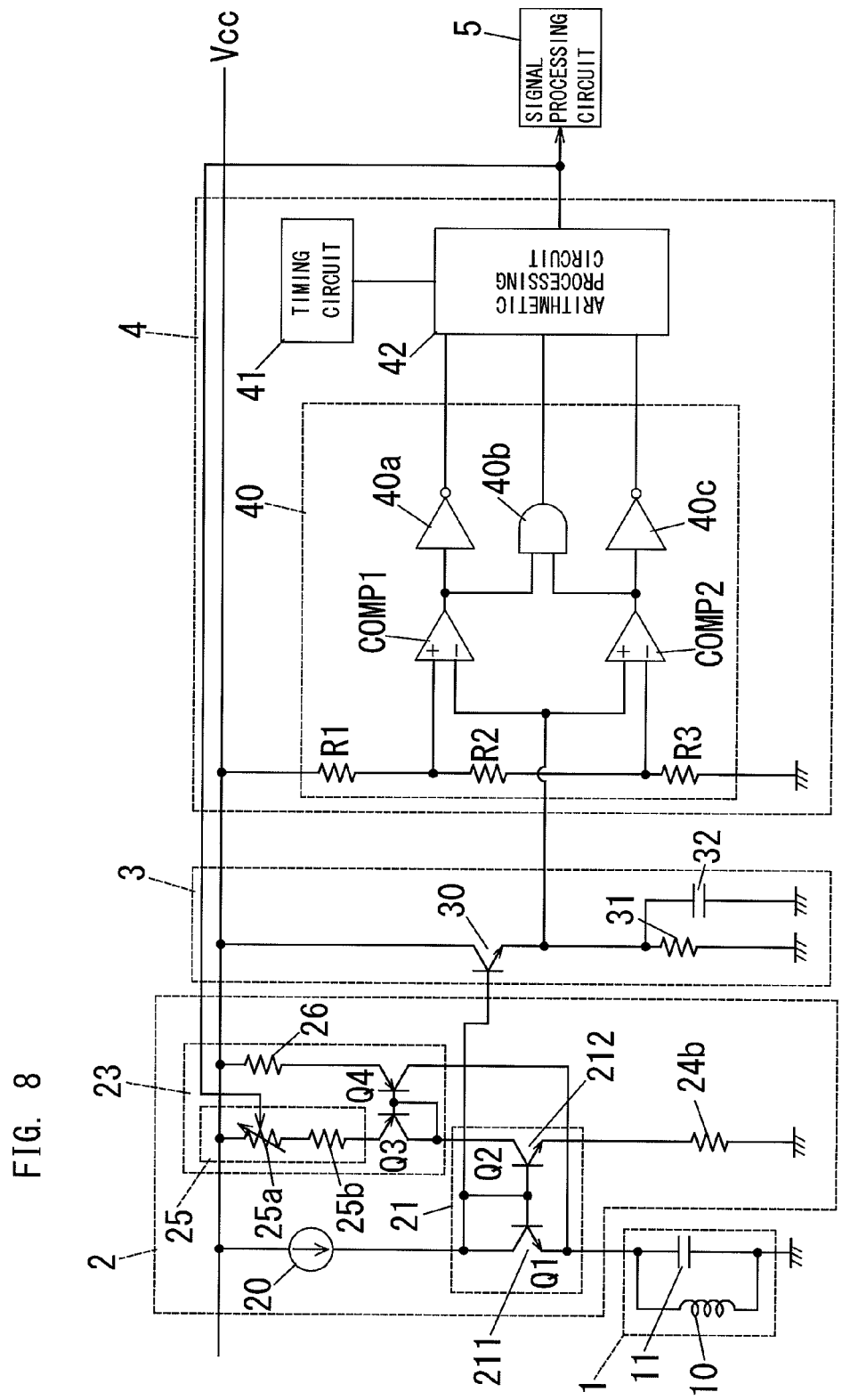
FIG. 8 is a schematic diagram of a proximity sensor according to an eighth embodiment of the present invention.

FIG. 8 shows a proximity sensor according to an eighth embodiment of the present invention. The proximity sensor according to the eighth embodiment is characterized by a variable resistor 25a of a variable resistor circuit 25, control circuit 4 and signal processing circuit 5, and the other composing elements are configured in the same way as the sixth embodiment. Similar composing elements are denoted with same reference symbols used for the sixth embodiment.

The variable resistor 25a of the variable resistor circuit 25, control circuit 4 and signal processing circuit 5 according to the eighth embodiment correspond to the variable resistor 24a of the variable resistor circuit 24, control circuit 4 and signal processing circuit 5 according to the third embodiment respectively. In other words, the variable resistor circuit 24, variable resistor 24a, resistor 24b and resistance value ($R_e$) according to the third embodiment can be regarded as the variable resistor circuit 25, variable resistor 25a, resistor 25b and resistance value ($R_v$) respectively.

Differences from the third embodiment will now be described. If a high level signal is received from the first NOT gate 40a, the arithmetic processing circuit 42, according to the eighth embodiment, decreases the resistance value ($R_v$) of the variable resistor circuit 25. If a high level signal is received from the AND gate 40b, the arithmetic processing circuit 42 maintains the resistance value ($R_v$) of the variable resistor circuit 25 as the current resistance value. If a high level signal is received from the second NOT gate 40c, the arithmetic processing circuit 42 increases the resistance value ($R_v$) of the variable resistor circuit 25. In other words, the control circuit 4 according to the eighth embodiment determines whether or not a resistance value of the digital potentiometer (variable resistor 25a), that is, a resistance value ($R_v$) of the variable resistor circuit 25, is changed based on the comparison result of the comparison circuit 40.

To change the resistance value ($R_v$) of the variable resistor circuit 25, the arithmetic processing circuit 42 changes the digital code one by one. For example, when the digital code is "00100110", if a high level signal is received from the first NOT gate 40a, the arithmetic processing circuit 42 decrements the current digital code by "1" to generates the digital code "00100101", and outputs this digital code. If a high level signal is received from the second NOT gate 40c, the arithmetic processing circuit 42 increments the current digital code by "1", to generate the digital code "00100111", and outputs this digital code.

(Ninth Embodiment)

Figure 9:
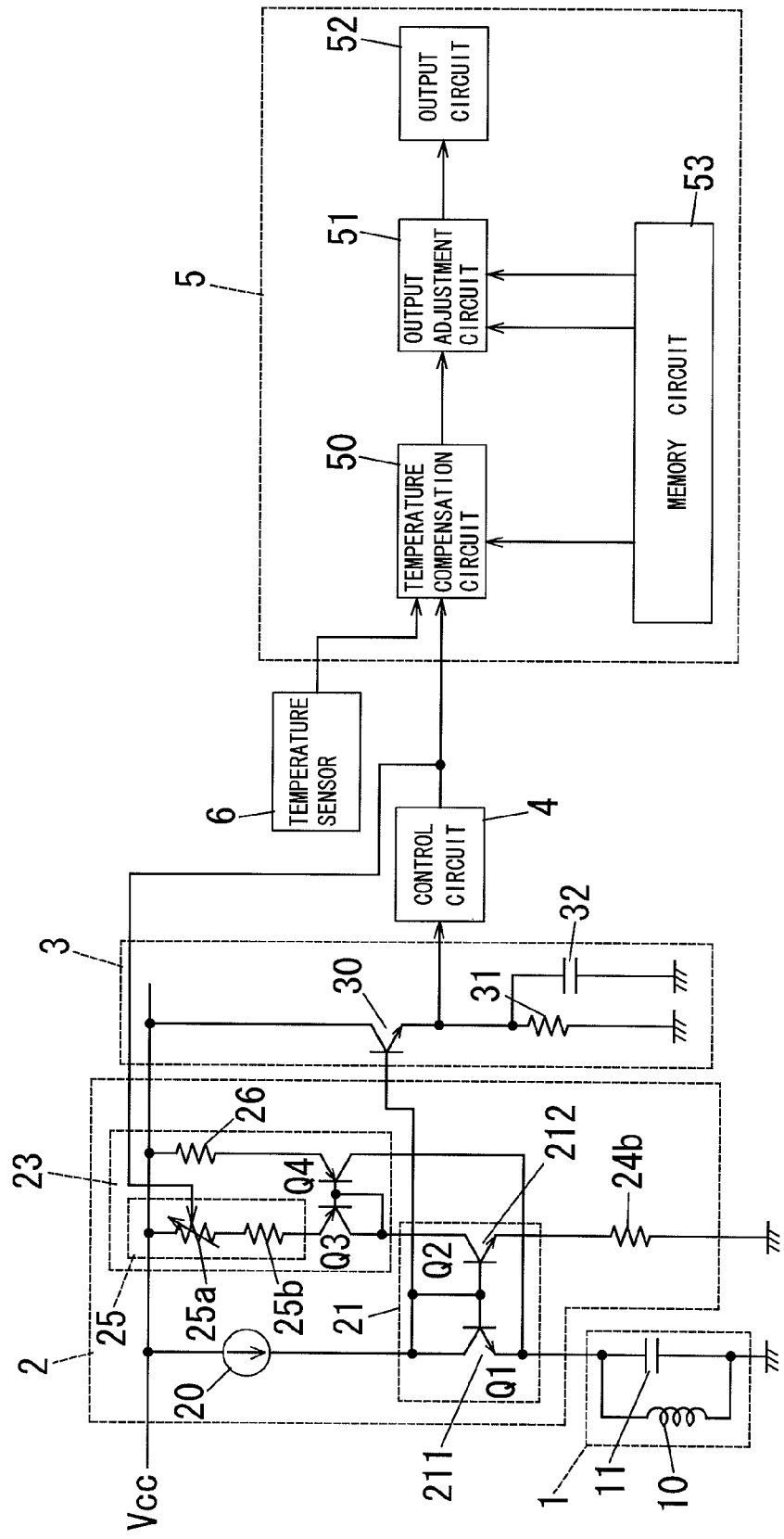
FIG. 9 is a schematic diagram of a proximity sensor according to a ninth embodiment of the present invention.

FIG. 9 shows a proximity sensor according to a ninth embodiment of the present invention. The proximity sensor according to the ninth embodiment is characterized by a temperature sensor 6 (temperature measurement circuit) and signal processing circuit 5, and the other composing elements are configured in the same way as the eighth embodiment. Similar composing elements are denoted with same reference symbols used for the eighth embodiment.

The temperature sensor 6 and signal processing circuit 5 according to the ninth embodiment correspond to those components of the fourth embodiment respectively. In other words, the variable resistor circuit 24 and resistance value ($R_e$) according to the fourth embodiment can be regarded as the variable resistor circuit 25 and resistance value ($R_v$) respectively.

(Tenth Embodiment)

Figure 10:
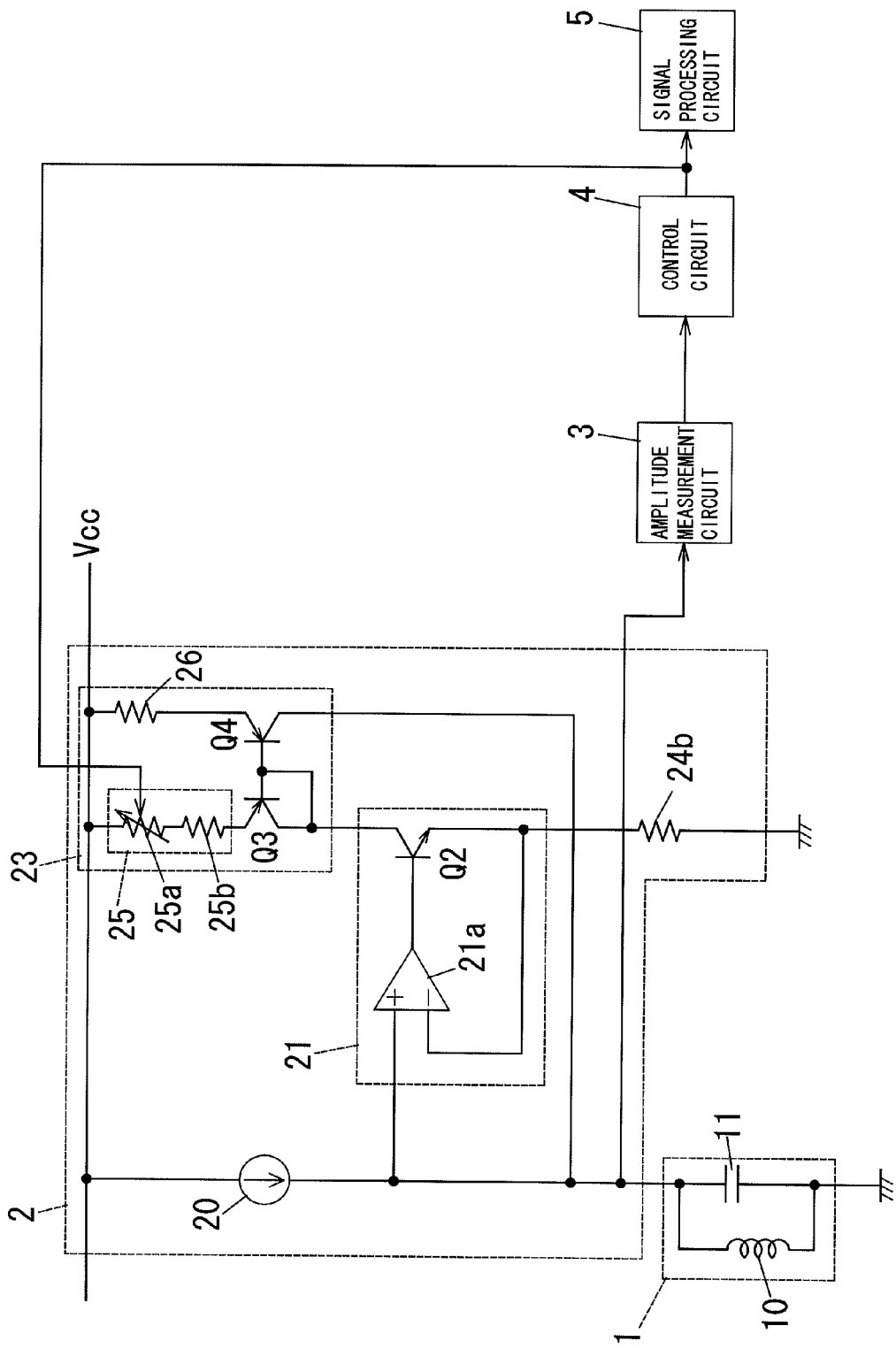
FIG. 10 is a schematic diagram of a proximity sensor according to a tenth embodiment of the present invention.

FIG. 10 shows a proximity sensor according to a tenth embodiment of the present invention. The proximity sensor according to the tenth embodiment is characterized by an oscillation control circuit 2, and the other composing elements are configured in the same way as the sixth embodiment. Similar composing elements are denoted with a same reference symbol used for the sixth embodiment. A current generating circuit 21 of the oscillation control circuit 2 according to the tenth embodiment corresponds to the same component according to the fifth embodiment.

According to a variant form of the sixth to ninth embodiments, the variable resistor circuit 25 is inserted between the interval power supply (Vcc) and the transistor (Q4), and the resistor (fixed resistor) 26 is inserted between the internal power supply (Vcc) and the transistor (Q3). In this example, the feedback current (In) is given by $(R_s/R_v) \cdot I_c$.

According to an example, the variable resistor may be inserted between the emitter of the transmitter (Q3) and the internal power supply (Vcc), and another variable resistor may be inserted between the emitter of the transistor (Q4) and internal power supply (Vcc). In this example, the adjacent range of the feedback current ($I_{fb}$) can be expanded compared with the variable resistor circuit 25 having one variable resistor.

(Eleventh Embodiment)

Figure 11:
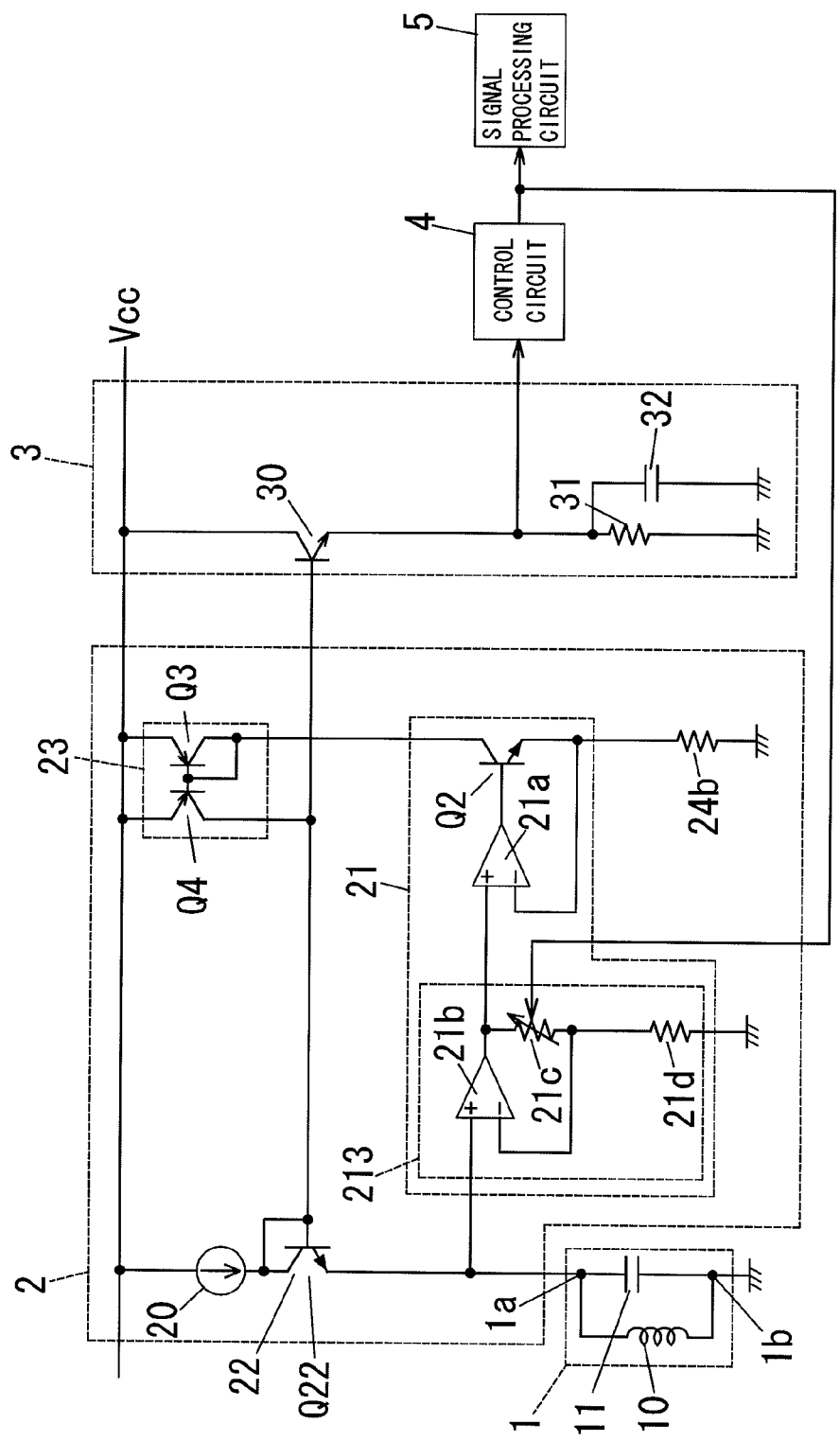
FIG. 11 is a schematic diagram of a proximity sensor according to an eleventh embodiment of the present invention.

FIG. 11 shows a proximity sensor according to an eleventh embodiment of the present invention. The proximity sensor according to the eleventh embodiment is characterized by an oscillation control circuit 2 and control circuit 4, and the other composing elements are configured in the same way as the first embodiment. Similar composing elements are denoted with same reference symbols used for the first embodiment.

The oscillation control circuit 2 according to the eleventh embodiment is configured to supply an electric current to the LC resonant circuit 1 as positive feedback, and generate the oscillating voltage across the LC resonant circuit 1. In the case of the example in FIG. 11, the oscillation control circuit 2 is comprised of a bias circuit 20, level shift circuit 22, current generating circuit 21, feedback circuit 23 and resistor (fixed resistor) 24*b*.

The bias circuit 20 according to the eleventh embodiment is a constant current source, which is configured to be connected with the internal power supply (Vcc), and supply a predetermined bias current to the LC resonant circuit 1 via the level shift circuit 22.

The level shift circuit 22 is configured to shift the oscillating voltage generated across the LC resonant circuit 1 to a higher voltage by the amount of a specified voltage. For example, the level shift circuit 22 includes an NPN transistor (Q22), and the collector and emitter thereof are connected with the output of the bias circuit 20 and the first terminal 1*a* of the LC resonant circuit 1 respectively. The base and collector of the transistor (Q22) are interconnected, and the base of the transistor (Q22) is also connected with the base of the transistor 30 of the amplitude measurement circuit 3. Therefore the output of the bias circuit 20 is connected with the first terminal 1*a* of the LC resonant circuit 1 via the P-N region of the transistor (Q22), and the oscillating voltage generated across the LC resonant circuit 1 is shifted to the total voltage of the oscillating voltage, and the base-emitter voltage of the transistor (Q1) in the collector and base of the transistor (Q1). Since the total voltage is applied to the base of the transistor 30, voltage equal to the oscillation voltage, generated across the LC resonant circuit 1, is applied between the emitter of the transistor 30 and the ground during the period when the oscillating voltage is positive. As a result, the capacitor 32 generates an amplitude signal (voltage of capacitor 32) corresponding to the amplitude of the oscillating voltage generated across the LC resonant circuit 1.

The current generating circuit 21 according to the eleventh embodiment includes the operational amplifier 21*a* and NPN transistor (Q2), just like the fifth embodiment, and also includes an amplifying circuit 213.

The amplifying circuit 213 is configured to amplify the oscillating voltage generated across the LC resonant circuit 1. In the case of the example in FIG. 11, the amplifying circuit 213 includes an operational amplifier 21*b*, variable resistor (circuit) 21*c* and resistor (fixed resistor circuit) 21*d*. The non-reverse input terminal of the operational amplifier 21*b* is connected with the first terminal 1*a* of the LC resonant circuit 1, and the reverse input terminal of the operational amplifier 21*b* is connected with the ground via the resistor 21*d*. The output terminal of the operational amplifier 21*b* is connected with the reverse input circuit of the operational amplifier 21*b* via the variable resistor 21*c*, and is connected with the non-reverse input terminal of the operational amplifier 21*a*. In other words, the amplifying circuit 213 is a non-reverse amplifying circuit in which the phases of the input voltage and the output voltage are the same. The gain (A) of the amplifying circuit 213 is given by $$A=(R_s+R_v)/R_s$$

where $R_s$ denotes a resistance value of the resistor 21*d*, and $R_v$ denotes a resistance value of the variable resistor 21*c*. Therefore the variable resistor 21*c* is used for adjusting the gain of the oscillating voltage. The variable resistor 21*c* includes a plurality of series circuits that are connected in parallel between the output terminal and the reverse input terminal of the operational amplifier 21*b*. Each of the plurality of series circuits includes a resistor (fixed resistor) and the semiconductor switching device (e.g. transistor). Hence the resistance value ($R_v$) of the variable resistor 21*c* can be adjusted by turning each of the plurality of semiconductor switching elements ON or OFF. It is preferable that the resistance value ($R_s$) of the fixed resistor 21*d* and the resistance value ($R_v$) of the variable resistor 21*c* are set to sufficiently large resistance values, so that the oscillation of the LC resonant circuit 1 is not affected.

The operational amplifier 21*a* and the transistor (Q2) are VI conversion circuits, and are configured to generate electric current corresponding to the oscillating voltage amplified by the amplifying circuit 213. The collector (first output terminal) of the transistor (Q2) is connected with the internal power supply (Vcc) via the feedback circuit 23, and the emitter (second output terminal) of the transistor (Q2) is connected with the ground via the resistor 24*b* for setting emitter potential (adjusting electric current). The output terminal of the operational amplifier 21*a* is connected with the base of the transistor (Q2), and the reverse input terminal of the operational amplifier 21*a* is connected with the emitter of the transistor (Q2). Therefore the operational amplifier 21*a* applies the total voltage of the oscillating voltage amplified by the amplifying circuit 21 and the base-emitter voltage of the transistor (Q2) to the base of the transistor (Q2). This total voltage is a voltage when the absolute value of the base-emitter voltage is subtracted from the oscillating voltage amplified by the amplifying circuit 21. Hence a voltage equal to the oscillating voltage amplified by the amplifying circuit 213 is applied between the emitter of the transistor (Q2) and the ground during each positive period of oscillating voltage. In other words, the VI conversion circuit generates a current corresponding to the oscillating voltage amplifying by the amplification circuit 213. This electric current is limited by the resistor 24*b*.

The feedback circuit 23 is configured to generate a feedback current according to the electric current generated by the current generating circuit 21, and supply the feedback current to the first terminal 1*a* of the LC resonant circuit 1 as positive feedback. In the case of the example in FIG. 11, the feedback current is supplied to the first terminal 1*a* of the LC resonant circuit 1 via a region between base and emitter (diode region) of the transistor (Q22). In concrete terms, the emitter and collector of the transistor (Q3) are connected with the internal power supply (Vcc) and the collector of the transistor (Q2) respectively. The base and collector of the transistor (Q3) are interconnected. The emitter and base of the transistor (Q4) are connected with the internal power supply (Vcc) and the base of the transistor (Q3) respectively. The collector of the transistor (Q4) is connected with the bases of the transistor (Q22) and transistor (30) respectively. Therefore an electric current equal to the electric current from the VI conversion circuit flows between the emitter and collector of the transistor (Q3), and a current equal to the emitter-collector current, that is, a feedback current, is supplied to the LC resonant circuit 1.

The control circuit 4 is configured to set the negative conductance of the oscillation control circuit 2 to a critical value by which the LC resonant circuit 1 can oscillate, based on the amplification signal from the capacitor 32. For example, the control circuit 4 includes a CPU, and the operation thereof is implemented by programs or a logic circuit.

According to the eleventh embodiment, the control circuit 4 sets the negative conductance of the oscillation control circuit 2 to the above mentioned critical value by adjusting the resistance value ($R_v$) of the variable resistor 21c of the amplification circuit 213. The negative conductance ($G_{osc}$) is given by the above mentioned Expression 1. This means that the negative conductance ($G_{osc}$) can be adjusted by setting the feedback current ($I_{fb}$) based on the amplitude ($V_T$).

The current ($I_O$) generated by the current generation circuit 21 is given by $$I_O = I_{fb} = 1/R_e \cdot (R_s + R_v)/R_s \cdot V_T$$ [Expression 10]

A voltage equal to the oscillating voltage amplified by the amplifying circuit 213 is applied between the emitter of the transistor (Q2) and the ground during each positive period of the oscillating voltage, so the negative conductance ($G_{osc}$) is given by $$|G_{osc}| = 1/(2R_e) \cdot (R_s + R_v)/R_s$$ [Expression 11]

This means that the negative conductance ($G_{osc}$) can be adjusted by the resistance value ($R_v$) of the variable resistor 21c.

An oscillation condition of the LC resonant circuit 1 is given by $$G_{coil} \leq |G_{osc}|$$

where $G_{coil}$ denotes a conductance of the sensing coil 10. If the absolute value of the negative conductance ($G_{osc}$) is equal to the conductance ($G_{coil}$), the negative conductance ($G_{osc}$) becomes a maximum value by which the LC resonant circuit 1 can oscillate. In other words, the negative value ($G_{coil}$) of the conductance of the sensing coil 10 becomes a critical value of the negative conductance ($G_{osc}$) of the oscillation control circuit 2.

If the negative conductance ($G_{osc}$) is the critical value, then the conductance ($G_{coil}$) is given by $$G_{coil} = 1/(2R_e) \cdot (R_s + R_v)/R_s$$ [Expression 12]

This means that the resistance value ($R_v$) can be used as a value to show the distance between the object and the sensing coil 10.

The control circuit 4 judges whether or not the negative conductance ($G_{osc}$) is the above mentioned critical value based on the amplitude ($V_T$) from the amplitude measurement circuit 3, and adjusts the negative conductance ($G_{osc}$) of the oscillation control circuit 2 according to the judgment result.

For example, the control circuit 4 supplies a control signal to turn each semiconductor switching device of the variable resistor 21c ON/OFF to the variable resistor 21c, so that the amplitude ($V_T$) from the amplitude measurement circuit 3 becomes a predetermined value. This predetermined value is a value of the amplitude ($V_T$) when the absolute value of the negative conductance ($G_{osc}$) and the absolute value of the conductance ($G_{coil}$) are the same. As a result, the resistance value ($R_v$) of the variable resistor 21c is adjusted so that the negative conductance ($G_{osc}$) becomes the above mentioned critical value. Ideally the absolute value of the negative conductance ($G_{osc}$) matches the absolute value of the conductance ($G_{coil}$), but may not match exactly. In other words, it is acceptable if the absolute value of the negative conductance ($G_{osc}$) is a value in a range substantially the same as the absolute value of the conductance ($G_{coil}$) (e.g. a value slightly smaller than the critical value). Therefore the control circuit 4 sets the resistance value ($R_v$) of the variable resistor 21c so that the amplitude ($V_T$) from the amplitude measurement circuit 3 becomes a value within a predetermined range. A value within the predetermined range is a value of the amplitude ($V_T$) in a range where the absolute value of the negative conductance ($G_{osc}$) is substantially the same as the absolute value of the conductance ($G_{coil}$).

As a consequence, the eleventh embodiment operates in the same manner as the first embodiment. In the operation of the eleventh embodiment, the variable resistor circuit 24 and the resistance value ($R_e$) according to the first embodiment can be regarded as the variable resistor 21c and the resistance value ($R_v$).

If the object approaches the sensing coil 10 and the eddy current loss in the sensing coil 10 increases here, the absolute value of the conductance ($G_{coil}$) of the sensing coil 10 becomes greater then the absolute value of the negative conductance ($G_{osc}$). Because of this, the oscillation conditions are no longer satisfied, and the LC resonant circuit 1 begins to stop oscillation, decreasing the amplitude ($V_T$). If the amplitude ($V_T$) detected by the amplitude measurement circuit 3 is no longer a value within the above mentioned predetermined range, then the control circuit 4 sets the resistance value ($R_v$) of the variable resistor 21c so that the amplitude ($V_T$) becomes a value within the predetermined range. In other words, the control circuit 4 adjusts the negative conductance ($G_{osc}$) and increases the resistance value ($R_v$) so as to increase the absolute value of the negative conductance ($G_{osc}$). The signal processing circuit 5 generates the distance signal based on the resistance value ($R_v$) that is set by the control circuit 4.

If the object moves away from the sensing coil 10 and the eddy current loss in the sensing coil 10 decreases, on the other hand, the absolute value of the conductance ($G_{coil}$) of the sensing coil 10 becomes smaller than the absolute value of the negative conductance ($G_{osc}$), and the amplitude ($V_T$) of the LC resonant circuit 1 increases. If the amplitude ($V_T$) detected by the amplitude measurement circuit 3 no longer becomes a value within the above mentioned predetermined range, the control circuit 4 sets the resistance value ($R_v$) of the variable resistor 21c so that the amplitude ($V_T$) becomes a value within the predetermined range. In other words, the control circuit 4 adjusts the negative conductance ($G_{osc}$), and decreases the resistance value ($R_v$) so as to decrease the absolute value of the negative conductance ($G_{osc}$). The signal processing circuit 5 generates the distance signal based on the resistance value ($R_v$) that is set by the control circuit 4.

According to the eleventh embodiment, the resistance value ($R_v$) of the variable resistor 21c for adjusting the gain of the amplifying circuit 213 can be used for a value to show the distance between the sensing coil 10 and the object. By using the resistance value ($R_v$) of the variable resistor 21c, not only can the existence or absence of an object be detected, but also an analog distance signal, to show the distance between the object and the sensing coil 10, can be obtained. Hence an effect similar to the first embodiment is implemented, and various changes similar to the first embodiment can be performed. In other words, the variable resistor 24a and resistance value ($R_e$) can be regarded as the variable resistor 21c and resistance value ($R_v$), so these various changes are not described in detail here.

According to an example, the resistor (fixed resistor circuit) 21d is connected between the reverse input terminal and output terminal of the operational amplifier 21b, while the variable resistor 21c is connected between the reverse input terminal of the operational amplifier 21b and the ground. This example can be applied to the later mentioned twelfth to fourteenth embodiments.

According to the first embodiment, the variable resistor 24a must be set to a relatively small resistance value, but according to the eleventh embodiment, the variable resistor 21c can be set to a relatively large resistance value. This is because the negative conductance ($G_{osc}$) depends on the ratio of $R_s+R_v$ and $R_s$, as shown in Expression 11. Therefore the variable resistor 21c can be designed more easily than the variable resistor 24a.

According to an example, the oscillation control circuit 2, amplitude measurement circuit 3, control circuit 4 and signal processing circuit 5 are mounted on the monolithic IC, but the resistor 24b is not mounted on the monolithic IC. The absolute values of the variable resistor 21c and the resistor 21d disperse (normally about ±20% dispersion) due to the dispersion of the IC process. The negative conductance ($G_{osc}$) depends on the ratio of $R_s+R_v$ and $R_s$, and the relative ratio of each resistor in the monolithic IC is approximately constant. As a result, the negative conductance ($G_{osc}$) is not influenced by the dispersion of the IC process. Therefore the dispersion of the negative conductance ($G_{osc}$) can be suppressed by selecting a resistor 24b that has minor dispersion. In addition, the negative conductance ($G_{osc}$) can be adjusted by the resistance value ($R_e$) of the resistor 24b, so flexibility in designing various coils can be improved.

According to an example, the VI conversion circuit is replaced with the level shift circuit and emitter-follower circuit (see 21 in FIG. 1).

(Twelfth Embodiment)

Figure 12:
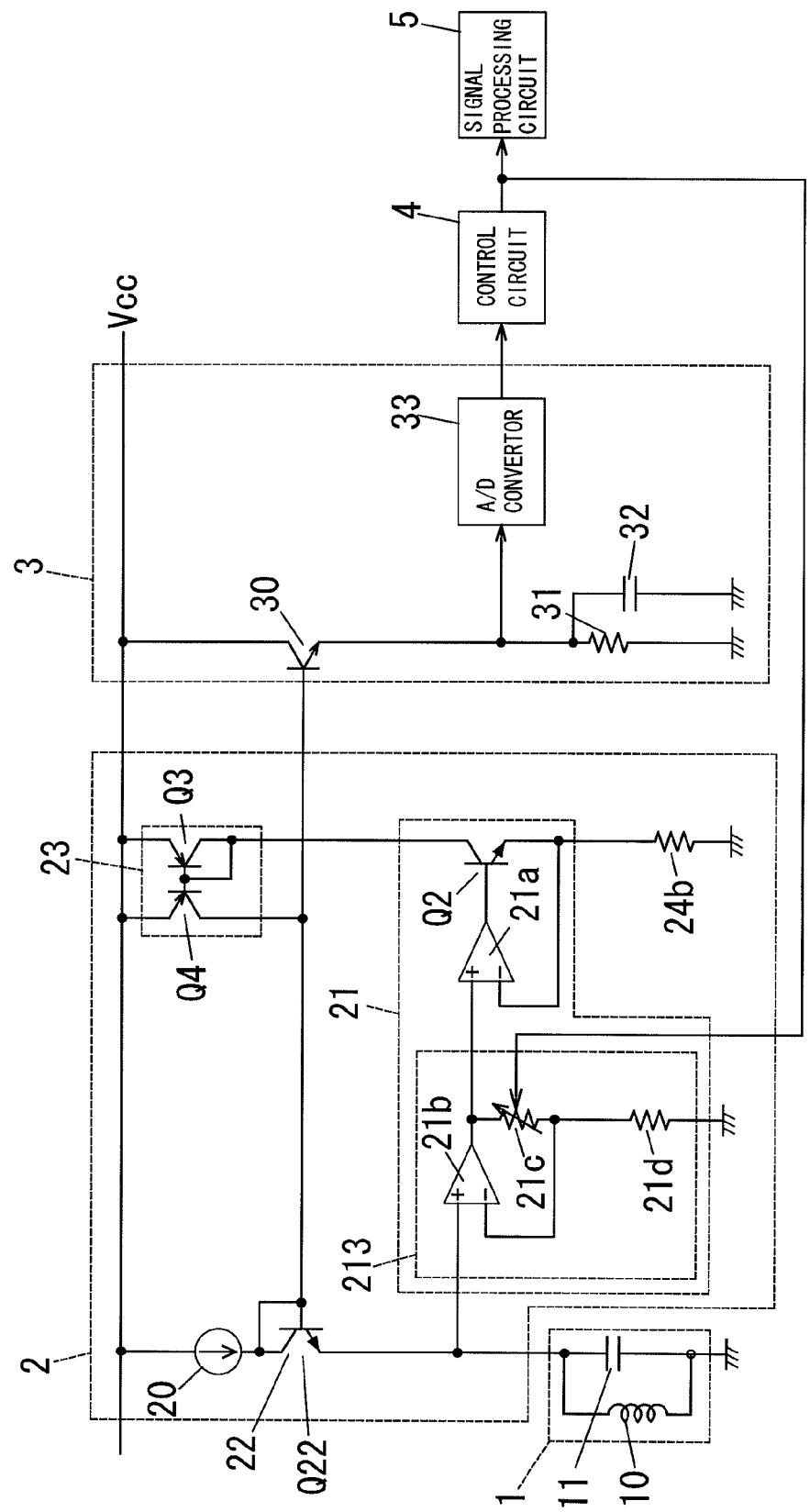
FIG. 12 is a schematic diagram of a proximity sensor according to a twelfth embodiment of the present invention.

FIG. 12 shows a proximity sensor according to a twelfth embodiment of the present invention. The proximity sensor according to the twelfth embodiment is characterized by a variable resistor 21c, amplitude measurement circuit 3, control circuit 4 and signal processing circuit 5, and the other composing elements are configured in the same way as the eleventh embodiment. Similar composing elements are denoted with same reference symbols used for the eleventh embodiment.

The variable resistor 21c according to the twelfth embodiment is a digital potentiometer that can set a resistance value ($R_v$) using a digital code (e.g. bit string "00000111").

The variable resistor 21c, amplitude measurement circuit 3, control circuit 4 and signal processing circuit 5 according to the twelfth embodiment correspond to the variable resistor 24a of the variable resistor circuit 24, amplitude measurement circuit 3, control circuit 4 and signal processing circuit 5 according to the second embodiment respectively. In other words, the variable resistor 24a (variable resistor circuit 24), resistor 24b and resistance value ($R_e$) according to the second embodiment can be regarded as the variable resistor 21c, resistor 25b and resistor ($R_v$) respectively.

(Thirteenth Embodiment)

Figure 13:
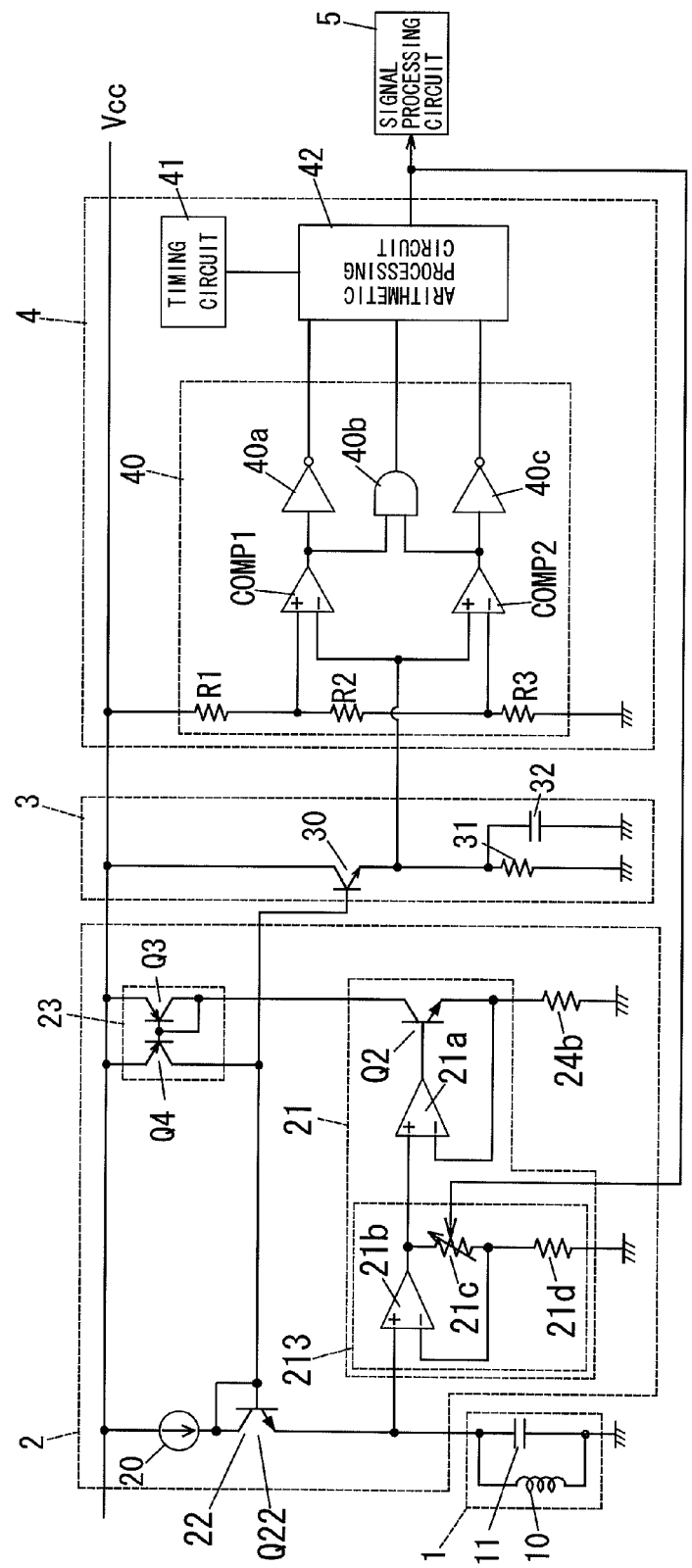
FIG. 13 is a schematic diagram of a proximity sensor according to a thirteenth embodiment of the present invention.

FIG. 13 shows a proximity sensor according to a thirteenth embodiment of the present invention. The proximity sensor according to the thirteenth embodiment is characterized by a variable resistor 21c, control circuit 4 and signal processing circuit 5, and the other composing elements are configured in the same way as the eleventh embodiment. Similar composing elements are denoted with same reference symbols used for the eleventh embodiment.

The variable resistor 21c according to the thirteenth embodiment is a digital potentiometer that can set a resistance value ($R_v$) using a digital code (e.g. bit string "00000111").

The variable resistor 21c, control circuit 4 and signal processing circuit 5 according to the thirteenth embodiment correspond to the variable resistor 24a of the variable resistor circuit 24, control circuit 4 and signal processing circuit 5 according to the third embodiment. In other words, the variable resistor 24a (variable resistor circuit 24), resistor 24b and resistance value ($R_e$) according to the third embodiment can be regarded as the variable resistor 21c, resistor 21d and resistance value ($R_v$) respectively.

Differences from the third embodiment will now be described. If a high level signal is received from the first NOT gate 40a, the arithmetic processing circuit 42 according to the thirteenth embodiment decreases the resistance value ($R_v$) of the variable resistor 21c. If a high level signal is received from the AND gate 40b, the arithmetic processing circuit 42 maintains the resistance value ($R_v$) of the variable resistor 21c at the current resistance value. If a high level signal is received from the second NOT gate 40c, the arithmetic processing circuit 42 increases the resistance value ($R_v$) of the variable resistor 21c. In other words, the control circuit 4 according to the thirteenth embodiment determines whether or not a resistance value ($R_v$) of the digital potentiometer (variable resistor 21c) is changed based on the comparison result of the comparison circuit 40.

To change the resistance value ($R_v$) of the variable resistor 21c, the arithmetic processing circuit 42 changes the digital code one by one. For example, when the digital code corresponding to the resistance value ($R_v$) is "00100110", if a high level signal is received from the first NOT gate 40a, the arithmetic processing circuit 42 decrements the current digital code by "1" to generate the digital code "00100101", and outputs this digital code. If a high level signal is received from the second NOT gate 40c, the arithmetic processing circuit 42 increments the current digital code by "1" to generate the digital code "00100111", and outputs this digital code.

(Fourteenth Embodiment)

Figure 14:
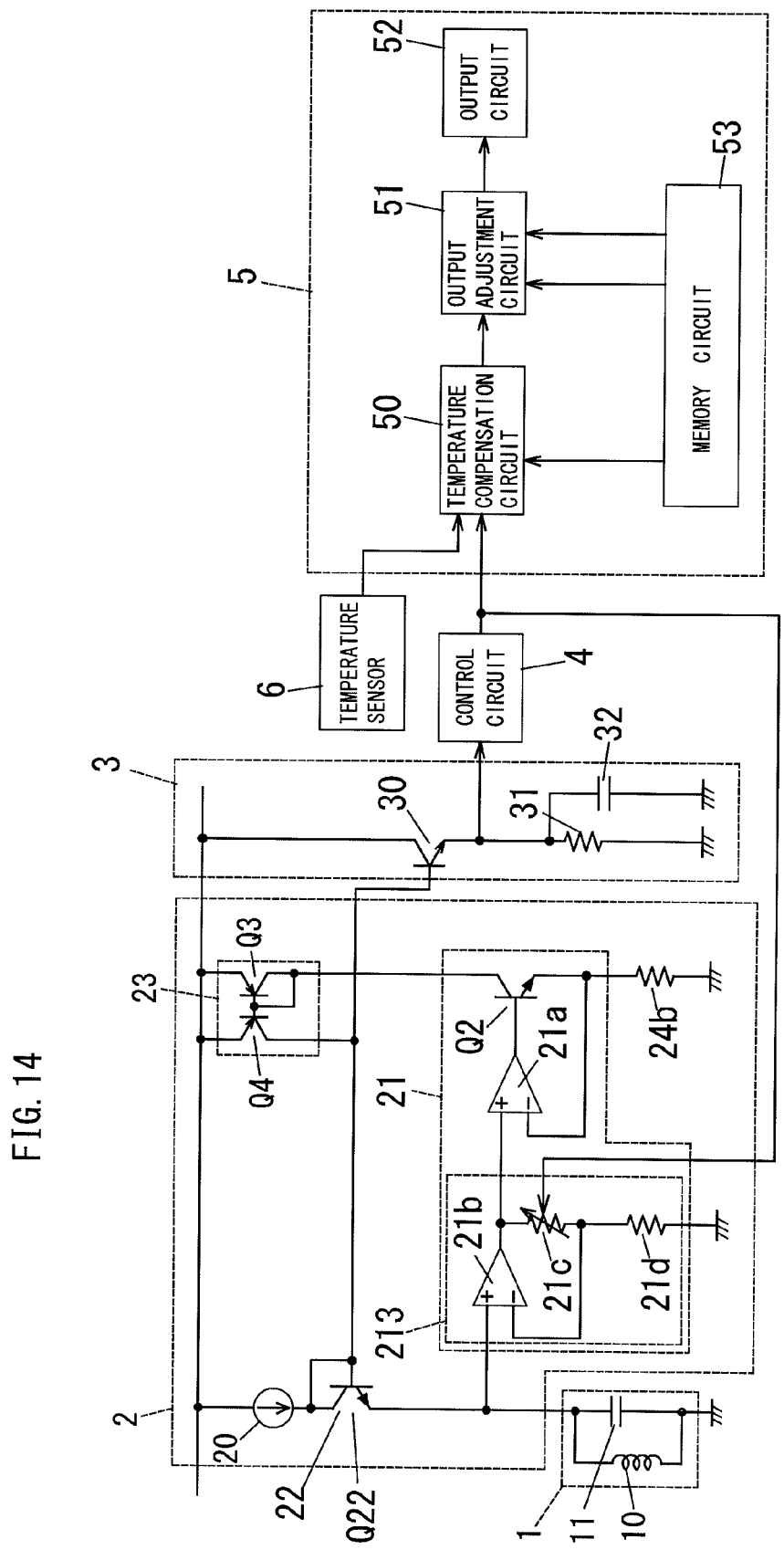
FIG. 14 is a schematic diagram of a proximity sensor according to a fourteenth embodiment of the present invention.

FIG. 14 shows a proximity sensor according to the fourteenth embodiment of the present invention. The proximity sensor according to the fourteenth embodiment is characterized by a temperature sensor 6 (temperature measurement circuit) and signal processing circuit 5, and the other composing elements are configured in the same way as the thirteenth embodiment. Similar composing elements are denoted with same reference symbols used for the thirteenth embodiment.

The temperature sensor 6 and signal processing circuit 5 according to the fourteenth embodiment correspond to those of the fourth embodiment respectively. In other words, the variable resistor circuit 24 and resistance value ($R_e$) according to the fourth embodiment can be regarded as the variable resistor 21c and resistance value ($R_v$) respectively.

(Fifteenth Embodiment)

Figure 15:
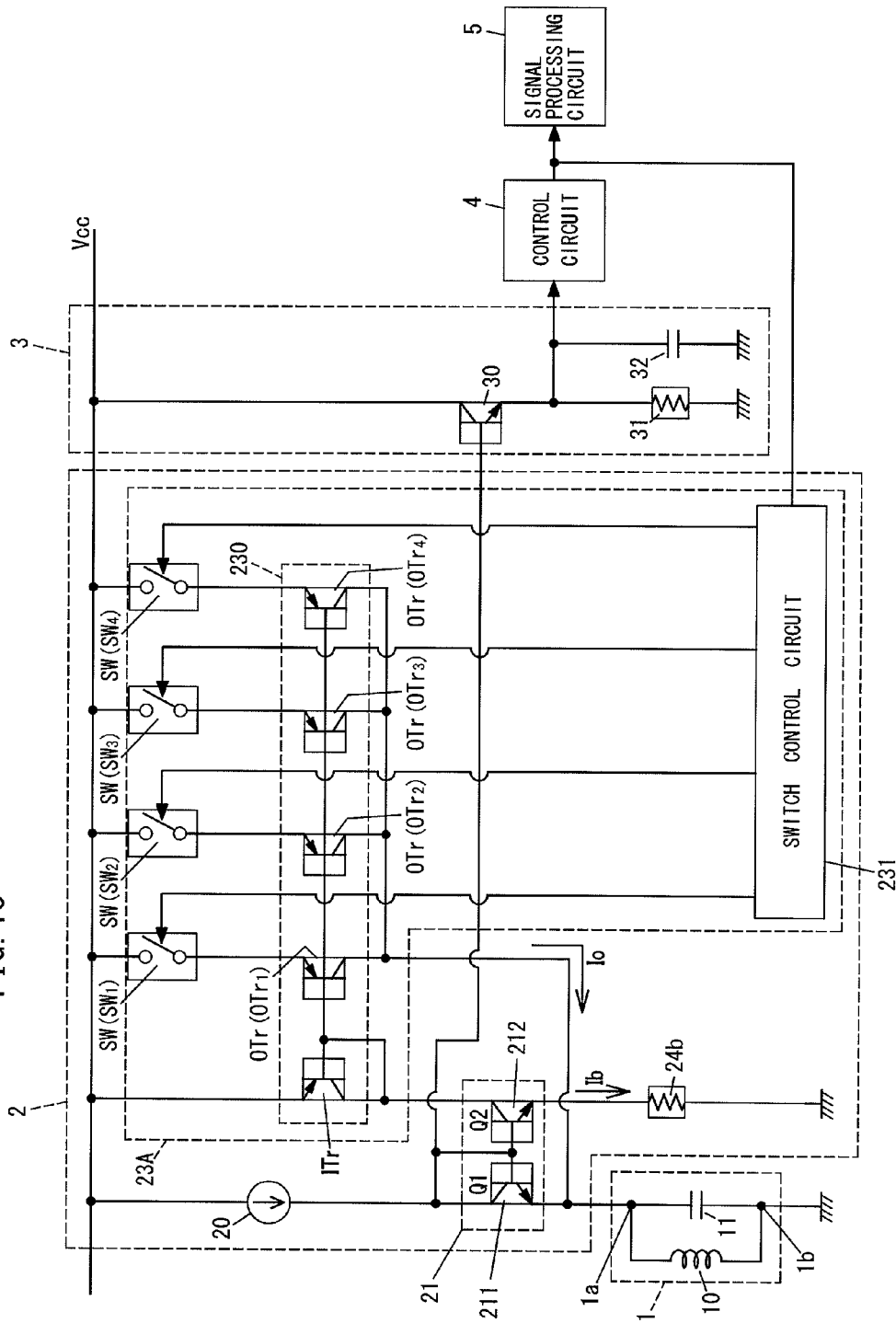
FIG. 15 is a schematic diagram of a proximity sensor according to a fifteenth embodiment of the present invention.

FIG. 15 shows a proximity sensor according to a fifteenth embodiment of the present invention. The proximity sensor according to the fifteenth embodiment is characterized by a current control circuit 23A of the oscillation control circuit 2, control circuit 4 and signal processing circuit 5 compared with the first embodiment. The variable resistor circuit 24 is replaced with the resistor 24b for setting emitter potential (for limiting the amplification current) of the transistor Q2, and this resistor 24b is connected between the emitter of the transistor (Q2) and ground. The other composing elements are configured in almost the same way as the first embodiment. Similar composing elements are denoted with similar reference symbols used for the first embodiment. The amplitude measurement circuit 3 detects an amplitude of the oscillating voltage (difference between a maximum value and a minimum value of the oscillating voltage) generated across the LC resonant circuit 1. According to an example, the emitter-follower circuit 212 can be replaced with a source-follower circuit, including an MOSFET.

The current control circuit 23A corresponds to the feedback circuit 23 of the first embodiment, and is configured to generated and adjust the feedback current in response to the current generated by the current generation circuit 21, and supplies this feedback current to the first terminal 1a of the LC resonant circuit 1 as a positive feedback. The current control circuit 23A includes a current mirror circuit 230, a plurality of switches (SW) and switch control circuit 231.

The current mirror circuit 230 has an input transistor (ITr) and a plurality of output transistors (OTr). Each transistor of the current mirror circuit 230 is a PNP transistor.

According to the example in FIG. 15, the collector and emitter of the input transistor (ITr) are connected to the collector of the transistor (Q2) and the internal power supply (reference power supply) (Vcc) respectively. The collector and base of the input transistor (ITr) are interconnected. The emitters of the output transistors (OTr$_1$ to OTr$_4$) are connected with the internal power supply (Vcc) via the switches (SW$_1$ to SW$_4$) respectively. The bases and collectors of the output transistors (OTr$_1$ to OTr$_4$) are connected with the base of the input transistor (ITr) and the first terminal 1a of the LC resonant circuit 1 respectively.

In the current mirror circuit 230, the amplification current (reference current) Ib corresponding to the oscillating voltage generated across the LC resonant circuit 1 flows between the emitter and collector of the input transistor (ITr). The output transistors (OTr$_1$ to OTr$_4$) connected with the internal power supply (Vcc) supply mirror current (Im$_1$ to Im$_4$) having a magnitude proportional to the reference current to the LC resonant circuit 1 respectively. Each mirror current (Im$_n$) is given by $$Im_n = M_n \cdot Ib \quad \text{[Expression 13]}$$

where M$_n$ denotes a mirror ratio (ratio of the mirror current (Im$_n$) to the reference current (Ib)).

In the fifteenth embodiment, the transistor sizes of the input transistor (ITr) and output transistors (OTr$_1$ to OTr$_4$) are all the same. Therefore the input transistor (ITr) and each output transistor (OTr) have the same emitter size (emitter area), (that is, Mn=1), and each of the mirror current (Im$_1$ to Im$_4$) has the same magnitude as the reference current (Ib).

Each switch (SW) is a semiconductor switching device, such as a transistor or a thyristor, and is turned ON or OFF to connect or disconnect the corresponding output transistor (OTr) and the internal power supply (Vcc) respectively. Therefore if the corresponding switch (SW) is OFF, each output transistor (OTr) does not supply the mirror current (Im) to the LC resonant circuit 1. Whether or not each output transistor (OTr) supplies the mirror current to the LC resonant circuit 1 is determined depending on whether each switch (SW) is ON or OFF.

The switch control circuit 231 is configured to control each switch (SW) in response to an input digital signal (digital code). For example, the switch control circuit 231 includes a microcomputer or logic circuit to execute programs.

This digital code is 4-bit straight binary code. For example, the least significant bit (LSB) to the most significant bit (MSB) of the digital code correspond to the switches (SW$_1$) to (SW$_4$) on a one to one basis.

If a bit value of the digital code is "0", the switch control circuit 231 turns a switch (SW) corresponding to this bit OFF, and if this bit is "1", the switch control circuit 231 turns this switch (SW) ON. In this way, each switch (SW) is controlled based on the digital code that is set in the switch control circuit 231 through the control circuit 4.

For example, if the digital code is "1010", the switch control circuit 231 turns the switches (SW$_2$) and (SW$_4$) ON, and turns the switches (SW$_1$) and (SW$_3$) OFF. Therefore the current control circuit 23A adds the mirror currents (Im$_2$) and (Im$_4$) to generate the electric current (I$_O$), and supplies this electric current (I$_O$) to the LC resonant circuit 1.

Since the current mirror circuit 230 generates the electric current (I$_O$) out of the mirror currents (Im), the electric current (I$_O$) is given by $$I_O = \Sigma \delta_n \cdot Im_n \quad \text{[Expression 14]}$$

where δ$_n$ denotes a function to show whether the switch (SW$_n$) is ON (δ$_n$=1) or OFF (δ$_n$=0).

According to the fifteenth embodiment, each mirror current (Im) is completely the same, so the electric current (I$_O$) is determined by a number of switches (SW) that are turned ON. Since the mirror current (Im) is equal to the reference current (Ib), the current (I$_O$) is one of 0, Ib, 2Ib, 3Ib and 4Ib.

In other words, the current control circuit 23A functions as a D/A converter for supplying an electric current (I$_O$) corresponding to a digital code which was set by the control circuit 4, that is, a feedback current I$_{fb}$ (I$_{fb}$=I$_O$), to the LC resonant circuit 1.

Here the negative conductance (G$_{osc}$) can be given by the above mentioned Expression 1. Therefore the negative conductance (G$_{osc}$) can be adjusted by setting the feedback current (I$_{fb}$) based on the amplitude (V$_T$).

Since a voltage equal to the oscillating voltage generated across the LC resonant circuit 1 is applied between the emitter of the transistor (Q2) and the ground during each positive period of the oscillating voltage, the negative conductance (G$_{osc}$) is given by $$|G_{osc}| = (1/2R)\Sigma \delta_n \cdot M_n \quad \text{[Expression 15]}$$

where R denotes the resistance value of the resistor 24b, based on Expressions 1, 13, and 14. Hence the negative conductance (G$_{osc}$) can be adjusted by the digital code.

When the negative conductance (G$_{osc}$) of the oscillation control circuit 2 is a critical value (that is, a negative value of the conductance of the sensing coil 10 (−G$_{coil}$)), the conductance (G$_{coil}$) is given by $$G_{coil} = (1/2R)\Sigma \delta_n \cdot M_n \quad \text{[Expression 16]}$$

The conductance (G$_{coil}$) of the sensing coil 10 changes according to the change of the eddy current loss due to the distance between an object and the sensing coil 10 (that is, changes according to the distance between an object and the sensing coil 10). Therefore if the negative conductance (G$_{osc}$) has the above mentioned critical value, the conductance (G$_{coil}$) of the sensing coil 10 and the digital code have a corresponding relationship. In other words, the bit pattern of the digital code that is set by the control circuit 4 changes depending on the distance between the object and the sensing coil 10.

The control circuit 4 is configured to set the negative conductance of the oscillation control circuit 2 to a critical value by which the LC resonant circuit 1 can oscillate, based on the amplitude signal from the amplitude measurement circuit 3. For example, the control circuit 4 includes a microcomputer or logic circuit to execute programs. Specifically, the control circuit 4 generates a digital code so that the amplitude ($V_T$) from the amplitude measurement circuit 3 becomes a predetermined value. This predetermined value is a value of the amplitude ($V_T$) when the absolute value of the negative conductance ($G_{osc}$) and the absolute value of the conductance ($G_{coil}$) are the same, and the negative conductance ($G_{osc}$) becomes the critical value. Then the control circuit 4 supplies a digital signal including this digital code to the switch control circuit 321 and the signal processing circuit 5.

It is preferable that the absolute value of the negative conductance ($G_{osc}$) matches the absolute value of the conductance ($G_{coil}$). But the present embodiment is not limited to this, and the absolute value of the negative conductance ($G_{osc}$) may be set to a value in a range of values that are substantially the same as the absolute value of the conductance ($G_{coil}$) (e.g. a value slightly smaller than the critical value). Therefore the control circuit 4 sets the digital code so that the amplitude ($V_T$) from the amplitude measurement circuit 3 becomes a value within a predetermined range. A value within the predetermined range is a value of an amplitude ($V_T$) in a range where the absolute value of the negative conductance ($G_{osc}$) is substantially the same as the absolute value of the conductance ($G_{coil}$).

The signal processing circuit 5 is configured to obtain a digital code from the digital signal, generate a distance signal based on the digital code, and supply the distance signal to an external device, such as a personal computer or programmable controller. The distance signal is, for example, an analog signal of which level value increases in proportion to the distance between the object and the sensing coil 10 (sensing distance). For example, the signal processing circuit 5 can generate the distance signal using a data table for showing the relationship of a digital code (bit pattern) and a sensing distance, or an expression for converting a value of the digital code (total number of bits) into a sensing distance. For a value of a digital code, a decimal value into which the digital code is converted may be used. The data table or an expression may be determined based on an actual measurement result.

According to an example, the signal processing circuit 5 may compare the distance signal with a threshold to generate the digital sensing signal to show whether or not an object exists. For example, if a value of the distance signal is less than a predetermined threshold, the signal processing circuit 5 judges that an object exists within the sensing range of the sensing coil 10. If not, the signal processing circuit 5 decides that an object does not exist within the sensing range of the sensing coil 10. If the signal processing circuit 5 outputs the digital sensing signal and distance signal, the sensing distance can be shown, and the existence/absence of an object can be shown as well.

The operation of the fifteenth embodiment will now be described. When the proximity sensor starts up, the oscillating voltage is generated across the LC resonant circuit. The oscillation control circuit 2 supplies the feedback current ($I_{fb}$) to the LC resonant circuit 1, whereby oscillation of the LC resonant circuit 1 is maintained.

The amplitude measurement circuit 3 measures the amplitude ($V_T$) of the oscillating voltage. The control circuit 4 generates a digital code based on the amplitude ($V_T$) from the amplitude measurement circuit 3, so that the negative conductance ($G_{osc}$) of the oscillation control circuit 2 becomes the above mentioned critical value, and supplies this digital code to the current control circuit 23A and signal processing circuit 5. Thereby the magnitude of the current ($I_O$), that is, the feedback current ($I_{fb}$), is adjusted using this digital code, and the distance signal is generated based on this digital code.

If the object approaches the sensing coil 10 and the eddy current loss in the sensing coil 10 increases, the absolute value of the conductance ($G_{coil}$) of the sensing coil 10 becomes greater than the absolute value of the negative conductance ($G_{osc}$). Because of this, the above mentioned oscillation conditions are no longer satisfied, and the LC resonant circuit 1 begins to stop oscillation, and the amplitude ($V_T$) decreases. If the amplitude ($V_T$) detected by the amplitude measurement circuit 3 is no longer within the above mentioned predetermined range, the control circuit 4 adjusts the current ($I_O$) so that the amplitude ($V_T$) becomes a value within the predetermined range. In other words, the negative conductance ($G_{osc}$) is adjusted. The control circuit 4 sets the digital code to increase the current ($I_O$), so that the absolute value of the negative conductance ($G_{osc}$) is increased. The signal processing circuit 5 generates and outputs the distance signal based on the digital code from the control circuit 4.

If the object moves away from the sensing coil 10 and the eddy current loss in the sensing coil 10 decreases, the absolute value of the conductance ($G_{coil}$) of the sensing coil 10 becomes smaller than the absolute value of the negative conductance ($G_{osc}$) and the amplitude ($V_T$) increases. If the amplitude ($V_T$) detected by the amplitude measurement circuit 3 is no longer within the above mentioned predetermined range, the control circuit 4 adjusts the current ($I_O$) so that the amplitude ($V_T$) becomes a value within the predetermined range. In other words, the control circuit 4 sets the digital code to decrease the current ($I_O$), so that the absolute value of the negative conductance ($G_{osc}$) decreases. The signal processing circuit 5 generates and outputs a distance signal based on the digital code that was set by the control circuit 4.

Since the signal processing circuit 5 outputs a distance signal corresponding to the digital code from the control circuit 4, the distance (positional relationship) of the object and the sensing coil 10 can be detected using the distance signal.

In other words, the current control circuit 23A that functions as a D/A converter supplies current ($I_O$) corresponding to the digital code from the control circuit 4, that is the feedback current ($I_{fb}$), to the LC resonant circuit 1. The feedback current ($I_{fb}$) is directly proportional to the current ($I_O$), and according to the fifteenth embodiment, the feedback current ($I_{fb}$) is equal to the current ($I_O$). The control circuit 4 generates a digital code so that the negative conductance ($G_{osc}$) of the oscillation control circuit 2 becomes the critical value, and supplies a digital signal, including this digital code, to the current control current 23A. The signal processing circuit 5 generates a distance signal based on the digital code of the digital signal sent from the control circuit 4.

An oscillation condition of the LC resonant circuit 1 is that the absolute value of the negative conductance ($G_{osc}$) of the oscillation control circuit 2 is the absolute value of the conductance ($G_{osc}$) of the sensing coil 10 or more. Therefore if the negative conductance ($G_{osc}$) is the critical value by which the LC resonant circuit 1 can oscillate, it can be regarded that the absolute value of the negative conductance ($G_{osc}$) is equal to the absolute value of the conductance ($G_{coil}$) of the sensing coil 10. Here the conductance ($G_{coil}$) changes according to the change of the eddy current loss due to the distance between an object and the sensing coil 10 (that is, change according to the distance between the object and the sensing coil 10). The negative conductance ($G_{osc}$) that is equal to the conductance ($G_{coil}$) is determined by the feedback current ($I_{fb}$) supplied to the LC resonant circuit 1 and the amplitude ($V_T$) of the oscillating voltage generated across the LC resonant circuit 1.

According to the fifteenth embodiment, the feedback current ($I_{fb}$) is directly proportional to the current ($I_O$), so the distance between the object and the sensing coil 10 can be determined based on the digital code to the current control circuit 23A. Therefore by using the digital code, not only can the existence of an object be detected, but the analog distance signal, to show the distance between the object and the sensing coil 10, can also be obtained. The digital sensing signal, to show the existence/absence of an object, can also be obtained by comparing the distance signal with a threshold.

Therefore according to the fifteenth embodiment, not only can the existence of an object be detected, but a distance signal, to show the distance between the object and the sensing coil 10, can also be obtained. Since a digital code is used, digital signals, used for various communications and PWM, can be easily obtained. In other words, compatibility of digital signals improves. Since a circuit that handles digital signals can be easily downsized using micro patterns, the cost to mount a control circuit and oscillation control circuit on an IC can be decreased. The influence of dispersion of an IC on sensor characteristics can also be suppressed.

The signal processing circuit 5 acquires a digital code from the control circuit 4 and generates a distance signal using this digital code. This means that a circuit for detecting the magnitude of the feedback current ($I_{fb}$) is unnecessary, unlike the configuration to use the feedback current ($I_{fb}$) to detect the magnitude of the negative conductance ($G_{osc}$). Hence the current configuration can be simplified, and downsizing and a decrease of manufacturing cost can be expected.

The oscillation control circuit 2 supplies the electric current ($I_O$) of the current control circuit 23A, that is, the feedback current ($I_{fb}$), to the LC resonant circuit 1. The current control circuit 23A has the current mirror circuit 230, a plurality of switches (SW), and switching control circuit 231, so the circuit scale can be downsized and cost can be decreased compared with the configuration to separate the current mirror circuit and the D/A converter.

The switch (SW) is inserted between the output transistor (OTr) and the internal power supply (Vcc), so if the switch (SW) is turned OFF to decrease the electric current ($I_O$), the mirror current (Im) does not flow into the output transistor (OTr). Hence power consumption can be decreased. According to an example, the switch (SW) may be inserted between the base of the output transistor (OTr) and the base of the input transistor (ITr). In this example, if the switch (SW) is turned OFF to decrease the electric current ($I_O$), the mirror current (Im) does not flow into the output transistor (OTr). Therefore the power consumption can be decreased. In other words, the switch (SW) can be inserted between the output transistor (OTr) and the input transistor (ITr), or between the output transistor (OTr) and the internal power supply (Vcc).

According to the fifteenth embodiment, the oscillation control circuit 2, amplitude measurement circuit 3, control circuit 4 and signal processing circuit 5 are mounted on a monolithic IC. Therefore compared with a configuration to mount the oscillation control circuit 2, amplitude measurement circuit 3, control circuit 4 and signal processing circuit 5 on separate ICs, downsizing and the a decrease of cost are expected, and noise resistance performance can be improved.

According to an example, the respective numbers of output transistors (OTr) and switches (SW) are not limited to "4", but may be 8, 16, 32 or 2 or 3, in other words, at least 2. As the number of output transistors (OTr) and switches (SW) become higher, the variability region of the current ($I_O$) and the width of the change can be finely set, so the resolution of the distance (positional accuracy) of the object and the sensing coil 10 can be improved. This example can also be applied to the later mentioned sixteenth to twentieth embodiments.

According to an example, the value to show the oscillation voltage is not limited to the peak value of the oscillation voltage in FIG. 15, but may be an integral value of the oscillating voltage or an effective value of the oscillating voltage. In the case of this configuration to detect only the AC components and control of the AC components to be constant, the influence of bias current and DC resistance components of the sensing coil 10 (that is, the influence of temperature characteristics) can be eliminated.

According to an example, the LC resonant circuit 1 is not limited to a configuration of the LC resonant circuit 1 that always oscillates and stops oscillation when an object approaches, but may be a configuration for the LC resonant circuit 1 that always stops oscillation and starts oscillation when an object approaches.

The conductance ($G_{coil}$) of the sensing coil 10 according to the fifteenth embodiment changes not only by the distance between the object and the sensing coil 10, but also by the oscillation frequency of the LC resonant circuit 1. In other words, if the capacity of the capacitor 11 changes, the conductance ($G_{coil}$) of the sensing coil 10 changes. Hence the proximity sensor of the fifteenth embodiment can be used as an electrostatic capacitance sensor, and the digital code can be used as sensor output.

According to an example, each of the transistors (Q1), (Q2), (ITr) and (OTr) is not limited to a bipolar transistor, but may be a MOSFET. This example can also be applied to the later mentioned sixteenth to twentieth embodiments.

(Sixteenth Embodiment)

Figure 16:
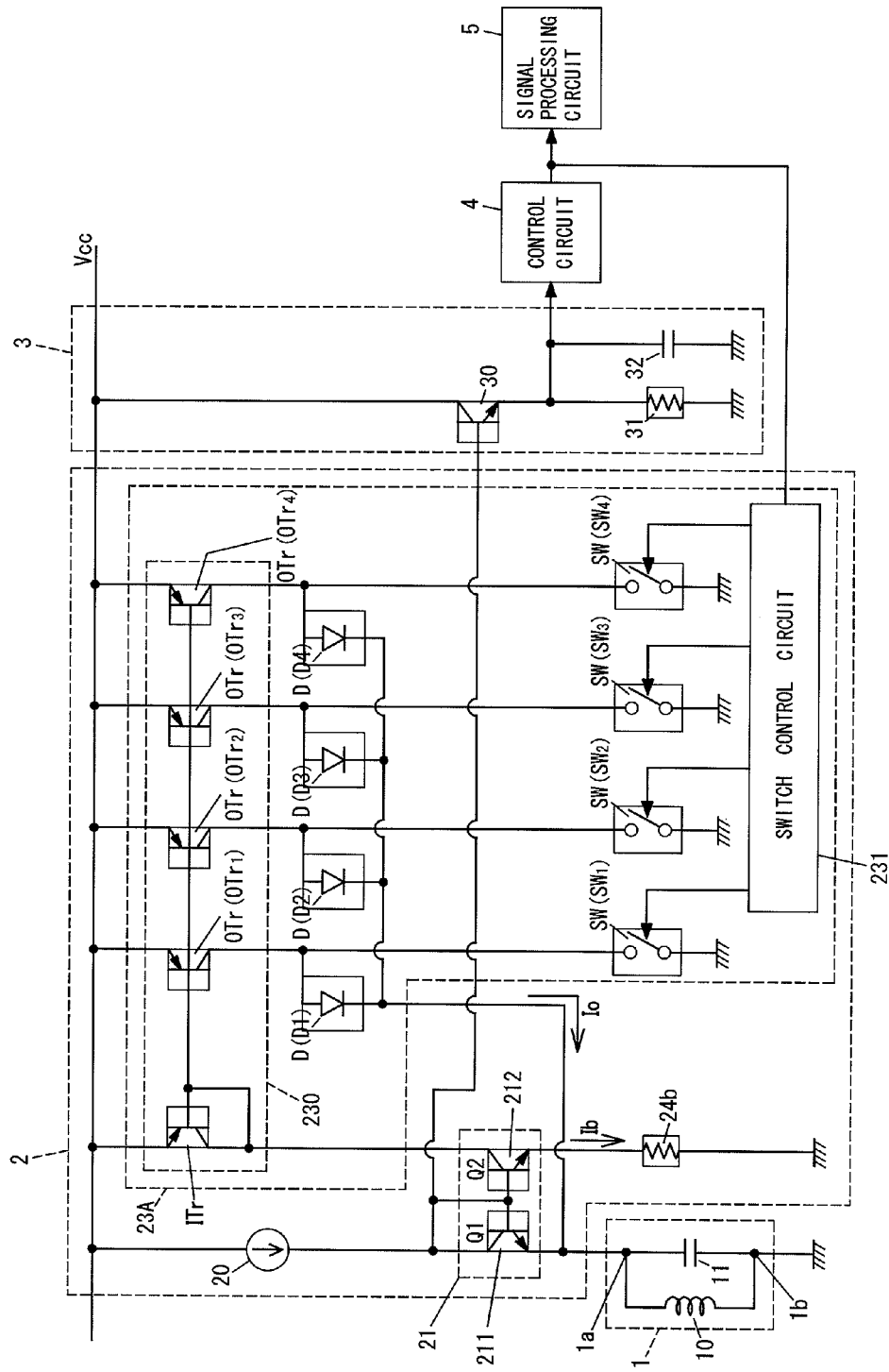
FIG. 16 is a schematic diagram of a proximity sensor according to a sixteenth embodiment of the present invention.

FIG. 16 shows a proximity sensor according to a sixteenth embodiment of the present invention. The proximity sensor according to the sixteenth embodiment is characterized by a current control circuit 23A of the oscillation control circuit 2, and the other composing elements are configured in the same way as the fifteenth embodiment. Similar composing elements are denoted with a same reference symbol used for the fifteenth embodiment.

According to the sixteenth embodiment, the current control circuit 23A further has a plurality of diodes ($D_1$) to ($D_4$) for blocking reverse current.

The diodes ($D_1$) to ($D_4$) are inserted between collectors of the output transistors ($OTr_1$) to ($OTr_4$) and the first terminal 1a of the LC resonant circuit 1 respectively. The cathode and anode of each diode (D) are connected with the first terminal 1a of the LC resonant circuit 1 and the collector of the corresponding output transistor (OTr) respectively. The plurality of switches ($SW_1$) to ($SW_4$) are connected between the connectors of the output transistors ($OTr_1$) to ($OTr_4$) and the ground respectively.

If the switch (SW) is ON, the collector of the output transistor (OTr) is connected with the reference potential (ground), and the mirror current (Im) flows into the reference potential. If the switch (SW) is OFF, the collector of the output transistor (OTr) and the reference potential are disconnected, and the mirror current (Im) flows into the LC resonant circuit 1 via the diode (D).

In other words, the current control circuit 23A according to the sixteenth embodiment has a supply line (electric wire passing through the diode (D)) for supplying the mirror current (Im) to the LC resonant circuit 1, and has a switch (SW) for creating a separation line (electric wire passing through the switch (SW)) for drawing the mirror current (Im), that is supplied to the LC resonant circuit 1, from the supply line. If the corresponding switch (SW) is ON, the mirror current (Im) flows through the separation line, and if the switch (SW) is OFF, the mirror current (Im) flows through the corresponding supply line.

According to the sixteenth embodiment, the electric current ($I_O$) is adjusted by switching the supply line and separation line, so the mirror current (Im) flows through each output transistor (OTr) regardless whether each switch (SW) is ON or OFF. Because of this, an electric current fluctuation is not generated in each output transistor (OTr) in response to the ON or OFF of each switch (SW). Therefore fluctuation of the reference current of the input transistor (ITr), due to the electric current fluctuation that is generated in each output transistor (OTr), can be prevented, and stable operation is implemented.

(Seventeenth Embodiment)

A proximity sensor according to a seventeenth embodiment of the present invention is characterized by a current control circuit 23A of an oscillation control circuit 2, and the other composing elements are configured in the same way as the fifteenth embodiment. Similar composing elements are denoted with a same reference symbol used for the fifteenth embodiment. The current mirror circuit 230 of the seventeenth embodiment can also be applied to the sixteenth embodiment.

The emitter sizes of the output transistors ($OTr_1$) to ($OTr_4$) of the current mirror circuit 230 according to the seventeenth embodiment are different from one another. In concrete terms, the emitter size of the output transistor ($OTr_1$) is the same as that of the input transistor (ITr). The emitter sizes of the output transistors ($OTr_2$), ($Tr_3$) and ($Tr_4$) are double, four times and eight times that of the input transistor (ITr) respectively.

Therefore the mirror current ($Im_1$) is equal to the reference current, that is, the amplification current Ib. The mirror current ($Im_2$), ($Im_3$) and ($Im_4$) are 2×Ib, 4×Ib and 8×Ib respectively.

In other words, the mirror ratio ($M_n$) is not always "1", but $M_n=2^{n-1}$, where n denotes an ordinal number of each bit of the digital code.

The switch ($SW_1$) corresponding to the first bit (least significant bit) of the digital code determines whether or not the mirror current ($Im_1$) is supplied to the LC resonant circuit 1. The switch ($SW_2$) corresponding to the second bit determines whether or not the mirror current ($Im_2$) is supplied to the LC resonant circuit 1. If the mirror current ($Im_1$) is reference mirror current, the ratio of the mirror current ($Im_2$) to the reference mirror current ($Im_1$), that is ($Im_2/Im_1$), is $2^{2-1}$ since the ordinal number of the second bit corresponding to the switch ($SW_2$) is "2", in other words, this ratio is "2". In the same manner, the ratio of the mirror current ($Im_3$) to the reference mirror current ($Im_4/Im_1$), that is ($Im_3/Im_4/Im_1$), is $2^{3-1}$, in other words, this ratio is "4", and the ratio of the mirror current ($Im_4$) to the reference mirror current ($Im_1$), that is ($Im_4/Im_1$), is $2^{4-1}$, in other words, this ratio is "8".

For example, if the digital code is "0001", the electric code ($I_O$) is 1×Ib. If the digital code is "0101", the electric current ($I_O$) is 4×Ib+1×Ib, that is 5×Ib. If the digital code is a straight binary code, a decimal value shown by the digital code is equal to the multiplying factor (=$I_O$/Ib) of the electric current ($I_O$). Hence if the digital code is 4 bits, the electric current ($I_O$) can be selected out of 16 types of values (including "0").

According to the seventeenth embodiment, the types of values of the electric current ($I_O$) can be increased, compared with the fifteenth embodiment (configuration in which the emitter sizes, that is the magnitudes of the mirror current (Im), are the same for all the output transistors (OTr)), if the number of output transistors (OTr) is the same. Therefore the electric current ($I_O$) can be set precisely, and the resolution of the distance (positional accuracy) between an object and the sensing coil 10 can be improved.

In particular, the ratio of each mirror current ($Im_2$) to ($Im_4$) to the reference mirror current ($Im_1$), is $2^{n-1}$, so the electric current ($I_O$) can be set using a binary digital code, such as a straight binary code. A number of switches ($SW_n$) can be decreased, and the resolution of the distance (positional accuracy) between an object and the sensing coil 10 can be improved.

According to an example, at least one of the plurality of output transistors (OTr) is different in transistor size (or emitter size) from others. According to this example, resolution can be improved compared with a configuration in which the transistor sizes of all the output transistors are the same.

(Eighteenth Embodiment)

Figure 17:
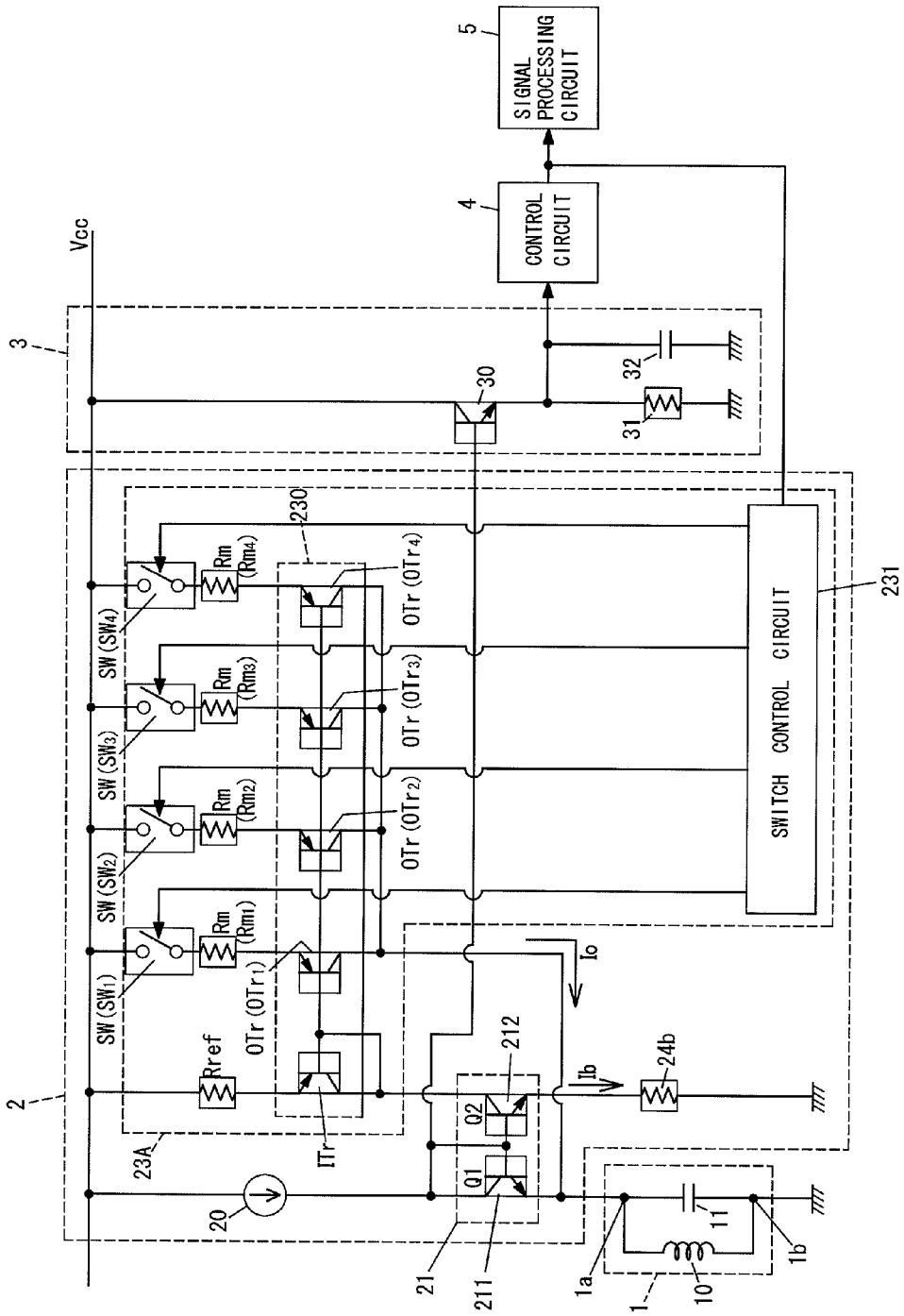
FIG. 17 is a schematic diagram of a proximity sensor according to an eighteenth embodiment of the present invention.

FIG. 17 shows a proximity sensor according to an eighteenth embodiment of the present invention. The proximity sensor according to the eighteenth embodiment is characterized by a current control circuit 23A of an oscillation control circuit 2, and the other composing elements are configured in the same way as the fifteenth embodiment. Similar composing elements are denoted with a same reference symbol used for the fifteenth embodiment.

According to the eighteenth embodiment, the current control circuit 23A further has a resistance circuit (Rref) and resistance circuits ($Rm_1$) and ($Rm_2$). The resistance circuit (Rref) is an emitter resistor for reference, and is inserted between the emitter of the input transistor (ITr) and the reference potential Vcc. The resistance circuits ($Rm_1$) and ($Rm_2$) are emitter resistors for limiting the mirror current (for setting a mirror ratio), and are inserted between the emitters of the output transistors ($OTr_1$) to ($OTr_4$) and the switches ($SW_1$) to ($SW_4$) respectively. The emitter sizes of the input transistor (ITr) and the plurality of output transistors (OTr) are all the same, just like the fifteenth embodiment.

The resistance values of the plurality of resistance circuits (Rm) are all different. In concrete terms, the resistance value of the resistance circuit ($Rm_4$) is the same as that of the resistor circuit (Rref). The resistance values of the resistance circuits ($Rm_1$), ($Rm_2$) and ($Rm_3$) are 8 times, 4 times and 2 times that of the resistance circuit ($Rm_4$) respectively, that is, $Rref:Rm_1:Rm_2:Rm_3:Rm_4=8:1:2:4:8$.

Therefore the mirror current ($Im_4$) is equal to the reference current, that is, the amplification current (Ib). The mirror currents ($Im_1$), ($Im_2$) and ($Im_3$) are $Im_4/8$, $Im_4/4$ and $Im_4/2$ respectively. Because of this, the mirror ratio $M_n$ of the current mirror circuit 230 is not always "1", but $M_n=2^{n-t}$, where t denotes a total number of bits of digital code. If the mirror current ($Im_1$) is a reference mirror current, the ratio of the mirror current ($Im_2$), corresponding to the switch ($SW_2$), with respect to the reference mirror current ($Im_1$), is 2 (=$2^1$). In the same manner, the ratio of the mirror current ($Im_3$), corresponding to the switch ($SW_3$), with respect to the reference mirror current ($Im_1$), is 4 (=$2^2$), and the ratio of the mirror current ($Im_4$), corresponding to the switch ($SW_4$), with respect to the reference mirror current ($Im_1$), is 8 (=$2^3$). Here the exponent of the ratio corresponding to the switch ($SW_n$) (n=2 to 4) is equal to a bit number (ordinal number of bit −1) of the bit corresponding to the switch ($SW_n$). For example, if the digital code is "0001", the electric current ($I_O$) is 1×$Im_1$. If the digital code is "0101", the electric current ($I_O$) is 5×$Im_1$. Hence if the digital code is 4 bits, the electric current ($I_O$) can be selected from 16 types of values (include "0").

According to the eighteenth embodiment, the types of values of the electric current ($I_O$) can be increased compared with the fifteenth embodiment (configuration in which mirror currents (Im), that is, the resistance values of the resistance circuits (Rm) are all the same), if a number of output transistors (OTr) is the same. Therefore the electric current ($I_O$) can be set precisely, and resolution of the distance (positional accuracy) between an object and the sensing coil 10 can be improved.

In particular, the ratio of the mirror current ($Im_n$) to the reference mirror current ($Im_1$) is $2^{n-1}$, so the electric current ($I_O$) can be set using a binary digital code, such as a straight binary code. The number of switches (SW) can be decreased, and the resolution of the distance (positional accuracy) between an object and the sensing coil 10 can be improved.

According to an example, at least one of the plurality of resistance circuits (Rm) has a different resistance value from the others. According to this example, resolution can be improved compared with a configuration in which the resistance value is the same for all the resistance circuits (Rm).

(Nineteenth Embodiment)

Figure 18:
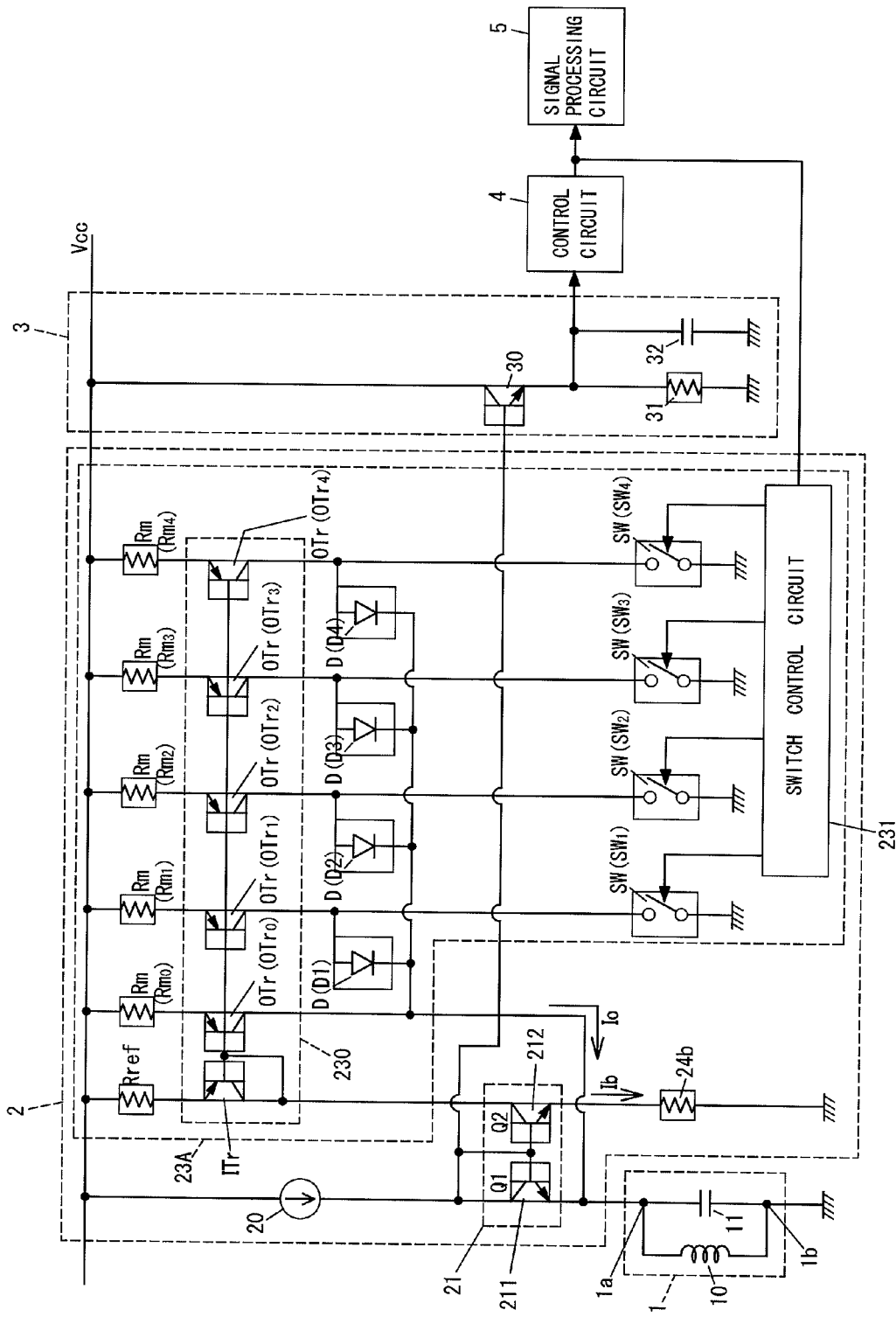
FIG. 18 is a schematic diagram of a proximity sensor according to a nineteenth embodiment of the present invention.

FIG. 18 shows a proximity sensor according to a nineteenth embodiment of the present invention. The proximity sensor according to the nineteenth embodiment is characterized by a current control circuit 23A of an oscillation control circuit 2, and the other composing elements are configured in the same way as the eighteenth embodiment. Similar composing elements are denoted with a same reference symbol used for the eighteenth embodiment.

The current control circuit 23A according to the nineteenth embodiment further has an output transistor ($OTr_0$) for offset, resistance circuit ($Rm_0$) and diodes ($D_1$) to ($D_4$), and the switches ($SW_1$) to ($SW_4$) are connected between the output transistors ($OTr_1$) to ($OTr_4$) and the ground respectively. The emitter of the output transistor ($OTr_0$) is connected with the internal power supply (Vcc) via the resistance circuit ($Rm_0$). The base and collector of the output transistor ($OTr_0$) are connected with the base of the input transistor (ITr) and the first terminal 1a of the LC resonant circuit respectively. The diodes ($D_1$) to ($D_4$) are inserted between the collectors of the output transistors ($OTr_1$) to ($OTr_4$) and the first terminal 1a of the LC resonant circuit respectively. The emitter sizes of the input transistor (ITr) and the plurality of output transistors (OTr) are all the same. The output transistor ($OTr_0$) can also be disposed in the fifteenth to seventeenth embodiments.

In other words, the current control circuit 23A has a supply line for supplying the mirror current ($Im_1$) to ($Im_4$) to the LC resonant circuit 1, and has switches ($SW_1$) to ($SW_4$) for creating a separation line for separating the mirror current ($Im_1$) to ($Im_4$), that is supplied to the LC resonant circuit 1, from the supply line. The current control circuit 23A constantly supplies the mirror current ($Im_0$) from the output transistor ($OTr_0$) to the LC resonant circuit 1, regardless the digital code.

The resistance values of the resistance circuits (Rm) are all different, and the resistance value of the resistance circuit ($Rm_4$) is the same as the resistance value of the resistance circuit (Rref), that is $Im_4$=Ib. The resistance values of the resistance circuits ($Rm_0$), ($Rm_1$), ($Rm_2$) and ($Rm_3$) are ¼, 8 times, 4 times and 2 times the resistance value of the resistance circuit ($Rm_4$) respectively, that is Rref:$Rm_0$:$Rm_1$:$Rm_2$:$Rm_3$:$Rm_4$=8:32:1:2:4:8. Therefore the mirror currents ($Im_0$), ($Im_1$), ($Im_2$) and ($Im_3$) are 4×$Im_4$, $Im_4$/8, $Im_4$/4 and $Im_4$/2 respectively. If the mirror current ($Im_1$) is a reference mirror current, the ratio of the mirror current ($Im_2$) to ($Im_4$) to the reference mirror current ($Im_1$) is $2^{n-1}$, where n is an ordinal number of each bit of the digital code. Therefore if the digital code is "0001", then the electric current ($I_O$) is $Im_0$+$Im_1$. If the digital code is "0101", then the electric current ($I_O$) is $Im_0$+ 5×$Im_1$. Hence if the digital code is 4 bits, the electric current ($I_O$) can be selected out of 16 types of values (including "0").

According to the nineteenth embodiment, the current control circuit 23A has an output transistor ($OTr_0$), so the offset of the electric current ($I_O$) can be set and resolution of the distance (positional accuracy) between an object and the sensing coil 10 can be improved.

For example, when the conductance ($G_{coil}$) of the sensing coil 10 changes in a range of 400 μs to 600 μs, a 400 μs offset can be set for the negative conductance $|G_{osc}|$, and the change width of the negative conductance $|G_{osc}|$ can be set to 0 to 200 μs. Compared with the configuration to set the change width of the negative conductance $|G_{osc}|$ to 0 to 600 μs, the resolution of the distance (positional accuracy) between an object and the sensing coil 10 can be improved about 3 times without increasing the number of bits in the digital code.

(Twentieth Embodiment)

Figure 19:
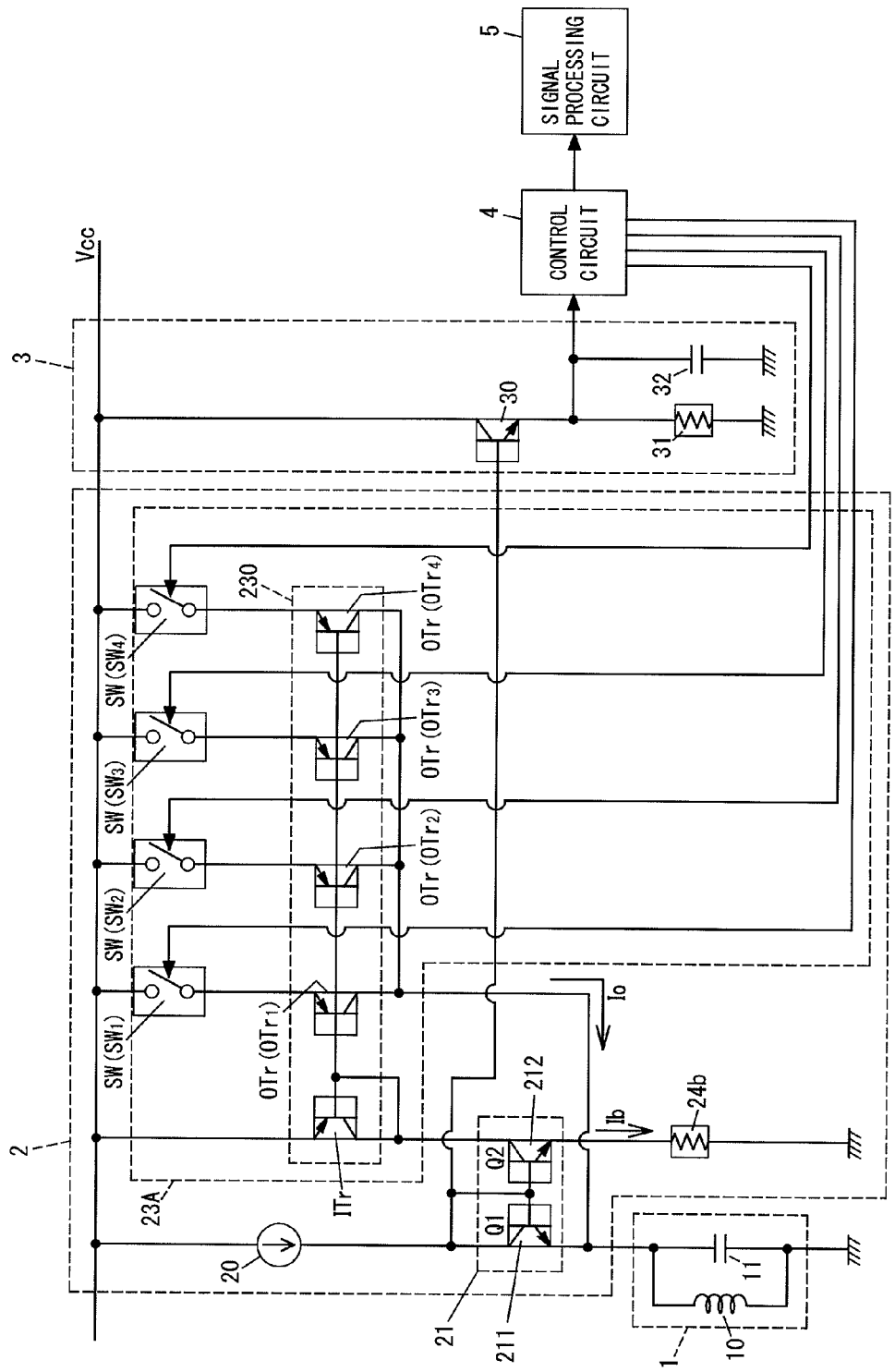
FIG. 19 is a schematic diagram of a proximity sensor according to a twentieth embodiment of the present invention.

FIG. 19 shows a proximity sensor according to a twentieth embodiment of the present invention. The proximity sensor according to the twentieth embodiment is characterized by a current control circuit 23A of an oscillation control circuit 2 and a control circuit 4, and the other composing elements are configured in the same way as the fifteenth embodiment. Similar composing elements are denoted with a same reference symbol used for the fifteenth embodiment. The twentieth embodiment can also be applied to the sixteenth to eighteenth embodiments.

According to the twentieth embodiment, the current control circuit 23A does not have the switch control circuit 231, but the control circuit 4 includes the function of the switch control circuit 231.

The control circuit 4 according to the twentieth embodiment includes a CPU and a microcomputer having memory, and a data register (accumulator) for writing a digital code that is disposed in a storage area of the memory of the microcomputer. The total number of bits of the data register is the same as the total number of bits of the digital code, and the Nth bit in the digital code corresponds to the Nth bit in the data register, where N is "0" or greater integer. The digital code is set based on the amplitude from the amplitude measurement circuit 3, just like the fifteenth embodiment.

The control circuit 4 includes a plurality of control signal output units (not illustrated) configured to supply control signals to the plurality of switches (SW) respectively. The plurality of control signal output units are related to the bits of the data register one to one. In other words, the plurality of switches (SW) are related to the bits of the data register respectively one to one. In concrete terms, the switch ($SW_1$) is related to the least significant bit (first bit) of the data register, and the ordinal number of the first bit shows a position number in the data register (digital code), and the bit number is the ordinal number −1, that is "0". The switch ($SW_2$) is related to the second bit of the data register. The switch ($SW_3$) is related to the third bit of the data register. The switch ($SW_4$) is related to the most significant bit (fourth bit) of the data register.

Each control signal output unit supplies the control signal corresponding to its own related bit value in the data register to the corresponding switch (SW). For example, if the bit value of the data register is "1", the control signal output unit supplies a control signal to a switch (SW) to turn the switch (SW) ON. If the bit value of the data register is "0", the control signal output unit supplies a control signal to a switch (SW) to turn the switch (SW) OFF. For example, if the digital code is "1010", the data register is also "1010". Each control signal output unit related to the second bit and the fourth bit supplies the ON control signal to the corresponding switch (SW), and each control signal output unit related to the first bit and the third bit supplies the OFF control signal to the corresponding switch (SW). As a result, the switches (SW$_2$) and (SW$_4$) are turned ON, and the switches (SW$_1$) and (SW$_3$) are turned OFF. According to the twentieth embodiment, the control circuit 4 supplies the control signal to each of the switches (SW), and supplies the digital signal, including the digital code, to the signal processing circuit 5.

In the twentieth embodiment, the switch control circuit 231 is unnecessary, and the value of the negative conductance of the oscillation control circuit 2 can be changed directly by the bit value of the data register. Therefore the hardware can be simplified, and cost can be decreased.

(Twenty First Embodiment)

Figure 20:
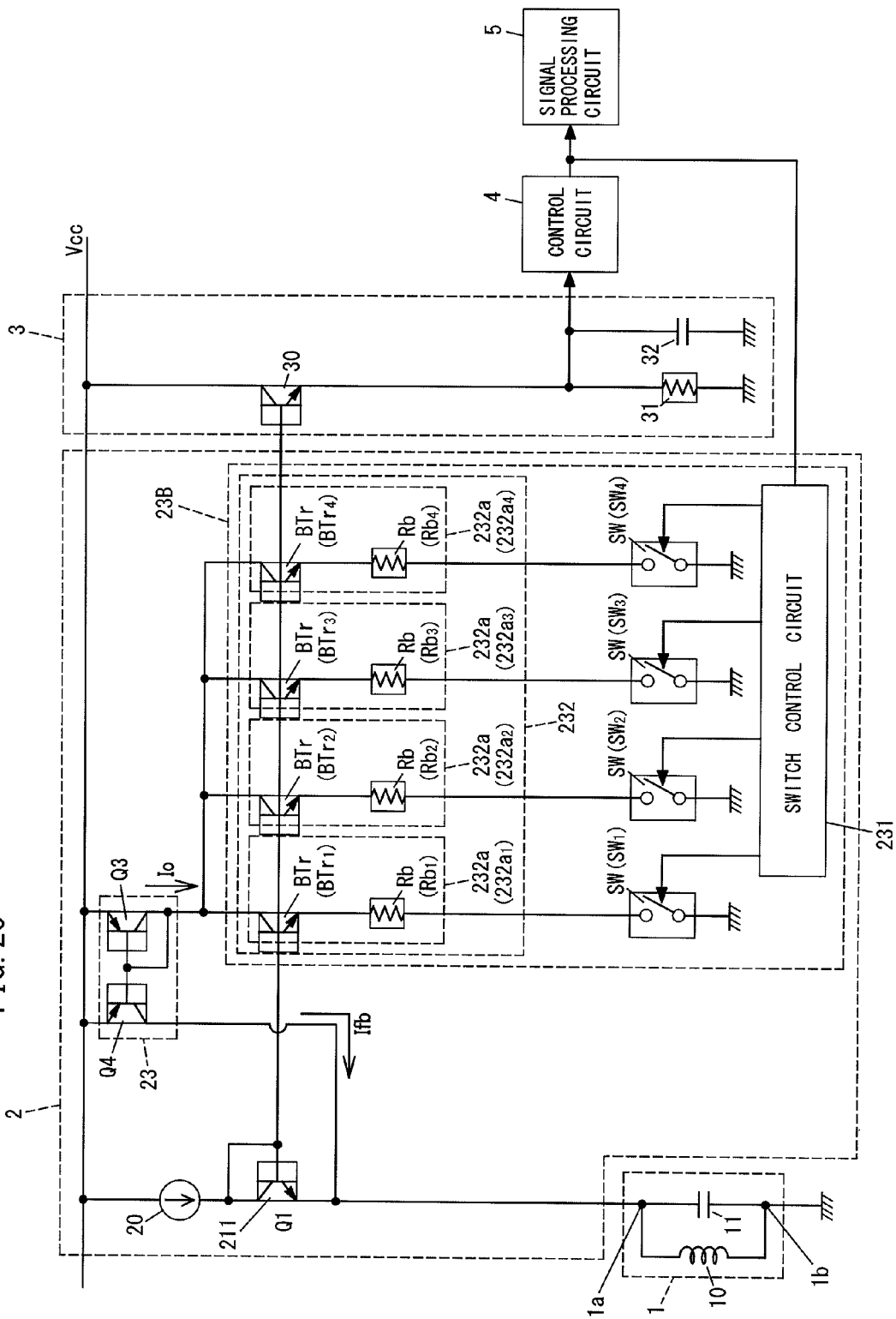
FIG. 20 is a schematic diagram of a proximity sensor according to a twenty first embodiment of the present invention.

FIG. 20 shows a proximity sensor according to a twenty first embodiment of the present invention. The proximity sensor according to the twenty first embodiment is characterized by an oscillation control circuit 2 (feedback circuit 23 and current control circuit 23B), and the other composing elements are configured in the same way as the fifteenth embodiment. Similar composing elements are denoted with a same reference symbol used for the fifteenth embodiment.

The oscillation control circuit 2 according to the twenty first embodiment includes a feedback circuit 23, that is configured in the same way as the first embodiment, instead of the current control circuit 23A of the fifteenth embodiment, and includes the current control circuit 23B, instead of the emitter-follower circuit 212 and the resistor 24b of the fifteenth embodiment.

The feedback circuit 23 is configured to generate a feedback current in response to a current generated in the current generation circuit, which includes the level shift circuit 211 and current control circuit 23B, and supply this feedback current to the first terminal 1a of the LC resonant circuit 1 as positive feedback. The feedback circuit 23 includes PNP transistors (Q3) and (Q4) constituting a current mirror circuit, just like the first embodiment. When an electric current (I$_O$), that is a reference current, flows from the current control circuit 23B into the transistor (input transistor) (Q3), the transistor (output transistor) (Q4) supplies the mirror current (Im) having a magnitude proportional to the reference current, that is the feedback current (I$_{fb}$), to the LC resonant circuit 1. The transistors (Q3) and (Q4) have a same emitter size. Therefore the mirror current (Im) is equal to the electric current (I$_O$) since the mirror ratio of the current mirror circuit is "1".

The current control circuit 23B includes an amplifying circuit 232, a plurality of switches (SW) and switch control circuit 231. The amplifying circuit 232 has a plurality of emitter-follower circuits 232a. According to the twenty first embodiment, the amplifying circuit 232 has the emitter-follower circuits 232a$_1$ to 232a$_4$, even if the invention is not limited to this. According to an example, each emitter-follower circuit 232a can be replaced with a source-follower circuit that includes a MOSFET having a gate (control electrode), drain (controlled electrode) and source (controlled electrode).

Each emitter-follower circuit 232a is configured to supply an electric current (Ib) corresponding to the oscillating voltage generated across the LC resonant circuit 1 to the input transistor (Q3). For example, each emitter-follower circuit 232a has an NPN transistor (BTr), and a resistance circuit (Rb) for setting the emitter potential (for limiting amplification current). Each collector of the transistors (BTr$_1$) to (BTr$_4$) is connected with the collector of the input transistor (Q3). Each base of the transistors (BTr$_1$) to (BTr$_4$) is connected with the base of the transistor (Q1) of the level shift circuit 211. The emitters of the transistors (BTr$_1$) to (BTr$_4$) are connected with one terminal of the switches (SW$_1$) to (SW$_4$), via the resistance circuits (Rb$_1$) to (Rb$_4$) respectively. The other terminals of the switches (SW$_1$) to (SW$_4$) are connected with the ground. According to the twenty first embodiment, the transistors (BTr) are all identical, and the resistance circuits (Rb) are also all identical.

In the amplifying circuit 232, the level shift voltage from the level shift circuit 211 is applied to the base of each transistor (BTr). The level shift voltage is generated by applying the base-emitter voltage of the transistor (Q1) to the oscillating voltage, and the base-emitter voltage is equal to that of each transistor (BTr). Therefore a voltage equal to the oscillating voltage generated across the LC resonant circuit 1 is applied between the emitter of the transistor (BTr) and the ground during each positive period (half cycle) of the oscillating voltage. Hence the emitter-follower circuits 232a$_1$ to 232a$_4$ supply the electric currents (Ib$_1$) to (Ib$_4$) corresponding to the oscillating voltage generated across the LC resonant circuit 1 to the input transistor (Q3) respectively. The electric currents (Ib$_1$) to (Ib$_4$) are all the same.

Each switch (SW) is a semiconductor switching device, for example, and connects or disconnects the corresponding resistance circuit (Rb) and the ground (reference potential) by being turned ON or OFF. This means that if the switch (SW) is OFF, the corresponding transistor (BTr) does not supply the electric current (Ib) to the input transistor (Q3). In other words, the ON or OFF state of each switch (SW) determines whether or not the corresponding current (Ib) is supplied to the input transistor (Q3).

The switch control circuit 231 is configured to control each switch (SW) according to the digital code from the control circuit 4. The switch control circuit 231 includes a microcomputer or logic circuit to execute a predetermined program, for example. This digital code is 4-bit straight binary code, for example, and each switch (SW) is related to each bit in the digital code one to one. For example, the least significant bit (LSB) to the most significant bit (MSB) in the digital code correspond to the switch (SW$_1$) to switch (SW$_4$) one to one respectively. If a bit value in the digital code is "0", the switch control circuit 231 turns the switch (SW) corresponding to this bit OFF, and if "1", the switch control circuit 231 turns this switch (SW) ON.

If the digital code is "1010", for example, the switch control circuit 231 turns the switches (SW$_2$) and (SW$_4$) ON, and turns the switches (SW$_1$) and (SW$_3$) OFF. As a result, the electric currents (Ib$_2$) and (Ib$_4$) are supplied to the input transistor (Q3). This means that the electric current (I$_O$) obtained by adding the electric currents (Ib$_2$) and (Ib$_4$) is supplied to the transistor (Q3).

Therefore the electric current (I$_O$) is given by $$I_O = \Sigma \delta_n \cdot Ib_n \qquad \text{[Expression 17]}$$

where $\delta_n$ denotes a function to show ON ($\delta_n=1$) or OFF ($\delta_n=0$) of the switch (SW$_n$).

According to the twenty first embodiment, the electric currents (Ib$_1$) to (Ib$_4$) are all the same, so the electric current (I$_O$) is determined by a number of switches (SW) that are ON. Therefore the electric current (I$_O$) can be one of five values: 0, Ib, 2Ib, 3Ib and 4Ib.

In other words, the current control circuit 23B functions as a D/A converter that supplies the electric current (I$_O$) corresponding to the digital code from the control circuit 4 to the transistor (Q3). The feedback circuit 23 generates a feedback current (I$_{fb}$), that is equal to the electric current (I$_O$), in response to the electric current (I$_O$), and supplies the feedback current (I$_{fb}$) to the LC resonant circuit 1.

Since a voltage equal to the oscillating voltage generated across the LC resonant circuit 1 is applied between the emitter of each transistor (BTr) and the ground during each positive period of the oscillating voltage, the electric current ($Ib_n$) is given by $$Ib_n = V_T/(2R_n) \qquad \text{[Expression 18]}$$

where $V_T$ denotes an amplitude of the oscillating voltage, and $R_n$ denotes a resistance value of the resistance circuit ($Rb_n$).

Therefore the negative conductance ($G_{osc}$) of the oscillation control circuit 2 is given by $$|G_{osc}| = \Sigma(\delta_n/(2R_n)) \qquad \text{[Expression 19]}$$

based on Expression 1, 17 and 18. Hence the negative conductance ($G_{osc}$) can be adjusted by the digital code.

An oscillation condition of the LC resonant circuit 1 is that the negative conductance ($G_{osc}$) and the conductance ($G_{coil}$) of the sensing coil 10 satisfy the relationship $G_{coil} \leq |G_{osc}|$, and a critical value by which the LC resonant circuit 1 can oscillate is $-G_{coil}$.

When the negative conductance ($G_{osc}$) is this critical value, the conductance ($G_{coil}$) is given by $$G_{coil} = \Sigma(\delta_n/(2R_n)) \qquad \text{[Expression 20]}$$

Hence according to the twenty first embodiment, the distance between the sensing coil 10 and an object can be measured using the digital code which was set by the control circuit 4.

According to the twenty first embodiment, not only can the existence of an object be detected, but also the distance between the object and the sensing coil 10 can be shown. Since the digital code is used, digital signals used for various communications and PWM can be easily obtained. In other words, compatibility of digital signals improves. Since a circuit that handles digital signals can be easily downsized using micro-patterns, the cost to mount a control circuit and oscillation control circuit on an IC can be decreased. The influence of dispersion of an IC on sensor characteristics can also be suppressed.

The signal processing circuit 5 acquires a digital code from the control circuit 4 and generates a distance signal using this digital code. This means that a circuit for detecting the magnitude of the feedback current ($I_{fb}$) is unnecessary, unlike the configuration to use the feedback current ($I_{fb}$) to acquire the magnitude of the negative conductance ($G_{osc}$). Hence the circuit configuration can be simplified, and downsizing and a decrease of manufacturing cost can be expected.

According to the twenty first embodiment, the oscillation control circuit 2, amplitude measurement circuit 3, control circuit 4 and signal processing circuit 5 are mounted on the monolithic IC. Therefore compared with a configuration to mount the oscillation control circuit 2, amplitude measurement circuit 3, control circuit 4 and signal processing circuit 5 on separate ICs, downsizing and a decrease of cost are expected, and noise resistance performance can be improved.

In particular, the oscillation control circuit 2 has the feedback circuit 23 and the current control circuit 23B, so compared with a configuration to dispose the emitter-follower circuit and D/A converter separately, the circuit scale can be downsized, and cost can be decreased.

Since the switch (SW) is inserted between the emitter of the transistor (BTr) and the reference potential, the current (Ib) is interrupted, and the electric current (Ib) does not flow into the transistor (BTr) when the switch (SW) is turned OFF to decrease the electric current (Ib). As a result, power consumption can be decreased.

According to an example, the switches ($SW_1$) to ($SW_4$) are inserted between the bases of the transistors ($BTr_1$) to ($BTr_4$) and the base of the transistor Q1 respectively. In this example, if the switch (SW) is turned OFF to decrease the electric current (Ib), the current (Ib) does not flow into the corresponding transistor (BTr). Therefore power consumption can be decreased. In other words, the switch (SW) can be inserted between the reference potential and the emitter (controlled electrode) of the transistor ($BTr_1$) or between the output terminal of the level shift circuit 211 and the base (control electrode) of the transistor ($BTr_1$).

According to an example, the respective numbers of the emitter-follower circuits 232a and the switches (SW) are not limited to 4, but may be 2, 3, 8, 16 or 32, that is at least 2. As the number of the emitter-follower circuits 232a and switches (SW) increase, the variable region and change width of the electric current ($I_O$) can be set precisely, therefore the resolution of the distance (positional accuracy) between an object and the sensing coil 10 can be improved.

(Twenty Second Embodiment)

Figure 21:
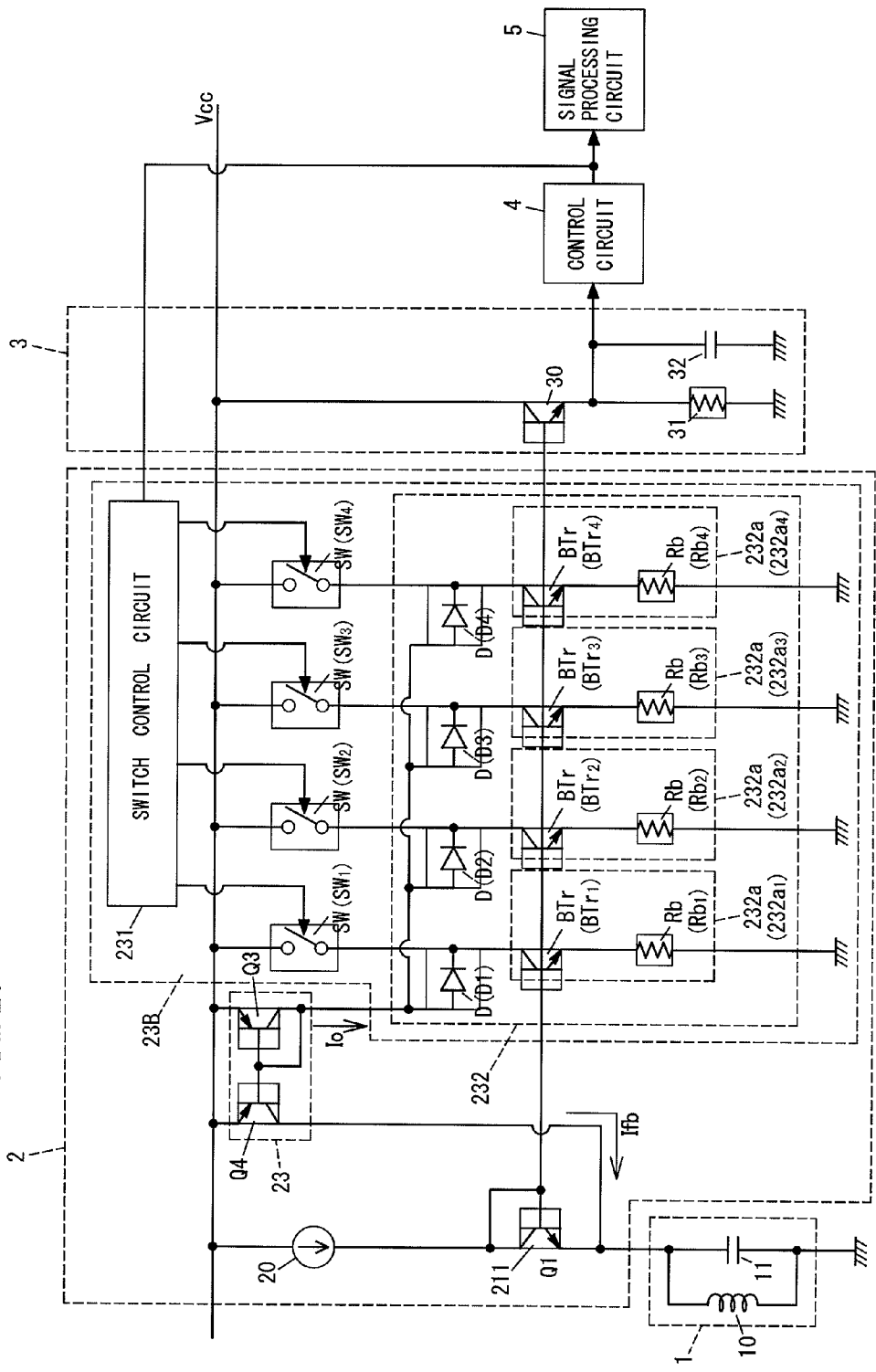
FIG. 21 is a schematic diagram of a proximity sensor according to a twenty second embodiment of the present invention.

FIG. 21 shows a proximity sensor according to a twenty second embodiment of the present invention. The proximity sensor according to the twenty second embodiment is characterized by a current control circuit 23B, and the other composing elements are configured in the same way as the twenty first embodiment. Similar composing elements are denoted with a same reference symbol used for the twenty first embodiment.

The current control circuit 23B according to the twenty second embodiment further has a plurality of diodes (D) for blocking reverse current, and a plurality of switches ($SW_1$) to ($SW_4$) are inserted between the internal power supply Vcc and the collectors of the transistors ($BTr_1$) to ($BTr_4$) respectively. The diodes ($D_1$) to ($D_4$) are inserted between the collector of the transistor Q3 and the collectors of the transistors ($BTr_4$) to ($BTr_4$) respectively. The anode and cathode of each diode ($D_1$) to ($D_4$) are connected with the collector of the transistor Q3 and the collectors of the transistors ($BTr_1$) to ($BTr_4$) respectively.

According to the twenty second embodiment, if the switch (SW) is ON, the collector of the corresponding transistor (BTr) is connected with the internal power supply Vcc, and this transistor (BTr) does not supply the electric current (Ib) to the input transistor (Q3). If the switch (SW) is OFF, the connection of the collector of the corresponding transistor (BTr) and the internal power supply Vcc is interrupted, and this transistor (BTr) supplies the current (Ib) to the input transistor (Q3). In other words, the electric current (Ib) flows between the emitter and collector of the transistor (Q3).

In other words, the current control circuit 23B according to the twenty second embodiment includes a diode (D) for creating a supply line (electric wire passing through the diode (D)) for supplying the electric current (Ib) from the transistor (BTr) to the input transistor (Q3), and a switch (SW) for creating a separation line (electric wire passing through the switch (SW)) for drawing the electric current (Ib) from the supply line.

According to the twenty second embodiment, the electric current ($I_O$) is adjusted by switching the supply line and separation line, so the electric current ($I_O$) flows to each transistor (BTr) regardless whether the switch (SW) is ON or OFF. Because of this, electric current fluctuation is not generated in each transistor (BTr) in response to the ON or OFF of each switch (SW). Therefore fluctuation of the reference current of the input transistor (Q3), due to the electric current fluctuation generated in each transistor (BTr), can be prevented, and stable operation is implemented.

(Twenty Third Embodiment)

A proximity sensor according to the twenty third embodiment of the present invention is characterized by a current control circuit 23B, and the other composing elements are configured in the same way as the twenty first embodiment. Similar composing elements are denoted with a same reference symbol used for the twenty first embodiment. The amplifying circuit 232 of the twenty third embodiment can also be applied to the twenty second embodiment.

According to the amplifying circuit 232 of the twenty third embodiment, the resistance value of the resistance circuits (Rb) are all different. In concrete terms, the resistance value of the resistance circuit ($Rb_1$) is the highest, and the resistance values of the resistance circuits ($Rb_2$) to ($Rb_4$) are ½, ¼ and ⅛ of the resistance value of the resistance circuit ($Rb_1$), that is, $Rb_1:Rb_2:Rb_3:Rb_4=8:4:2:1$. Therefore the electric currents ($Ib_2$), ($Ib_3$) and ($Ib_4$) are $2\times Ib_1$, $4\times Ib_1$ and $8\times Ib_1$ respectively.

If the electric current ($Ib_1$) corresponding to the switch ($SW_1$) is the reference current, the ratio of the electric current ($Ib_2$) corresponding to the switch ($SW_2$) with respect to the reference current (that is $Ib_2/Ib_1$) is $2^{2-1}$, that is 2. The ratio of the electric current ($Ib_3$) corresponding to the switch ($SW_3$) to the reference current (that is $Ib_3/Ib_1$) is $2^{3-1}$, that is 4. The ratio of the electric current ($Ib_4$) corresponding to the switch ($SW_4$) to the reference current (that is $Ib_4/Ib_1$) is $2^{4-1}$, that is 8. In other words, the ratio of the electric current ($Ib_n$) (n=2 to 4) corresponding to a switch ($SW_n$) to the reference current is $2^{n-1}$, where n is an ordinal number (position number in a digital code) of a bit corresponding to the switch ($SW_n$), and the exponent (n−1) is a bit number (ordinal number of the bit −1).

For example, if the digital code if "0001", the electric current ($I_O$) is $1\times Ib_1$. If the digital code is "0101", the electric current ($I_O$) is $4\times Ib_1+Ib_1$, that is $5\times Ib_1$. If the digital code is a straight binary code, a decimal value shown by the digital code is equal to the ratio of the electric current ($I_O$) to the reference current, that is $I_O/Ib_1$. Hence if the digital code is 4 bits, the electric current ($I_O$) can be selected out of 16 types of values (include "0").

According to the twenty third embodiment, the types of the values of the electric current ($I_O$) can be increased compared with the twenty first embodiment, in which the resistance values are all the same for all the resistance circuits (Rb) of the emitter-follower circuits 232a, if a number of emitter-follower circuits 232a is the same. Therefore the electric current ($I_O$) can be set precisely, and resolution of the distance (positional accuracy) between an object and the sensing coil 10 can be improved.

In particular, the ratio of the electric current ($Ib_n$) (n=2 to 4) corresponding to a switch ($SW_n$) to the reference current is $2^{n-1}$, so the electric current ($I_O$) can be set using a binary digital code, such as a straight binary code. Furthermore a number of switches (SW) can be decreased, and resolution of the distance (positional accuracy) between an object and the sensing coil 10 can be improved.

According to an example, at least one of the plurality of resistors (Rb) is different in resistance value from the others. According to this example, resolution can be improved compared with a configuration in which the resistance values of the resistors (Rb) are all the same.

(Twenty Fourth Embodiment)

Figure 22:
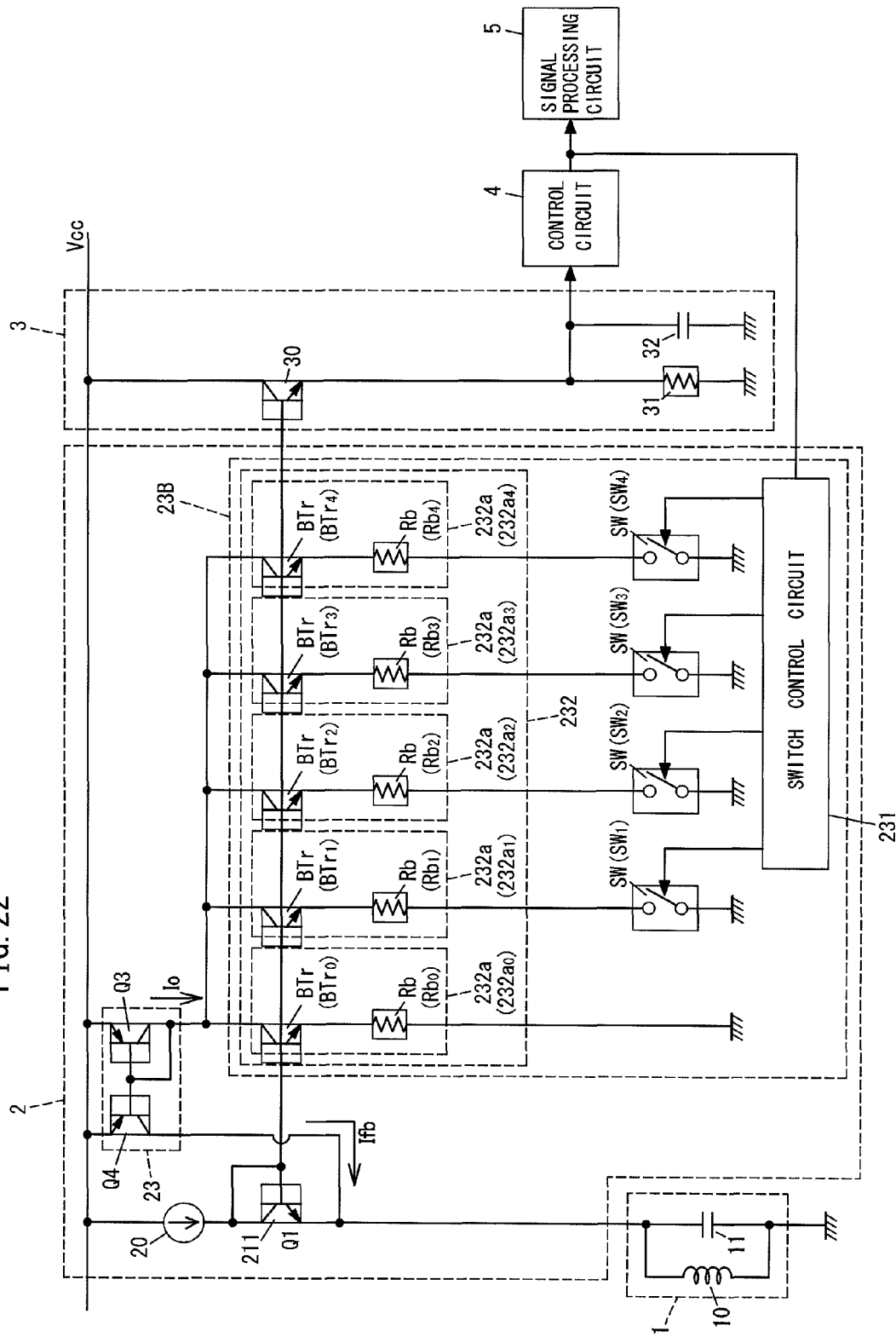
FIG. 22 is a schematic diagram of a proximity sensor according to a twenty fourth embodiment of the present invention.

FIG. 22 shows a proximity sensor according to a twenty fourth embodiment of the present invention. The proximity sensor according to the twenty fourth embodiment is characterized by a current control circuit 23B, and the other composing elements are configured in the same way as the twenty third embodiment. Similar composing elements are denoted with same reference symbols used for the twenty third embodiment.

The current control circuit 23B according to the twenty fourth embodiment further has an emitter-follower circuit $232a_0$ for offset. The emitter-follower circuit $232a_0$ has a NPN transistor ($BTr_0$) and resistance circuit ($Rb_0$). The collector and base of the transistor ($BTr_0$) are connected with the collector of the transistor (Q3) and the base of the transistor (Q1) respectively. The emitter of the transistor ($BTr_0$) is connected with the ground via the resistance circuit ($Rb_0$). Therefore the transistor ($BTr_0$) supplies electric ($Ib_0$) to the input transistor (Q3) regardless the bit value in the digital code. The emitter-follower circuit $232a_0$ for offset can also be applied to the twenty first and twenty second embodiments.

The resistance values of the plurality of resistance circuits (Rb) are all different, and the resistance values of the resistance circuits ($Rb_2$), ($Rb_3$) and ($Rb_4$) are ½, ¼ and ⅛ of the resistance value of the resistor ($Rb_1$) respectively, that is $Rb_1:Rb_2:Rb_3:Rb_4=8:4:2:1$. The resistance value of the resistor ($Rb_0$) is ½ of the resistance value of the resistor ($Rb_4$). Therefore the electric currents ($Ib_2$), ($Ib_3$), ($Ib_4$) and ($Ib_0$) are $2\times Ib_1$, $4\times Ib_1$, $8\times Ib_1$ and $16\times Ib_1$ respectively. If the electric current ($Ib_1$) is a reference circuit, the ratio of the electric current ($Ib_n$) (n=2 to 4) corresponding to the switch ($SW_n$) to the reference current ($Ib_1$) is $2^{n-1}$, where n is an ordinal number (position number in the digital code) corresponding to the switch ($SW_n$), and the exponent (n−1) is a bit number (ordinal number of the bit −1). For example, if the digital code is "0001", the electric current ($I_O$) is $Ib_0+Ib_1$. If the digital code is "0101", the electric current ($I_O$) is $Ib_0+5\times Ib_1$. Hence if the digital code is 4 bits, the electric current ($I_O$) can be selected from 16 types of values (including "0").

According to the twenty fourth embodiment, the transistor ($BTr_0$) supplies the electric current ($Ib_0$) to the input transistor (Q3) regardless the bit value in the digital code, so the offset of the electric current ($I_O$) can be set, and resolution of the distance (positional accuracy) between an object and the sensing coil 10 can be improved.

For example, when the conductance ($G_{coil}$) of the sensing coil 10 changes in a range of 400 μs to 600 μs, a 400 μs offset can be set for the negative conductance $|G_{osc}|$ and the change width of the negative conductance $|G_{osc}|$ can be set to 0 to 200 μs. Compared with the configuration to set the change width of the negative conductance $|G_{osc}|$ to 0 to 600 μs, the resolution of the distance (positional accuracy) between an object and the sensing coil 10 can be improved about 3 times without increasing the number of bits in the digital code.

(Twenty Fifth Embodiment)

Figure 23:
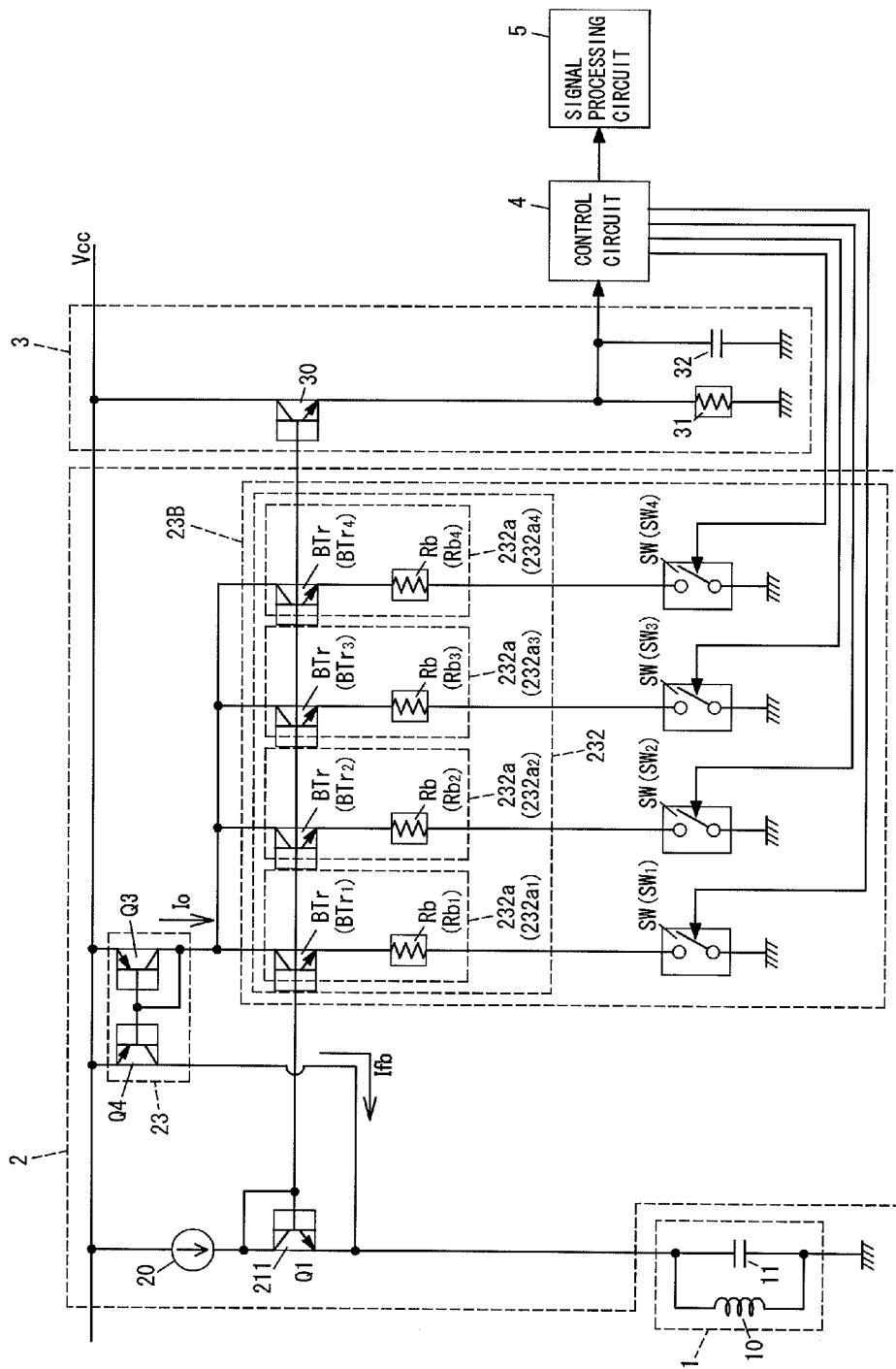
FIG. 23 is a schematic diagram of a proximity sensor according to a twenty fifth embodiment of the present invention.

FIG. 23 shows a proximity sensor according to a twenty fifth embodiment of the present invention. The proximity sensor according to the twenty fifth embodiment is characterized by a current control circuit 23B and control circuit 4, and the other composing elements are configured in the same way as the twenty first embodiment. Similar composing elements are denoted with a same reference symbol used for the twenty first embodiment. The twenty fifth embodiment can also be applied to the twenty second to twenty fourth embodiments.

According to the twenty fifth embodiment, the current control circuit 23B does not have the switch control circuit 231, but the control circuit 4 includes the function of the switch control circuit 231.

The control circuit 4 according to the twenty fifth embodiment includes a CPU and a microcomputer having memory, and a data register (accumulator) for writing a digital code is disposed in a storage area of the memory of the microcomputer. The total number of bits of the data register is the same as the total number of bits of the digital code, and the Nth bit in the digital code corresponds to the Nth bit in the data register, where N is a "0" or greater integer. The digital code is set based on the amplitude from the amplitude measurement circuit 3, just like the fifteenth embodiment.

The control circuit 4 includes a plurality of control signal output units (not illustrated) configured to supply control signals to the plurality of switches (SW) respectively. The plurality of control signal output units are related to the bits of the data register one to one. In other words, the plurality of switches (SW) are related to the bits of the data register respectively one to one. In concrete terms, the switch (SW) is related to the least significant bit (first bit) of the data register, and the ordinal number of the first bit shows a position number in the data register (digital code), and the bit number is the ordinal number −1, that is "0". The switch ($SW_2$) is related to the second bit of the data register. The switch ($SW_3$) is related to the third bit of the data register. And the switch ($SW_4$) is related to the most significant bit (fourth bit) of the data register.

Each control signal output unit supplies the control signal, corresponding to its own related bit value in the data register, to the corresponding switch (SW). For example, if the bit value of the data register is "1", the control signal output unit supplies a control signal to turn the switch (SW) to the switch (SW) ON. If the bit value is "0", the control signal output unit supplies a control signal to turn the switch (SW) to the switch (SW) OFF. For example, if the digital code is "1010", the data register is also "1010". Each control signal output unit related to the second bit and the fourth bit supplies the ON control signal to the corresponding switch (SW), and each control signal output unit related to the first bit and the third bit supplies the OFF control signal to the corresponding switch (SW). As a result, the switches ($SW_2$) and ($SW_4$) are turned ON, and the switches ($SW_1$) and ($SW_3$) are turned OFF. According to the twenty fifth embodiment, the control circuit 4 supplies the control signal to each of the switches (SW), and supplies the digital signal including the digital code to the signal processing circuit 5.

In the twenty fifth embodiment, the switch control circuit 231 is unnecessary, and the value of the negative conductance of the oscillation control circuit 2 can be changed directly by the bit value of the data register. Therefore the hardware can be simplified, and cost can be decreased.

(Twenty Sixth Embodiment)

Figure 24:
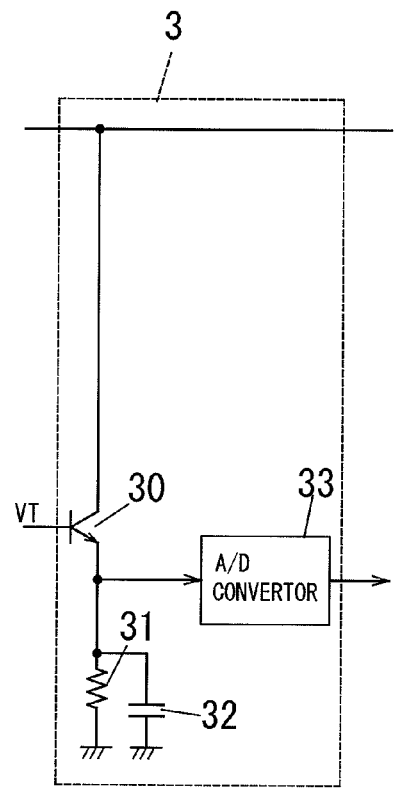
FIG. 24 is a schematic diagram of a proximity sensor according to a twenty sixth embodiment of the present invention.

FIG. 24 shows a key portion of a proximity sensor according to a twenty sixth embodiment of the present invention. The proximity sensor according to the twenty sixth embodiment is characterized by an amplitude measurement circuit 3 and control circuit 4, and the other composing elements are configured in the same way as the fifteenth embodiment. Similar composing elements are denoted with a same reference symbol used for the fifteenth embodiment. The twenty sixth embodiment can also be applied to the sixteenth to twenty fifth embodiments.

The amplitude measurement circuit 3 according to the twenty sixth embodiment is configured in a same way as the second embodiment. The control circuit 4 according to the twenty sixth embodiment uses a digital signal to show the amplitude ($V_T$) from the A/D converter 33 when a digital code is set so that the negative conductance ($G_{osc}$) of the oscillation control circuit 2 is the above mentioned critical value. For example, the control circuit 4 compares a digital signal from the A/D converter 33 and a digital signal of the amplitude ($V_T$) when the absolute value of the negative conductance ($G_{osc}$) and the absolute value of the conductance ($G_{coil}$) are the same, and generates a digital code in response to this difference.

According to the twenty sixth embodiment, the electric current ($I_O$) can be immediately set to a value with which the absolute value of the negative conductance ($G_{osc}$) is the same as the absolute value of the conductance ($G_{coil}$), compared with a configuration to set a digital code in response to the comparison result between the amplitude ($V_T$) and the threshold. Therefore the processing speed (response and tracking to the change of electric current ($I_O$)) can be improved. For example, when the proximity sensor is started up, or even when the moving speed of an object is fast, the negative conductance of the oscillation control circuit 2 can be quickly set to a critical value by which the LC resonant circuit 1 can oscillate, and the generation of a delay can be suppressed.

(Twenty Seventh Embodiment)

Figure 25:
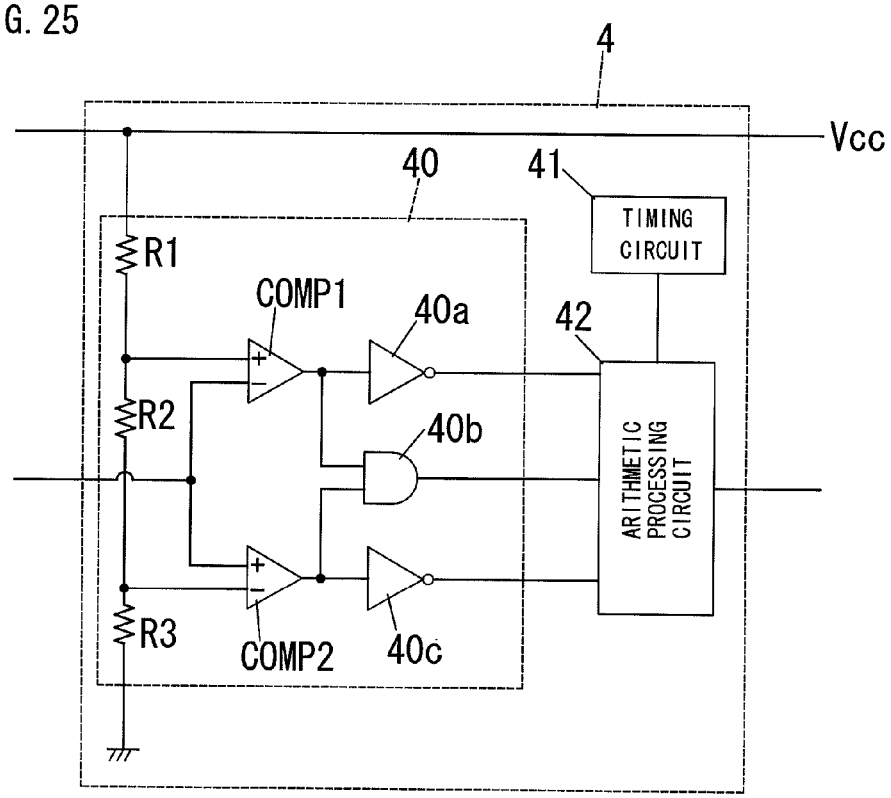
FIG. 25 is a schematic diagram of a proximity sensor according to a twenty seventh embodiment of the present invention.

FIG. 25 shows a key portion of a proximity sensor according to the twenty seventh embodiment of the present invention. The proximity sensor according to the twenty seventh embodiment is characterized by a control circuit 4, and the other composing elements are configured in the same way as the fifteenth embodiment. Similar composing elements are denoted with same reference symbols used for the fifteenth embodiment.

The control circuit 4 according to the twenty seventh embodiment has a comparison circuit 40, timing circuit 41 and arithmetic processing circuit 42. The comparison circuit 40 is configured in the same way as the third embodiment. The twenty seventh embodiment can also be applied to the sixteenth to twenty sixth embodiments.

The timing circuit 41 has an oscillation circuit that supplies pulse signals having a predetermined frequency to the arithmetic processing circuit 42. The predetermined frequency is set to a frequency lower than the oscillation frequency of the LC resonant circuit 1. The pulse signal is used for instructing a timing to output a digital signal, that is a timing to update a digital code, to the oscillation control circuit 2.

The arithmetic processing circuit 42 is configured to generate a digital code based on the comparison result of the comparison circuit 40. For example, if a high level signal is received from the first NOT gate 40*a*, the arithmetic processing circuit 42 adjusts the electric current ($I_O$) so as to increase the feedback circuit ($I_{fb}$). If a high level signal is received from the AND gate 40*b*, the arithmetic processing circuit 42 adjusts the electric current ($I_O$) so as to maintain the feedback current ($I_{fb}$) at the current value.

If a high level signal is received from the second NOT gate 40*c*, the arithmetic processing circuit 42 adjusts the electric current ($I_O$) so as to decrease the feedback current ($I_{fb}$). In other words, the control circuit 4 determines whether or not the electric current ($I_O$) is changed based on the comparison result of the comparison circuit 40.

To change the electric current ($I_0$), the arithmetic processing circuit 42 adds "1" to the least significant bit (first bit) or subtracts "1" from the least significant bit of the digital code. For example, if the digital code is "0010", and the arithmetic processing circuit 42 receives a high level signal from the first NOT gate 40*a*, then the arithmetic processing circuit 42 adds "1" to the least significant bit of the digital code, and sets the digital code to "0011". If the arithmetic processing circuit 42 receives a high level signal from the second NOT gate 40*c*, the arithmetic processing circuit 42 subtracts "1" from the least significant bit of the digital code, and sets the digital code to "0001".

When a digital signal, including a digital code, is output, the arithmetic processing circuit 42 outputs this digital signal in response to the pulse signal from the timing circuit 41. This prohibits outputting a digital code based on a frequency lower than the frequency of the timing circuit 41. According to the configuration of the twentieth and twenty fifth embodiments, the arithmetic processing circuit 42 is configured to supply a plurality of control signals corresponding to the digital code to a plurality of corresponding switches (SW) respectively, in response to the pulse signal from the timing circuit 41.

According to the twenty seventh embodiment, a digital code is changed by adding or subtracting "1" to or from the least significant bit of the digital code. Hence generation of an overshoot or an undershoot can be prevented when the electric current ($I_O$) is adjusted. Furthermore, it is not necessary to compute a target value of a digital code directly from the amplitude of the oscillating voltage. Therefore the control circuit 4 can be constructed using an inexpensive comparison circuit 40, and cost can be decreased, compared with a circuit including an A/D converter and CPU.

The control circuit 4 outputs the digital signal including a digital code based on the pulse signal from the timing circuit 41, so the frequency of the pulse signals being output from the timing circuit 41 is lower than the oscillating frequency of the LC resonant circuit 1. Since the digital code is not supplied to the current control circuit with a time interval shorter than the oscillating cycle of the LC resonant circuit 1, the oscillation of the LC resonant circuit 1, due to the change of the electric current ($I_O$), can be prevented, and stable control becomes possible.

According to an example, the comparison circuit 40 is configured to judge whether or not the amplitude from the amplitude measurement circuit 3 exceeds a predetermined threshold. In this example, it is not necessary to compute a target value of the digital code directly from the amplitude. Therefore the control circuit 4 can be constructed using an inexpensive comparison circuit 40, and cost can be decreased, compared with a circuit including an A/D converter and CPU.

(Twenty Eighth Embodiment)

Figure 26:
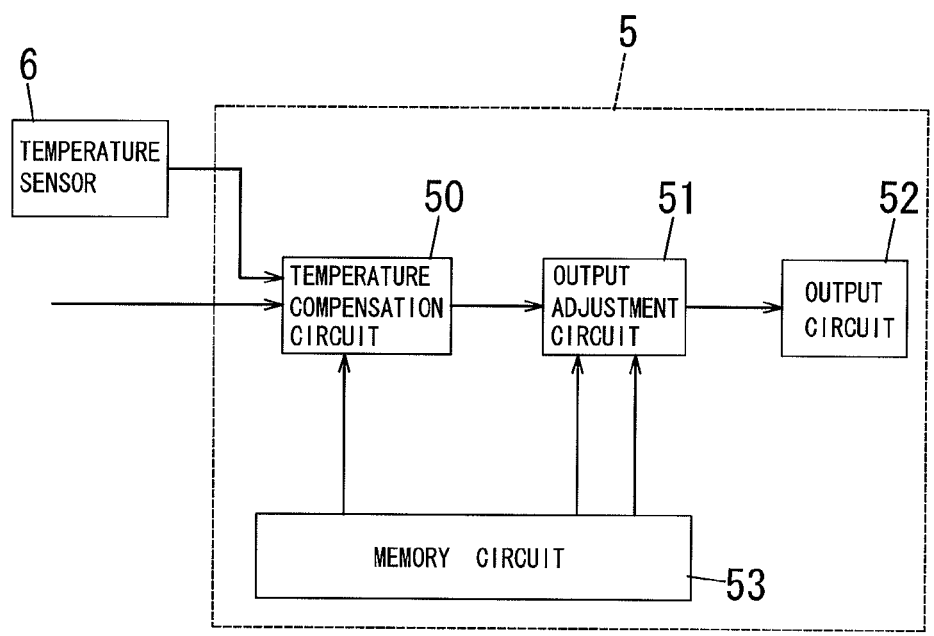
FIG. 26 is a schematic diagram of a proximity sensor according to a twenty eighth embodiment of the present invention.

FIG. 26 shows a key portion of a proximity sensor according to a twenty eighth embodiment of the present invention. The proximity sensor according to the twenty eighth embodiment is characterized by a temperature sensor 6 (temperature measurement circuit) and a signal processing circuit 5, and the other composing elements are configured in the same way as the fifteenth embodiment. Similar composing elements are denoted with same reference symbols used for the fifteenth embodiment. The temperature sensor 6 is configured in the same way as the fourth embodiment. The signal processing circuit 5 according to the twenty eighth embodiment can also be applied to the sixteenth to twenty seventh embodiments.

The signal processing circuit 5 according to the twenty eighth embodiment has a temperature compensation circuit 50, output adjustment circuit 51, output circuit 52 and memory circuit 53. The temperature compensation circuit 50 is configured to acquire a digital code based on a digital signal from the control circuit 4, and perform temperature compensation by multiplying a value of the digital code by a correction temperature coefficient (correction coefficient) corresponding to a temperature detected by the temperature sensor 6. The output adjustment circuit 51 is configured to perform offset processing to add a predetermined addition value to the digital code, or to perform gain processing to multiply the digital code by a predetermined multiplication value.

The temperature compensation circuit 50 and the output adjustment circuit 51 are implemented by programs, or can be constituted by circuits.

The output circuit 52 is configured to generate a distance signal to show the distance between the sensing coil 10 and an object (sensing distance) based on the digital code after the adjusted temperature compensation. For example, the output circuit 52 generates the distance signal using a data table that shows a relationship of the digital code and the sensing distance, or an expression to convert a value, shown by a digital code, into a sensing distance.

The memory circuit 53 includes an erasable non-volatile memory, such as an EEPROM, and stores a data table of the correction temperature coefficients that are used for the temperature compensation circuit 50, and the addition values and multiplication values that are used for the output adjustment circuit 51. The data table of the correction temperature coefficients, addition values and multiplication values can be changed.

When a digital code is input, the temperature compensation circuit 50 acquires a correction temperature coefficient corresponding to the detection temperature of the temperature sensor 6 from the data table of the correction temperature coefficients stored in the memory circuit 53, multiplies a value of the digital code by the acquired correction temperature coefficient, and outputs the obtained digital code. The correction temperature coefficients used for the temperature compensation circuit 50 are values that are set considering the temperature characteristics of the sensing coil 10, object and circuits, including the oscillation control circuit 2, and can be determined based on the result of the temperature measurement using a reference, for example.

When a digital code is input, the output adjustment circuit 51 executes at least one of offset processing and gain processing to obtain a digital code. The addition value used for the offset processing is a positive or negative value that is added to a value shown by the digital code. The multiplication value is a value by which the value of the digital code is multiplied (that is, a value to specify a multiplying factor). Therefore the addition value is set to a positive value to shift the value of the digital code to the positive side. The addition value is set to a negative value to shift the value of the digital code to the negative side. The multiplication value is set to a value greater than "1" to increase a difference between the values of the digital codes. The multiplication value is set to a value of "0" or greater and less than "1" to decrease the difference between the values of the digital codes.

For example, the offset processing and gain processing are executed to set a possible value of the distance signal, which is output from the output circuit 52, to be a value within a desired range. In concrete terms, if a magnitude of the distance signal obtained from the digital code is greater than the magnitude that can be output by the output circuit 52 and is saturated, depending on the operation state of the proximity sensor (e.g. type of material of an object), the distance between the sensing coil 10 and the object may not be obtained. Therefore the value of the digital code is adjusted through the output adjustment circuit 51, so that the magnitude of the distance signal is confined to within a range of magnitude that can be output by the output circuit 52, thereby the saturation (error) of the distance signal can be prevented.

According to the twenty eighth embodiment, the digital code is corrected in response to the temperature detected by the temperature sensor 6, so deterioration of sensing accuracy, due to the temperature characteristics of the sensing coil 10, object and circuits, including the oscillation control circuit 2, can be prevented, and sensing accuracy can be improved.

The correction temperature coefficient in the temperature compensation circuit 50 can be changed (erasable). Therefore dispersion of the distance signal value depending on the product can be prevented even if the characteristics of the sensing coil 10, relative positions of the sensing coil 10 and an object, and temperature characteristics of circuits including the oscillation control circuit 2, disperse depending on the product.

A value of the digital code can be freely adjusted by executing the offset processing and gain processing. Therefore a distance signal value in a desired range can be obtained. The addition value and multiplication value can be changed (erasable), so dispersion of the range of the distance signal value depending on the product can be prevented even if the characteristics of the sensing coil 10, relative positions of the sensing coil 10 and an object, and characteristics of the circuits including the oscillation control circuit 2, disperse depending on the product.

According to an example, the signal processing circuit 5 may have only one of the temperature compensation circuit 50 and the output adjustment circuit 51.

(Twenty Ninth Embodiment)

Figure 27:
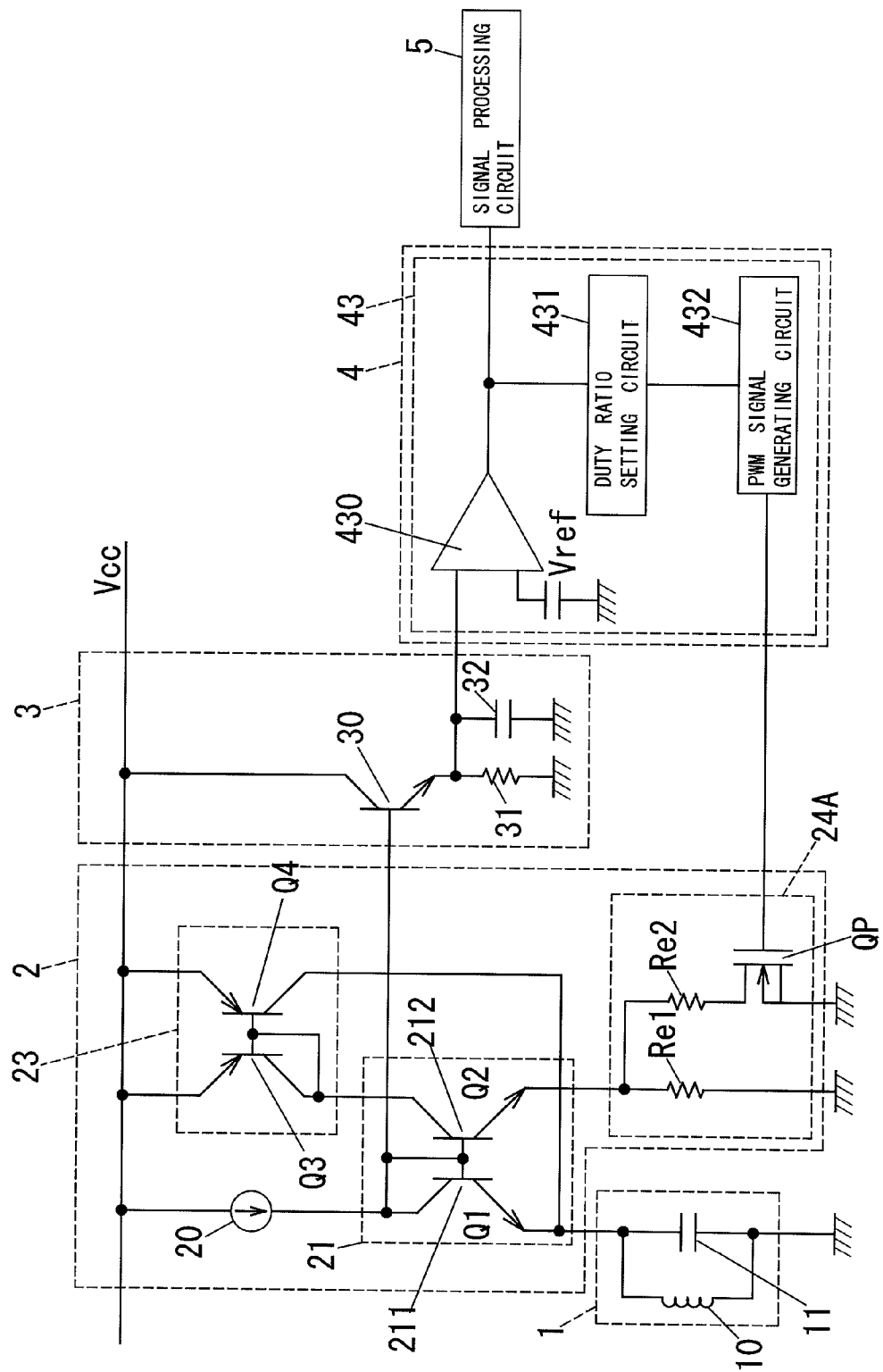
FIG. 27 is a schematic diagram of a proximity sensor according to a twenty ninth embodiment of the present invention.

FIG. 27 shows a proximity sensor according to a twenty ninth embodiment. The proximity sensor according to the twenty ninth embodiment is characterized by a resistance circuit 24A and control circuit 4, when compared with the first embodiment. The other composing elements are configured in the same way as the first embodiment. Similar composing elements are denoted with same reference symbols used for the first embodiment. The oscillation control circuit 2, amplitude measurement circuit 3, control circuit 4 and signal processing circuit 5 are mounted on a monolithic IC. According to an example, the emitter-follower circuit 212 can be replaced with a source-follower circuit that includes a MOSFET.

Figure 28:
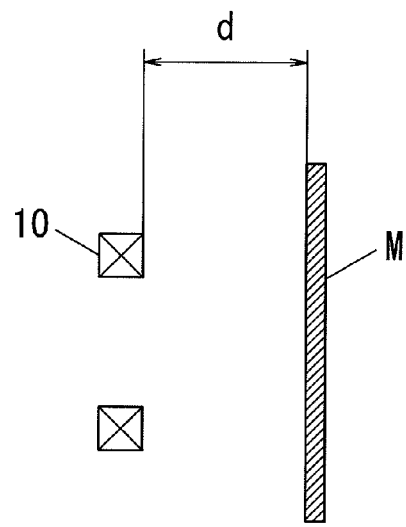
FIG. 28 shows a positional relationship of a sensing coil and an object according to the twenty ninth embodiment.

An object (M) has, but is not limited to, a flat shape, and is constituted by metal, for example. As FIG. 28 shows, the object (M) is disposed facing one end face of the sensing coil 10, so that the perpendicular of the object (M) matches the axis direction of the sensing coil 10. According to the example in FIG. 28, the object (M) is disposed facing the right end face of the sensing coil 10, and the distance between the object (M) and the right end face of the sensing coil 10 is "d". The object (M) is moved in the axis direction of the sensing coil 10. In one example, the object (M) may be a pipe-shaped conductor, or the object (M) may be a magnetic body.

The resistance circuit 24A is replaced with the variable resistor circuit 24 of the first embodiment. In other words, the resistance circuit 24A is connected between the emitter of the transistor (Q2) and the ground, and is used for adjusting the magnitude of the electric current supplied from the emitter-follower circuit 22. The feedback current is adjusted by adjusting the electric current. For example, the resistance circuit 24A includes resistors (Re1) and (Re2), and a semiconductor switching device (QP). The resistor (Re1) has first and second terminals, which are connected with the emitter of the transistors (Q2) and the ground respectively. The resistor (Re2) has first and second terminals, which are connected with the first terminal of the resistor (Re1) and one end (drain) of the switching device (QP) respectively. The switching device (QP) is a MOSFET, for example.

The control circuit 4 is configured to set the negative conductance of the oscillation control circuit 2 to a critical value by which the LC resonant circuit 1 can oscillate, based on the amplitude of the oscillating voltage from the amplitude measurement circuit 3. The control circuit 4 includes a PWM control circuit 43.

Here if the switching device (QP) is OFF, the electric current from the transistor (Q2) does not flow into the resistor (Re2), so the resistance value of the resistance circuit 24A becomes a resistance value of the resistor (Re1). If the switching device (QP) is ON, the electric current flows into the resistor (Re2), so the resistance value of the resistance circuit 24A becomes a combined resistance value of the resistors (Re1) and (Re2). In concrete terms, the ON resistance of the switching device (QP) is added to a combined resistance value. In other words, the resistance value of the resistance circuit 24A, when the switching device (QP) is ON, is smaller than that of the resistance circuit 24A when the switching device (QP) is OFF. If the switching device (QP) is turned ON/OFF by PWM control, a period of the resistance circuit 24A being set to a low resistance, and a period of the resistance circuit 24A being set to a high resistance, can be switched at a predetermined duty ratio. Therefore the substantial resistance value of the resistance circuit 24A changes in response to the duty ratio of the PWM signal that is supplied to the switching device (QP).

The electric current from the emitter-follower circuit 212 flows through the resistor circuit 24A and reaches the ground, hence the magnitude of the electric current from the emitter-follower circuit 212 and the magnitude of the feedback current are determined by a substantial resistance value of the resistance circuit 24A. Therefore the feedback current in response to the ON/OFF duty ratio of the switching device (QP) is supplied to the LC resonant circuit 1.

The negative conductance ($G_{osc}$) of the oscillation control circuit 2 can be given by the above mentioned Expression 1. So by setting the feedback current ($I_{fb}$) based on the amplitude ($V_T$), the negative conductance ($G_{osc}$) can be adjusted.

The electric current ($I_O$) from the emitter-follower circuit 212 is given by $$I_O = I_{fb} = V_T/R_e \quad \text{[Expression 21]}$$

where $R_e$ denotes a substantial resistance value of the resistance circuit 24A.

A voltage equal to the oscillating voltage generated across the LC resonant circuit 1 is applied between the emitter of the transistor (Q2) and the ground during each positive period of the oscillating voltage, hence the negative conductance ($G_{osc}$) is given by $$|G_{osc}| = 1/(2R_e) \quad \text{[Expression 22]}$$

based on Expressions 1 and 21, and the positive period and negative period. Therefore the negative conductance ($G_{osc}$) can be adjusted by the resistance value ($R_e$) of the resistance circuit 24A.

An oscillation condition of the LC resonant circuit 1 is given by $$G_{coil} \leq |G_{osc}|$$

If the absolute value of the negative conductance ($G_{osc}$) is equal to the conductance ($G_{coil}$) of the sensing coil 10, the negative conductance ($G_{osc}$) becomes a maximum value by which the LC resonant circuit 1 can oscillate. In other words, the negative value ($-G_{coil}$) of the conductance of the sensing coil 10 becomes a critical value of the negative conductance ($G_{osc}$) of the oscillation control circuit 2.

If the negative conductance ($G_{osc}$) is the critical value, then the conductance ($G_{coil}$) is given by $$G_{coil} = 1/(2R_e) \quad \text{[Expression 23]}$$

The conductance ($G_{coil}$) of the sensing coil 10 changes according to the change of the eddy current loss due to the distance (d) between an object (M) and the sensing coil 10 (that is, changes according to the distance (d)). This means that if the negative conductance ($G_{osc}$) is the above mentioned critical value, the conductance ($G_{coil}$) of the sensing coil 10 is in inverse proportion to the resistance value ($R_e$) of the resistance circuit 24A. The resistance value ($R_e$) is a value according to the duty ratio of the PWM signal that is supplied to the switching device (QP). Hence the distance (d) between the sensing coil 10 and an object can be acquired from the duty ratio of the PWM signal.

The PWM control circuit 43 is configured to supply a PWM signal with a predetermined duty ratio to the switching device (QP) of the resistance circuit 24A, and turn the switching device (QP) ON/OFF by the PWM control. In concrete terms, the PWM control circuit 43 sets the duty ratio based on the amplitude of the oscillating voltage from the amplitude measurement circuit 3, so as to set the negative conductance of the oscillation control circuit 2 to a critical value by which the LC resonant circuit 1 can oscillate. According to the twenty ninth embodiment, the PWM control circuit 43 sets the duty ratio of the PWM signal so that the amplitude of the oscillating voltage becomes a predetermined value, whereby the negative conductance ($G_{osc}$) is set to the above mentioned critical value. The predetermined critical value is an amplitude value of the oscillating voltage when the absolute value of the negative conductance ($G_{osc}$) and the absolute value of the conductance ($G_{coil}$) are the same. This is because the oscillating amplitude changes if the negative conductance ($G_{osc}$) deviates from the critical value.

The PWM control circuit 43 has an arithmetic circuit 430, duty ratio setting circuit 431 and PWM signal generating circuit 432. The arithmetic circuit 430 is configured to judge whether or not the negative conductance ($G_{osc}$) is the critical value based on the amplitude of the oscillating voltage from the amplitude measurement circuit 3. The arithmetic circuit 430 compares a threshold and the output of the amplitude measurement circuit 3, and outputs a voltage signal in response to the difference. This threshold value is a reference voltage from the power supply (Vref) and corresponds to the above mentioned predetermined value. The reference voltage is preferably a relatively low value, such as 0.3 V, so the arithmetic circuit 430 amplifies the output of the amplitude measurement circuit 3 when appropriate.

The duty ratio setting circuit 431 includes a microcomputer, for example. Based on the current duty ratio of the PWM signal that is supplied to the switching device (QP) and magnitude of the output voltage signal of the arithmetic circuit 430, the duty ratio setting circuit 431 determines the duty ratio with which the magnitude of the voltage signal becomes "0" (difference between the oscillating amplitude and the threshold is "0"), and supplies a setting signal to show the result (duty ratio) to the PWM signal generating circuit 432.

The variability region of the negative conductance ($G_{osc}$) which changes according to the duty ratio is equal to the distance (d) detection range. Therefore it is preferable that the range of possible values of the negative conductance ($G_{osc}$) of the oscillation control circuit 2 is approximately the same as the range of possible values of the conductance ($G_{coil}$) of the sensing coil 10.

Figure 29:
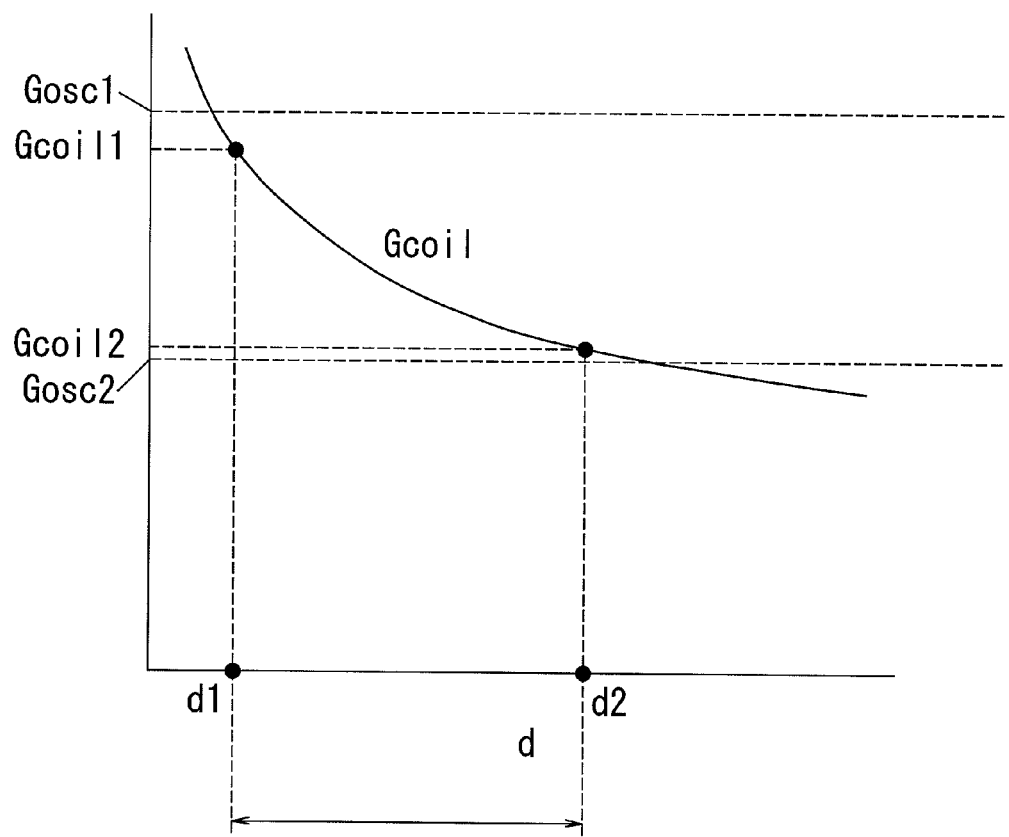
FIG. 29 is a graph depicting a relationship of a distance between a sensing coil and an object, and a conductance of the sensing coil.

In the example in FIG. 29, "d1 to d2" is the variability region (detection range) of the distance (d) between the object (M) and the sensing coil 10. "$G_{coil1}$" denotes a conductance of the sensing coil 10 at "d1". "$G_{coil2}$" denotes a conductance of the sensing coil 10 at "d2". "$G_{osc1}$" denotes a value of the negative conductance ($G_{osc}$) of the oscillation control circuit 2 when the duty ratio is 100%. And "$G_{osc2}$" denotes a value of the negative conductance ($G_{osc}$) of the oscillation control circuit 2 when the duty ratio is 0%.

In the example in FIG. 29, "$G_{coil1}$" is a maximum value of the possible values of the conductance ($G_{coil}$) of the sensing coil 10 in the variable region (d1 to d2) of the distance (d). "$G_{coil2}$" is a minimum value of the possible values of the conductance ($G_{coil}$) of the sensing coil 10 in the variable region of the distance (d). Therefore if "$G_{osc1}$" is "$G_{coil1}$" or more and "$G_{osc2}$" is "$G_{coil2}$" or less, then the variable region of the conductance ($G_{coil}$) of the sensing coil 10 can be completely covered.

When the duty ratio is 100%, it is preferable that the negative conductance ($G_{osc}$) of the oscillation control circuit 2 is a critical value corresponding to "$G_{coil1}$" (that is, $G_{coil1}=|G_{osc1}|$). "$G_{coil1}$" is a maximum value of the possible values of the conductance ($G_{coil}$) of the sensing coil 10 in the variability region (d1 to d2) of the distance (d). When the duty ratio of 0%, it is preferable that the negative conductance ($G_{osc}$) is a critical value corresponding to "$G_{coil2}$" (that is $G_{coil2}=|G_{osc2}|$). "$G_{coil2}$" is a minimum value of the possible value of the conductance ($G_{coil}$) of the sensing coil 10 in the variability region of the distance (d). By setting the negative conductance ($G_{osc}$) like this, the resolution can be improved. Actually the degree of change of the conductance ($G_{coil}$) differs depending on the shapes of the sensing coil 10 and object (M), and the influence of the ambient environment. Therefore it is preferable to set "$G_{osc1}$" to be slightly greater than "$G_{coil1}$", and "$G_{osc2}$" to be slightly less than "$G_{coil2}$", as shown in FIG. 29. In other words, it is preferable that the variability region of the negative conductance ($G_{osc}$) is slightly wider than the variability region of the conductance ($G_{coil}$) of the sensing coil 10.

Thereby the range of the negative conductance ($G_{osc}$) that changes according to the duty ratio becomes approximately the same as the range of the conductance ($G_{coil}$) of the sensing coil 10 that changes according to the distance (d) of the object (M). Therefore the variability region of the conductance ($G_{coil}$) of the sensing coil 10 can be determined in the sensing range, and high precision can be implemented.

When the above mentioned setting signal is received, the PWM signal generating circuit 432 supplies a PWM signal having a duty ratio shown by the setting signal to the switching device (QP). According to the twenty ninth embodiment, the frequency of the PWM signal is set to not less than three times that of the oscillating frequency of the LC resonant circuit 1. Thereby the pulsing of the oscillating waveform of the LC resonant circuit 1 can be suppressed using the PWM signal, and negative influence of the negative conductance ($G_{osc}$) can be eliminated. The circuit for outputting a PWM signal having a predetermined duty ratio is well known to those skilled in the art, and detailed description is omitted here.

The PWM control circuit 43 judges whether or not the negative conductance ($G_{osc}$) is the critical value based on the amplitude of the oscillating voltage from the amplitude measurement circuit 3, and adjusts the negative conductance ($G_{osc}$) of the oscillation control circuit 2 according to the judgment result.

It is preferable that the absolute value of the negative conductance ($G_{osc}$) matches with the absolute value of the conductance ($G_{coil}$). The invention is not limited to this, but the absolute value of the negative conductance ($G_{osc}$) may be set to a value in a range that is substantially the same as the absolute value of the conductance ($G_{coil}$) (e.g. a value slightly less than the critical value). For this, the PWM control circuit 43 may set the duty ratio so that the amplitude of the oscillating voltage from the amplitude measurement circuit 3 becomes a value in a predetermined range. The value in the predetermined range is a value of an amplitude of the oscillating voltage in a range where the absolute value of the negative conductance ($G_{osc}$) and the absolute value of the conductance ($G_{coil}$) are substantially the same.

The signal processing circuit 5 is constituted by a microcomputer, for example. The signal processing circuit 5 computes a duty ratio of the PWM signal that is supplied to the switching device (QP) next, using the same arithmetic processing as the duty ratio setting circuit 431, and outputs this computing result as a distance signal.

The operation of the twenty ninth embodiment will now be described. The LC resonant circuit 1 generates an oscillating voltage. The frequency of the oscillating voltage is determined by the inductance of the sensing coil 10 and the electrostatic capacity of the capacitor 11. The oscillation in the LC resonant circuit 1 is maintained by the feedback current that is supplied from the transistor (Q4) of the feedback circuit 23 as a positive feedback. The amplitude measurement circuit 3 measures the amplitude of the oscillating voltage that is generated across the LC resonant circuit 1. The arithmetic circuit 430 of the control circuit 4 compares the amplitude with a threshold, that is, the reference voltage from the power supply (Vref), and supplies the voltage signal according to the comparison result to the duty ratio setting circuit 431 and the signal processing circuit 5.

The duty ratio setting circuit 431 computes a duty ratio of the PWM signal that is supplied to the switching device (QP) next. The PWM signal generation circuit 432 supplies a PWM signal with the computed duty ratio to the switching device (QP). The signal processing circuit 5 determines the duty ratio in the same way as the duty ratio setting circuit 431, and outputs a distance signal to show the duty ratio.

If the object (M) approaches the sensing coil 10 and the eddy current loss in the sensing coil 10 increases, the absolute value of the conductance ($G_{coil}$) of the sensing coil 10 becomes greater than the absolute value of the negative conductance ($G_{osc}$). Because of this, the above mentioned oscillation condition is no longer satisfied, and the LC resonant circuit 1 begins to stop oscillation, decreasing the amplitude of the oscillating voltage.

The PWM control circuit 43 sets the duty ratio so that the amplitude of the oscillating voltage becomes the above mentioned threshold, and adjusts the negative conductance ($G_{osc}$). For this, the PWM control circuit 43 increases the duty ratio so as to increase the absolute value of the negative conductance ($G_{osc}$). The signal processing circuit 5 executes computing similar to the PWM control circuit 43, and outputs a distance signal to show a duty ratio equal to the duty ratio that is set by the PWM control circuit 43.

If the object (M) moves away from the sensing coil 10 and the eddy current loss in the sensing coil 10 decreases, the absolute value of the conductance ($G_{coil}$) of the sensing coil 10 becomes smaller than the absolute value of the negative conductance ($G_{osc}$). The PWM control circuit 43 sets the duty ratio so that the amplitude of the oscillating voltage is equal to the threshold, to adjust the negative conductance ($G_{osc}$). The PWM control circuit 43 decreases the duty ratio so that the absolute value of the negative conductance ($G_{osc}$) decreases. The signal processing circuit 5 performs computing similar to the PWM control circuit 43, and outputs a distance signal to indicate a duty ratio equal to the duty ratio that is set by the PWM control circuit 43.

Since the distance signal to show the duty ratio of the PWM signal is generated by the signal processing circuit 5 like this, the distance (d) between the object (M) and the sensing coil 10, that is, the positional relationship, can be detected by the distance signal.

An oscillation condition of the LC resonant circuit 1 is that the absolute value of the negative conductance ($G_{osc}$) of the oscillation control circuit 2 is the absolute value of the conductance ($G_{coil}$) of the sensing coil 10 or more. Therefore if the negative conductance ($G_{osc}$) of the oscillation control circuit 2 is the critical value by which the LC resonant circuit 1 can oscillate, it can be regarded that the absolute value of the negative conductance ($G_{osc}$) is equal to the absolute value of the conductance ($G_{coil}$) of the sensing coil 10. Here the conductance ($G_{coil}$) of the sensing coil 10 changes according to the change of the eddy current loss due to the distance (d) between the object (M) and the sensing coil 10 (that is, changes according to the distance (d)). The negative conductance ($G_{osc}$) of the oscillation control circuit 2 that is equal to the conductance ($G_{coil}$) of the sensing coil 10 is determined by the feedback current ($I_{fb}$) supplied to the LC resonant circuit 1 and the oscillating voltage ($V_T$) of the LC resonant circuit 1. The feedback current ($I_{fb}$) that is supplied to the LC resonant circuit 1 is increased/decreased by the emitter-follower circuit 212 in response to the output current. Therefore a signal relevant to the duty ratio for adjusting the magnitude of the output current of the emitter-follower circuit 212 can be used as a value to show the distance (d) between the sensing coil 10 and the object (M). This duty ratio is a duty ratio of the PWM signal that is supplied to the switching device (QP), or an electric signal that is used for setting this duty ratio, for example. By using the duty ratio of the PWM signal that is supplied to the switching device (QP), not only can the existence of the object (M) be detected, but the distance (d) between the object (M) and the sensing coil can also be shown.

By comparing the distance signal with a threshold, a digital sensing signal, indicating whether an object (M) exists or not, can also be obtained. Therefore in addition to the detection of the existence of an object (M), the distance (d) between the object (M) and the sensing coil can also be obtained. For example, if a value of the distance signal (analog distance signal) is a predetermined threshold or more, the signal processing circuit 5 may judge that an object (M) exists within the sensing range of the sensing coil 10, and output a sensing signal (digital sensing signal) to show the existence of an object. In the same manner, if the value of the distance signal is less than the threshold, the signal processing circuit 5 may judge that an object (M) does not exist in the sensing range of the sensing coil 10, and output a sensing signal (digital sensing signal) to show the absence of an object.

According to an example, the resistance circuit 24A is comprised of a plurality of resistors and a semiconductor switching device for adjusting the resistance value, that is connected in series or in parallel with one of the resistors. In other words, the resistance circuit 24A can be configured to obtain a desired value and the variability region of the negative conductance ($G_{osc}$) of a desired oscillation control circuit 2.

According to an example, the switching device (QP) has an ON resistor, so the switching device (QP) can be used as a resistor of the resistance circuit 24A. According to this example, a number of components of the resistance circuit 24A can be decreased, therefore the circuit scale of the entire proximity sensor can be downsized, and the manufacturing cost can be decreased.

According to the twenty ninth embodiment, the oscillation control circuit 2, amplitude measurement circuit 3, control circuit 4 and signal processing circuit 5 are mounted on a monolithic IC. Therefore compared with a configuration to mount the oscillation control circuit 2, amplitude measurement circuit 3, control circuit 4 and signal processing circuit 5 on separate ICs, downsizing and a decrease of cost are expected, and noise resistance performance can be improved.

According to an example, the switching device (QP) of the resistance circuit 24A is mounted on a monolithic IC, but the resistors (Re1) and (Re2) of the resistance circuit 24A are not mounted on a monolithic IC. In this example, the resistors (Re1) and (Re2) can be replaced. Hence the variability region of the resistance value ($R_e$) of the resistance circuit 24A can be adjusted, and design of the proximity sensor can be easily changed.

According to an example, the PWM control circuit 43 supplies a PWM signal, the same as the PWM signal that is supplied to the switching device (QP), to the signal processing circuit 5. The signal processing circuit 5 outputs the PWM signal from the PWM control circuit 43 as the distance signal. According to this example, the signal processing circuit 5 can be configured by simple circuits only for decreasing the output impedance.

According to an example, the PWM control circuit 43 supplies a PWM signal, the same as the PWM signal that is supplied to the switching device (QP), to the signal processing circuit 5. The signal processing circuit 5 converts the PWM signal from the PWM control circuit 43 into a signal having an electric potential according to the duty ratio of this PWM signal, and outputs it as a distance signal. In this example, the user need not perform processing to convert the PWM signal into a signal having an electric potential according to the duty ratio, therefore operability improves.

According to an example, the value to show the amplitude of the oscillating voltage is not limited to a peak value of the oscillating voltage in FIG. 1, but may be an integral value of the oscillating voltage or an effective value of the oscillating voltage. In the case of a configuration to detect only the AC components and control to keep them constant, the influence of DC resistance components (and influence of temperature characteristics) of the bias current and sensing coil 10 can be eliminated.

According to an example, the LC resonant circuit 1 is not limited to having a configuration where oscillation is constantly performed and stopped by the approach of an object, but may have a configuration where oscillation is constantly stopped and oscillation begins by the approach of an object.

The conductance of the sensing coil 10 according to the twenty ninth embodiment changes not only by the distance (d) between the sensing coil 10 and an object (M), but also by the oscillating frequency of the LC resonant circuit 1. In other words, if the capacitance of the capacitor 11 changes, the conductance of the sensing coil 10 changes. Therefore the proximity sensor of the twenty ninth embodiment can be used as an electrostatic capacity sensor as well, and can use the duty ratio of the PWM signal as the output.

(Thirtieth Embodiment)

Figure 30:
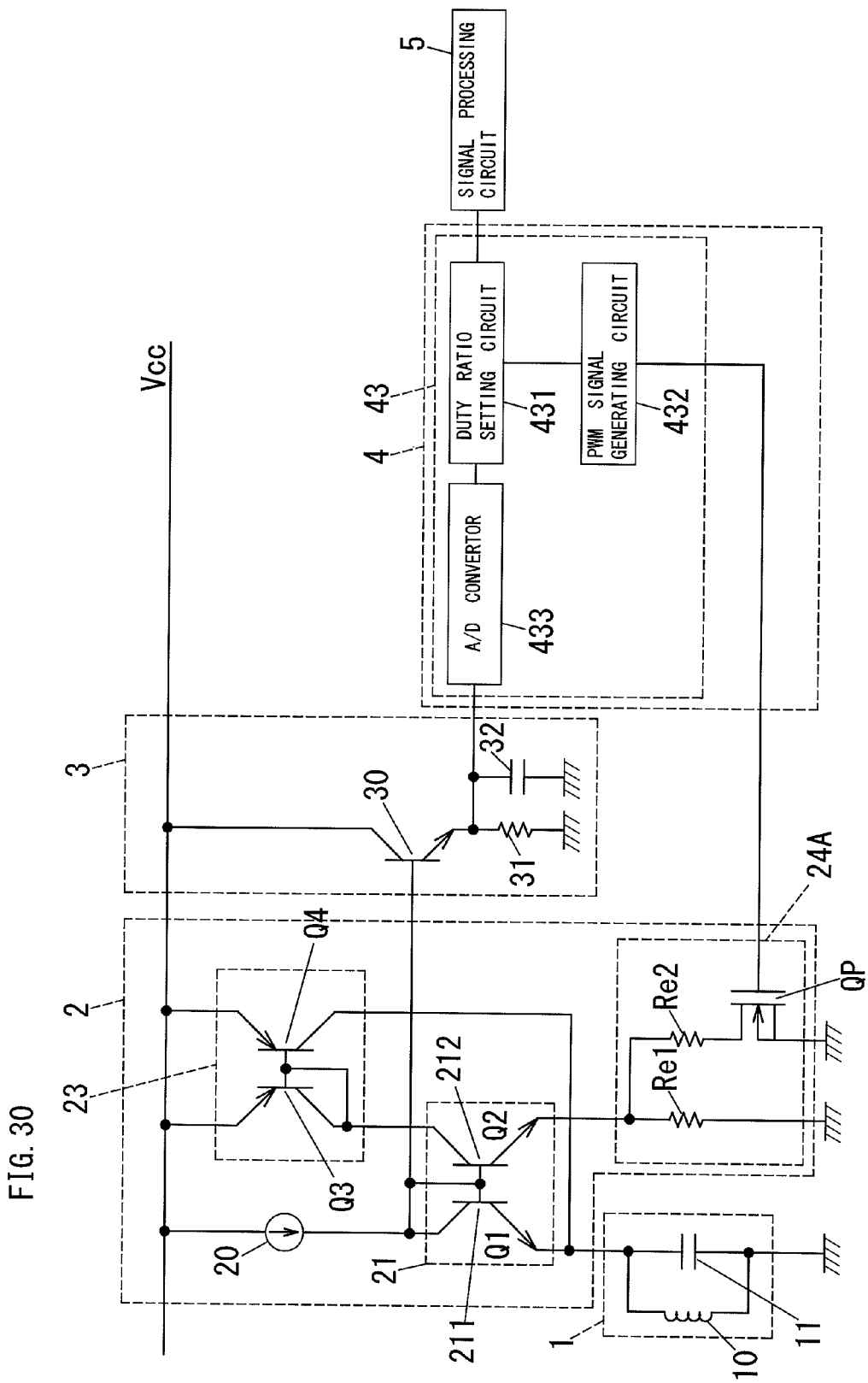
FIG. 30 is a schematic diagram of a proximity sensor according to a thirtieth embodiment of the present invention.

FIG. 30 shows a proximity sensor according to a thirtieth embodiment of the present invention. The proximity sensor according to the thirtieth embodiment is characterized by a PWM control circuit 43. The other composing elements are configured in the same way as the twenty ninth embodiment. Similar composing elements are denoted with same reference symbols used for the twenty ninth embodiment.

The PWM control circuit 43 according to the thirtieth embodiment includes an A/D converter 433, duty ratio setting circuit 431 and PWM signal generating circuit 432. The duty ratio setting circuit 431 and the PWM signal generating circuit 432 are configured in the same way as the twenty ninth embodiment.

The A/D converter 433 converts an analog signal, to show the amplitude of the oscillating voltage from the amplitude measurement circuit 3, into a digital data with a predetermined quantization width, and converts it into a digital code to show this digital data, and outputs this digital code to the duty ratio setting circuit 431. The analog signal is a voltage of the capacitor 32 of the amplitude measurement circuit 3. The A/D converter is well known to those skilled in the art, and is not described in detail here.

When the duty ratio is set so that the negative conductance ($G_{osc}$) of the oscillation control circuit 2 becomes the above mentioned critical value, the duty ratio setting circuit 431 according to the thirtieth embodiment uses a digital code from the A/D converter 433. For example, the duty ratio setting circuit 431 compares a digital code from the A/D converter 433 with a predetermined digital code, and sets a duty ratio according to this difference. The predetermined digital code is a digital code that shows an oscillating amplitude when the absolute value of the negative conductance ($G_{osc}$) and the absolute value of the conductance ($G_{coil}$) the same.

Compared with a configuration to include a comparison circuit to judge whether or not the amplitude from the amplitude measurement circuit 3 exceeds a predetermined value and to change the duty ratio according to this comparison result, the duty ratio can be quickly set to a value with which the absolute value of the negative conductance ($G_{osc}$) becomes the same as the absolute value of the conductance ($G_{coil}$). As a result, the processing speed (response and tracking to the change of the duty ratio) can be improved. For example, when the proximity sensor is started up, or even when the moving speed of the object (M) is fast, the negative conductance ($G_{osc}$) of the oscillation control circuit 2 can be quickly set to a critical value by which the LC resonant circuit 1 can oscillate, and generation of delay can be suppressed.

According to the thirtieth embodiment, the range of the negative conductance ($G_{osc}$) of the oscillation control circuit 2 that changes depending on the duty ratio is approximately the same as the range of the conductance ($G_{coil}$) of the sensing coil 10 that changes depending on the distance (d) of the object (M). Therefore the range in which the conductance ($G_{coil}$) of the sensing coil 10 changes can be determined in the sensing range, and precision can be improved. In particular, if the duty ratio is set using a digital code, the positional resolution can be relatively improved.

(Thirty First Embodiment)

Figure 31:
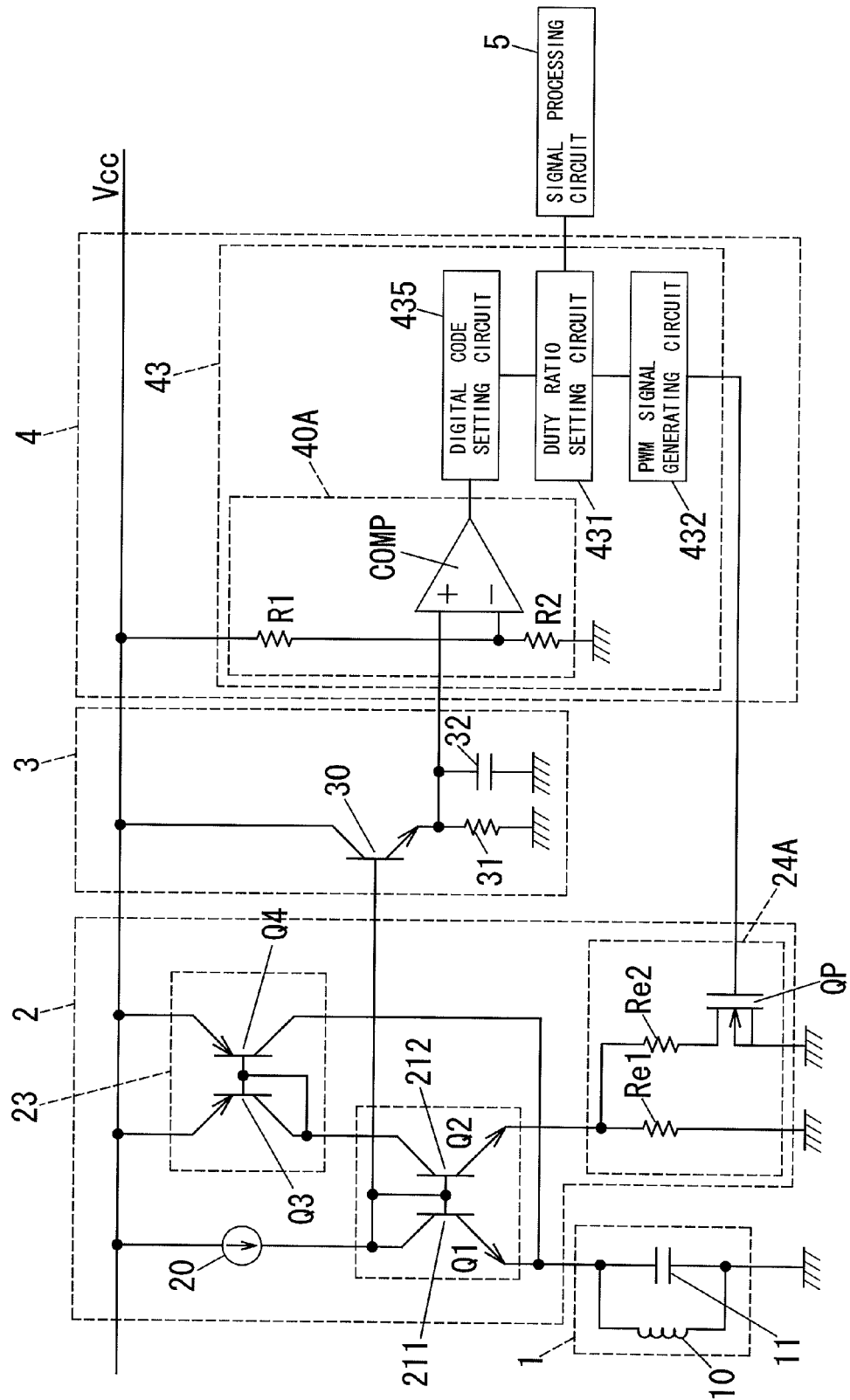
FIG. 31 is a schematic diagram of a proximity sensor according to a thirty first embodiment of the present invention.

FIG. 31 shows a proximity sensor according to a thirty first embodiment of the present invention. The proximity sensor according to the thirty first embodiment is characterized by a PWM control circuit 43. The other composing elements are configured in the same way as the twenty ninth embodiment. Similar composing elements are denoted with same reference symbols used for the twenty ninth embodiment.

The PWM control circuit 43 according to the thirty first embodiment includes a duty ratio setting circuit 431, PWM signal generating circuit 432, comparison circuit 40A and digital code setting circuit 435. The PWM signal generating circuit 432 is configured in the same way as the twenty ninth embodiment.

The duty ratio setting circuit 431 according to the thirty first embodiment is configured to monotonically increase the duty ratio according to the digital code from the digital code setting circuit 435. When the digital code is 4 bits, for example, the duty ratio setting circuit 431 sets the duty ratio to 0% if the digital code is "0000", and sets the duty ratio to 100% if the digital code is "1111".

The comparison circuit 40A is comprised of a voltage dividing circuit constituted by a series circuit of resistors (R1) and (R2) inserted between the internal power supply (reference power supply) (Vcc) and the ground, and a comparator (COMP).

The voltage dividing circuit supplies a predetermined threshold (Vth) to the comparator (COMP). The threshold (Vth) is a value that corresponds to an amplitude of an oscillating voltage when the absolute value of the negative conductance ($G_{osc}$) and the absolute value of the conductance ($G_{coil}$) are the same.

A reverse input terminal of the comparator (COMP) is connected to a connection point of the resistors (R1) and (R2). A non-reverse input terminal of the comparator (COMP) is connected with the output terminal of the amplitude measurement circuit 3. Therefore the comparator (COMP) outputs a high level signal if the amplitude of the oscillating voltage measured by the amplitude measurement circuit 3 exceeds a threshold (Vth), and outputs a low level signal if the amplitude falls below the threshold (Vth).

When a high level signal is received from the comparator (COMP), the digital code setting circuit 435 increases the digital code to increase the feedback current. When a low level signal is received from the comparator (COMP), the digital code setting circuit 435 decreases the digital code to decrease the feedback current.

To change the digital code, the digital code setting circuit 435 adds "1" to the least significant bit (first bit) of the digital code, or subtracts "1" from the least significant bit of the digital code. When the digital code is "0010", for example, if a high level signal is received from the comparator (COMP), the digital code setting circuit 435 adds "1" to the least significant bit of the digital code to set the digital code to "0011". If a low level signal is received from the comparator (COMP), the digital code setting circuit 435 subtracts "1" from the least significant bit of the digital code to set the digital code to "0001".

In other words, the digital code setting circuit 435 adds "1" to the least significant bit of the digital code if it is judged that the amplitude exceeds a threshold (Vth) in the comparison circuit 40A, and subtracts "1" from the least significant bit of the digital code if it is judged that the amplitude falls below the threshold (Vth).

According to the thirty first embodiment, the digital code is changed by adding or subtracting "1" to or from the least significant bit of the digital code, therefore generation of an overshoot or undershoot can be prevented when the negative conductance ($G_{osc}$) of the oscillation control circuit 2 is adjusted. Furthermore, it is not necessary to compute the target value of the digital code directly from the amplitude of the oscillating voltage. Therefore the comparison circuit 40A can be constructed using an inexpensive operational amplifier, and cost can be decreased, compared with a circuit including an A/D converter and CPU.

(Thirty Second Embodiment)

Figure 32:
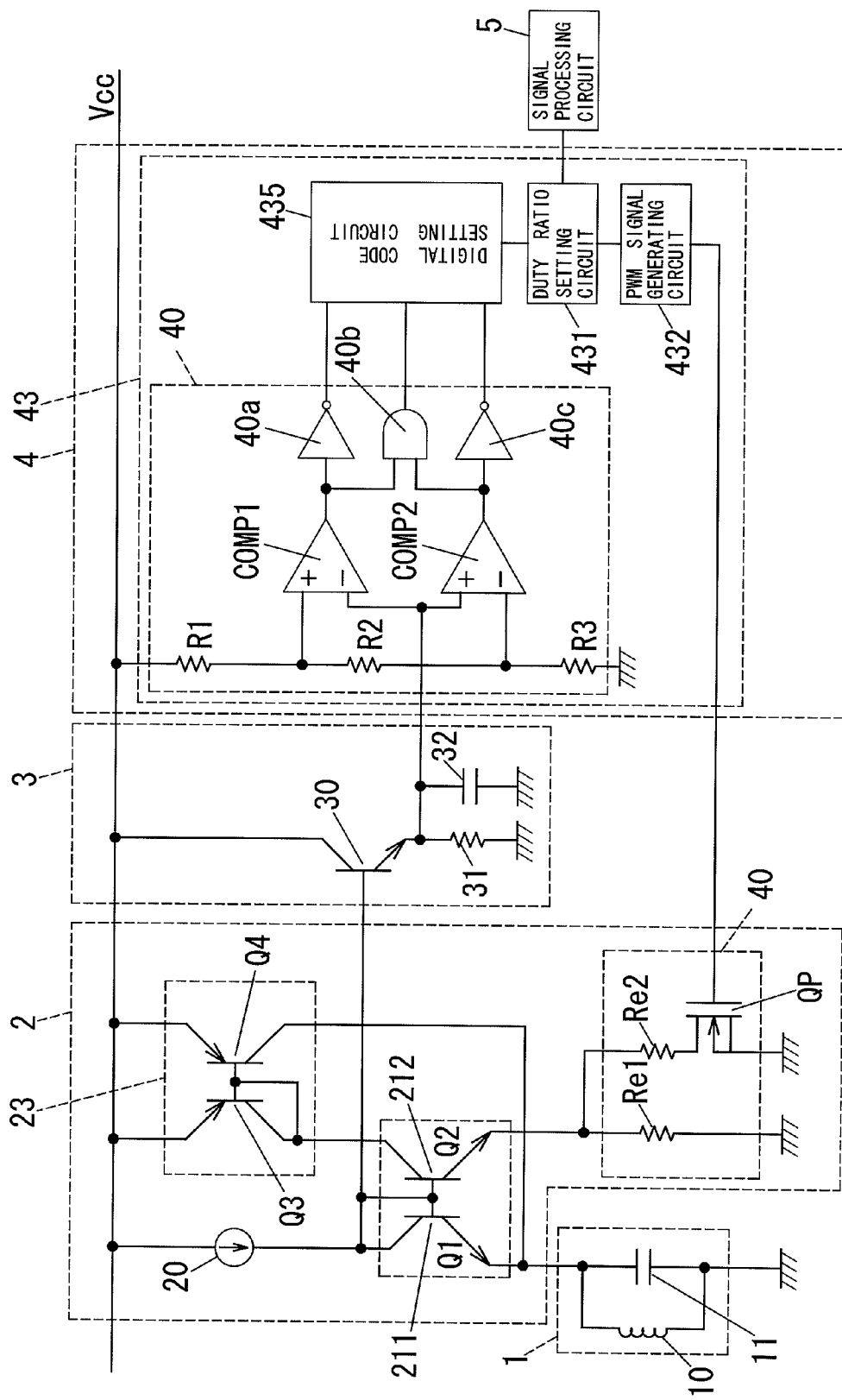
FIG. 32 is a schematic diagram of a proximity sensor according to a thirty second embodiment of the present invention.

FIG. 32 shows a proximity sensor according to a thirty second embodiment of the present invention. The proximity sensor according to the thirty second embodiment is characterized by a PWM control circuit 43. The other composing elements are configured in the same way as the thirty first embodiment. Similar composing elements are denoted with same reference symbols used for the thirty first embodiment.

The PWM control circuit 43 according to the thirty second embodiment includes a duty ratio setting circuit 431, PWM signal generating circuit 432, comparison circuit 40 and digital code setting circuit 435. The PWM signal generating circuit 432 is configured in the same way as the twenty ninth embodiment, and the comparison circuit 40 is configured in the same way as the third embodiment.

When a high level signal is received from the first NOT gate 40a, the digital code setting circuit 435 increases the digital code to increase the feedback current. When a high level signal is received from the AND gate 40b, the digital code setting circuit 435 maintains the feedback current at a current level. When a high level signal is received from the second NOT gate 40c, the digital code setting circuit 435 decreases the digital code to decrease the feedback current.

To change the digital code, the digital code setting circuit 435 adds "1" to the least significant bit (first bit) of the digital code, or subtracts "1" from the least significant bit of the digital code. When the digital code is "0010", for example, if a high level signal is received from the first NOT gate 40a, the digital code setting circuit 435 adds "1" to the least significant bit of the digital code to set the digital code to "0011". If a high level signal is received from the second NOT gate 40c, the digital code setting circuit 435 subtracts "1" from the least significant bit of the digital code to set the digital code to "0001".

In other words, the digital code setting circuit 435 adds "1" to the least significant bit of the digital code if it is judged that the amplitude exceeds an upper limit threshold V1 in the comparison circuit 40. The digital code setting circuit 435 subtracts "1" from the least significant bit of the digital code if it is judged that the amplitude falls below a lower limit threshold V2. If it is judged that the amplitude is between the thresholds (V1) and (V2), the digital code setting circuit 435 does not change the digital code.

According to the thirty second embodiment, the digital code is changed by adding or subtracting "1" to or from the least significant bit of the digital code. Therefore generation of an overshoot or undershoot can be prevented when the negative conductance ($G_{osc}$) of the oscillation control circuit 2 is adjusted. Furthermore, it is not necessary to compute the target value of the digital code directly from the amplitude of the oscillating voltage. Therefore the comparison circuit 40 can be constructed with an inexpensive window comparator, and cost can be decreased, compared with a circuit including an A/D converter and CPU.

(Thirty Third Embodiment)

Figure 33:
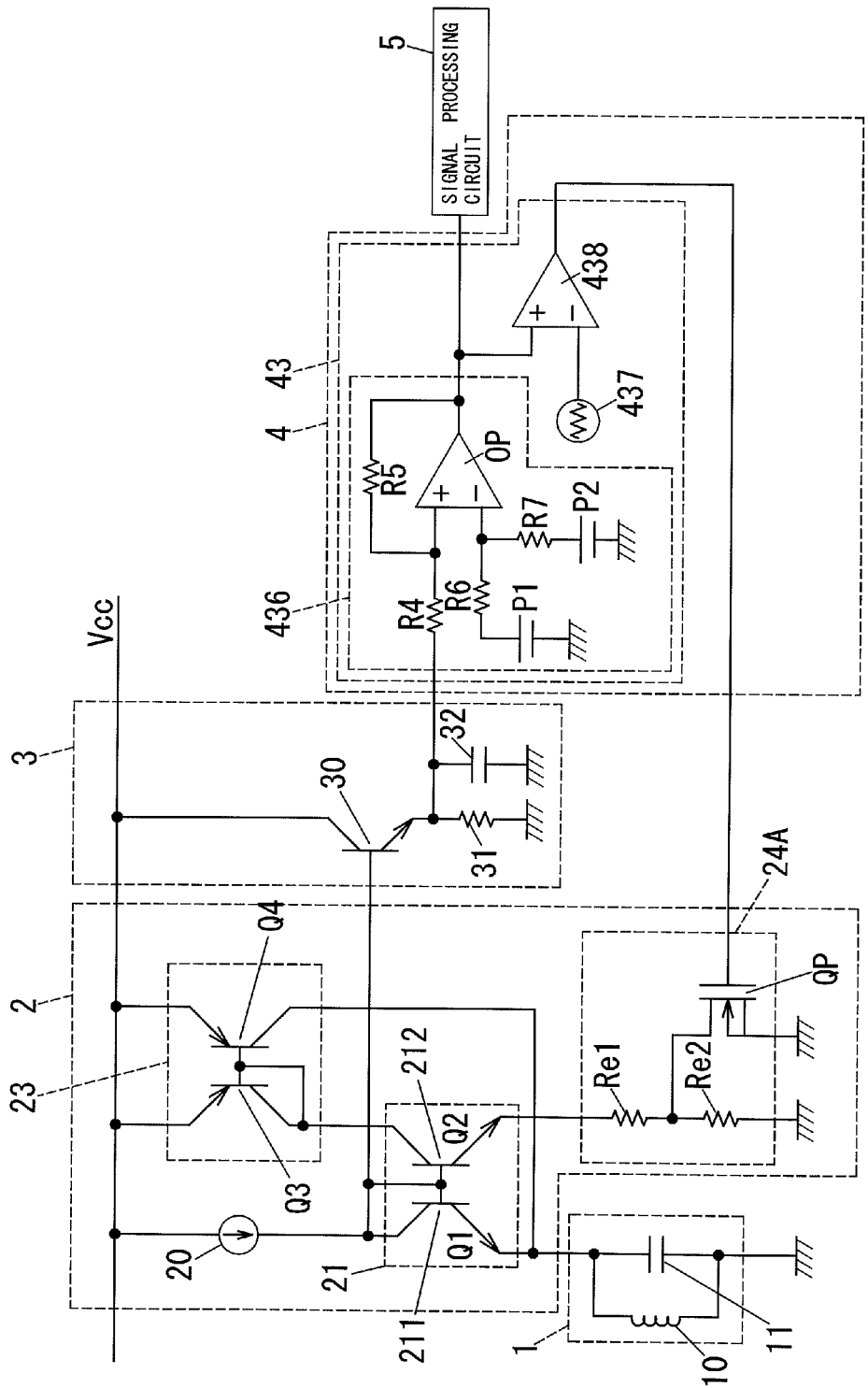
FIG. 33 is a schematic diagram of a proximity sensor according to a thirty third embodiment of the present invention.

FIG. 33 shows a proximity sensor according to a thirty third embodiment of the present invention. The proximity sensor according to the thirty third embodiment is characterized by a resistance circuit 24A and a PWM control circuit 43. The other composing elements are configured in the same way as the twenty ninth embodiment. Similar composing elements are denoted with same reference symbols used for the twenty ninth embodiment.

The resistance circuit 24A according to the thirty third embodiment has resistors (Re1) and (Re2), and semiconductor switching device (QP). The resistors (Re1) and (Re2) are connected in series between the emitter of the transistor (Q2) and the ground. The switching device (QP) is connected in parallel with the resistor (Re2).

If the switching device (QP) is ON, the current from the transistor (Q2) does not flow through the resistor (Re2). Therefore the resistance value of the resistance circuit 24A is equal to the resistor (Re1). It is preferable to consider the ON resistance of the switching device (QP) as well. If the switching device (QP) is OFF, the electric current from the transistor (Q2) flows through the resistor (Re2). Therefore the resistance value of the resistance circuit 24A becomes a combined resistance value of the resistors (Re1) and (Re2).

In other words, the resistance value of the resistance circuit 24A, when the switching device (QP) is ON, is lower than that of the resistance circuit 24A when the switching device (QP) is OFF. By turning the switching device (QP) ON/OFF by the PWM control, the period when the resistance circuit 24A is set to low resistance and the period when the resistance circuit 24A is set to high resistance can be switched using a predetermined duty ratio. Hence the substantial resistance value of the resistance circuit 24A changes according to the duty ratio of the PWM signal that is supplied to the switching device (QP).

The electric current from the emitter-follower circuit 212 flows through the resistance circuit 24A and reaches the ground, so the magnitude of the electric current from the emitter-follower circuit 212 and the magnitude of the feedback current are determined by a substantial resistance value of the resistance circuit 24A. Hence the feedback current according to the ON/OFF duty ratio of the switching device (QP) is supplied to the LC resonant circuit 1.

The PWM control circuit 43 according to the thirty third embodiment has an amplifying circuit 436, a triangular wave generating circuit 437 and a comparison circuit 438.

The amplifying circuit 436 is configured to amplifying the output of the amplitude measurement circuit 3, and outputting it. For example, the amplifying circuit 436 is a differential amplifier, and has an operational amplifier (OP), resistors (R4) to (R6) and power supplies (P1) and (P2) for applying a predetermined electric potential. The non-reverse input terminal of the operational amplifier (OP) is connected with one terminal of the resistor (R4). The other terminal of the resistor (R4) is connected with the high potential side of the capacitor 32 in the amplitude measurement circuit 3. The resistor (R5) is a feedback resistor and is connected between the reverse input terminal and the output terminal of the operational amplifier (OP). The reverse input terminal of the operational amplifier (OP) is connected with the power supply (P1) generating the reference voltage via the resistor (R6), and also is connected with the power supply (P2) generating the offset voltage via the resistor (R7). According to the thirty third embodiment, the resistance value of the resistor (R4) is the same as that of the resistor (R6), and the resistance value of the resistor (R5) is the same as that of the resistor (R7).

The triangular wave generating circuit 437 is configured to generate a triangular wave (sawtooth wave) having a cycle the same as the cycle of the PWM signal that is supplied to the switching device (QP). The triangular wave generating circuit is well known to those skilled in the art, and is not described in detail here.

The comparison circuit 438 is constituted by an operational amplifier, for example. The non-reverse input terminal of the comparison circuit 438 is connected with the output terminal of the amplifying circuit 436 (output terminal of the operational amplifier (OP)). The reverse input terminal of the comparison circuit 438 is connected with the output terminal of the triangular wave generating circuit 437. The output terminal of the comparison circuit 438 is connected with the gate of the switching element (QP).

The comparison circuit 438 compares the output of the amplifying circuit 436 and the triangular wave, and outputs a high level signal only while the output of the amplifying circuit 436 exceeds the triangular wave. In other words, the comparison circuit 438 outputs the PWM signal of which pulse width is the same as the period when the output of the amplifying circuit 436 exceeds the triangular wave.

The signal processing circuit 5 according to the thirty third embodiment generates the distance signal based on the output of the amplifying circuit 436 to be an electric signal relevant to the duty ratio that is set by the PWM control circuit 43.

According to the thirty third embodiment, the circuits can be simplified, and the PWM control circuit 43 can be completely constituted by analog circuits. Therefore problems unique to a digital circuit, such as chattering and hysteresis, are not generated, and stable operation is implemented.

(Thirty Fourth Embodiment)

Figure 34:
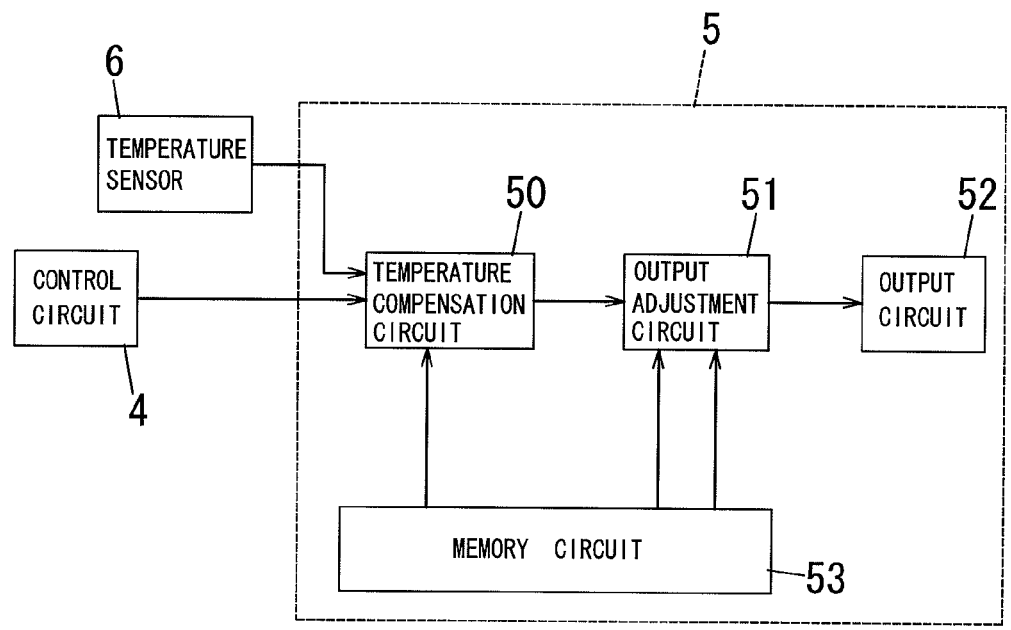
FIG. 34 is a schematic diagram of a proximity sensor according to a thirty fourth embodiment of the present invention.

FIG. 34 shows a proximity sensor according to a thirty fourth embodiment of the present invention. The proximity sensor according to the thirty fourth embodiment has a temperature sensor 6 (temperature measurement circuit) just like the fourth embodiment, and is characterized by a signal processing circuit 5. The other composing elements are configured in the same way as the thirty first embodiment. Similar composing elements are denoted with same reference symbols used for the thirty first embodiment. The thirty fourth embodiment can also be applied to the thirtieth and thirty second embodiments.

The signal processing circuit 5 according to the thirty fourth embodiment has a temperature compensation circuit 50, output adjustment circuit 51, output circuit 52 and memory circuit 53. The temperature compensation circuit 50 is configured to perform temperature compensation by multiplying a value of a digital code from the control circuit 4 (a digital code used for setting a duty ratio) by a correction temperature coefficient (correction coefficient) corresponding to a temperature detected by the temperature sensor 6. The output adjustment circuit 51 is configured to perform offset processing for adding a predetermined addition value to the digital code, and gain processing for multiplying the digital code by a predetermined multiplication value. The temperature compensation circuit 50 and output adjustment circuit 51 may be implemented by programs, or may be implemented by circuits that do not use problems.

The output circuit 52 generates a distance signal for showing the distance (d) between the sensing coil 10 and an object (M) based on the digital code after the temperature compensation by the temperature compensation circuit 50 and adjustment by the output adjustment circuit 51. For example, the output circuit 52 generates a distance signal using a data table to show the relationship of a digital code and a distance (d), or an expression to convert a value shown by a digital code into a distance (d).

The memory circuit 53 includes an erasable non-volatile memory, such as an EEPROM, and stores a data table of correction temperature coefficients that are used for the temperature compensation circuit 50, and addition values and multiplication values that are used for the output adjustment circuit 51. The data table of the correction temperature coefficients, addition values and multiplication values can be changed.

When a digital code is received, the temperature compensation circuit 50 acquires a correction temperature coefficient corresponding to the detected temperature of the temperature sensor 6 from the data table of the correction temperature coefficients stored in the memory circuit 53. Then the temperature compensation circuit 50 obtains a digital code by multiplying the value of the digital code by the correction temperature coefficient. The digital code is supplied to the output adjustment circuit 51. The correction temperature coefficient used for the temperature compensation circuit 50 are values that are set considering the temperature characteristics of the sensing coil 10, object (M) and circuits, including the oscillation control circuit 2, and can be determined based on the result of the temperature measurement using a reference, for example.

When a digital code is input, the output adjustment circuit 51 executes at least one of the above mentioned offset processing and gain processing to adjust the digital code. The addition value used for the offset processing is a positive or negative value that is added to the value shown by the digital code. The multiplication value is a value by which the value of the digital code is multiplied (that is, a value to specify the multiplying factor). Therefore the addition value is set to a positive value to shift the value of the digital code to the positive side. The addition value is set to a negative value to shift the value of the digital code to the negative side. The multiplication value is set to a value greater than "1" to increase the difference between the values shown by the digital code. The multiplication value is set to a value of "0" or greater and less than "1" to decrease the difference between the values shown by the digital code.

The offset processing and gain processing are performed to set a possible value of the distance signal that is generated by the output circuit 52 to a value within a desired range. For example, if a magnitude of the distance signal obtained by the digital code is greater than the magnitude that can be output by the output circuit 52 and is saturated depending on the operation state of the proximity sensor (e.g. type of material of an object (M)), the distance (d) between the sensing coil 10 and the object (M) may not be obtained. Therefore the value of the digital code is adjusted through the output adjustment circuit 51, so that the magnitude of the distance signal is confined to within a range of magnitudes that can be output by the output circuit 52, thereby saturation of the distance signal can be prevented.

According to the thirty fourth embodiment, the value of the digital code is corrected according to the temperature detected by the temperature sensor 6. Therefore deterioration of the sensing accuracy due to the temperature characteristics of the sensing coil 10, object (M) and circuits, including the oscillation control circuit 2 can be prevented, and sensing accuracy can be improved.

The characteristics of the sensing coil 10, relative positions of the sensing coil 10 and object (M), and temperature characteristics of the circuits, including the oscillation control circuit 2, disperse depending on the product. Since the correction temperature coefficient in the temperature compensation circuit 50 can be changed (erasable), dispersion of the distance signal depending on the product can be prevented. Therefore an appropriate distance signal can be obtained for all the proximity sensors.

The value of the digital code can be freely adjusted by the offset processing and gain processing, so the value of the distance signal can be determined to be a value within a desired range. The characteristics of the sensing coil 10, relative positions of the sensing coil 10 and object (M), and temperature characteristics of the circuits, including the oscillation control circuit 2, disperse depending on the product. Since the addition value used for the offset processing and the multiplication value used for the gain processing can be changed (erasable), dispersion of the distance signal depending on the product can be prevented. Therefore an appropriate distance signal value can be determined to be a value within a desired range for all the proximity sensors.

According to an example, the signal processing circuit 5 may have only one of the temperature compensation circuit 50 and the output adjustment circuit 51.

Although the present invention has been described with reference to certain preferred embodiments, numerous modifications and variations can be made by those skilled in the art without departing from the true spirit and scope of this invention.

The invention claimed is:

1. A proximity sensor, comprising:
an oscillation circuit having an LC resonant circuit and an oscillation control circuit, the LC resonant circuit including a sensing coil and a capacitor, the oscillation control circuit being configured to supply an electric current to the LC resonant circuit to generate oscillating voltage across the LC resonant circuit, a frequency of the oscillating voltage being decided by circuit parameters of the LC resonant circuit; and
an amplitude measurement circuit configured to produce an amplitude signal corresponding to amplitude of said oscillating voltage;
wherein the proximity sensor further comprises:
a control circuit configured to set negative conductance of the oscillation control circuit to a critical value by which the LC resonant circuit can oscillate, based on the amplitude signal; and
a signal processing circuit configured to produce a distance signal corresponding to the distance between an object and the sensing coil based on a parameter relevant to said negative conductance, the object changing impedance of the sensing coil by approaching the LC resonant circuit.

2. The proximity sensor of claim 1, wherein the oscillation control circuit comprising:
a current generation circuit which has first and second output terminals and is configured to generate an electric current between the first and second output terminals, said electric current corresponding to the oscillating voltage generated across the LC resonant circuit;
a feedback circuit connected with the first output terminal of the current generation circuit, the feedback circuit being configured to produce a feedback current in response to the electric current generated with the current generation circuit to supply the feedback current to the LC resonant circuit; and
a variable resistor circuit which comprises a variable resistor located between the second output terminal of the current generation circuit and ground, the variable resistor circuit being configured to adjust magnitude of the electrical current generated with the current generation circuit,
wherein the control circuit is configured to set a resistance value of the variable resistor circuit through the variable resistor so that the negative conductance of the oscillation control circuit is said critical value,
wherein the signal processing circuit is configured to produce said distance signal based on the resistance value of the variable resistor circuit.

3. The proximity sensor of claim 1, wherein the oscillation control circuit comprising:
a current generation circuit which has first and second output terminals and is configured to generate an electric current between the first and second output terminals, said electric current corresponding to the oscillating voltage generated across the LC resonant circuit; and
a feedback circuit configured to produce a feedback current in response to the electric current generated with the current generation circuit to supply the feedback current to the LC resonant circuit,
wherein the feedback circuit comprises a variable resistor circuit that comprises a variable resistor and is configured to adjust the magnitude of the feedback current with respect to the magnitude of the electric current generated with the current generation circuit,
wherein the control circuit is configured to set a resistance value of the variable resistor circuit through the variable resistor so that the negative conductance of the oscillation control circuit is said critical value,
wherein the signal processing circuit is configured to produce said distance signal based on the resistance value of the variable resistor circuit.

4. The proximity sensor of claim 1, wherein the oscillation control circuit comprising:
- a current generation circuit comprising an amplifying circuit and a VI conversion circuit, the amplifying circuit being configured to amplify the oscillating voltage generated across the LC resonant circuit, the VI conversion circuit being configured to generate an electric current corresponding to the oscillating voltage amplified through the amplifying circuit; and
- a feedback circuit configured to produce a feedback current in response to the electric current generated with the current generation circuit to supply the feedback current to the LC resonant circuit,
- wherein the amplifying circuit comprises a variable resistor for adjusting a gain of the oscillating voltage,
- wherein the control circuit is configured to set a resistance value of the variable resistor circuit through the variable resistor so that the negative conductance of the oscillation control circuit is said critical value,
- wherein the signal processing circuit is configured to produce said distance signal based on the resistance value of the variable resistor circuit.

5. The proximity sensor of any one of claims 2-4, wherein the variable resistor circuit is a series or parallel circuit of at least one fixed resistor and at least one variable resistor.

6. The proximity sensor of any one of claims 2-4,
- wherein the variable resistor is a digital potentiometer capable of setting its own resistance value by a digital code,
- wherein the control circuit is configured to supply the variable resistor and the signal processing circuit with the digital code that defines the resistance value of the variable resistor for setting the negative conductance of the oscillation control circuit to said critical value,
- wherein the signal processing circuit is configured to produce said distance signal based on the digital code supplied from the control circuit.

7. The proximity sensor of claim 6,
- wherein the amplitude measurement circuit comprises a former circuit and a latter circuit,
- the former circuit being configured to measure amplitude of the oscillating voltage generated across the LC resonant circuit to produce an analog signal corresponding to the amplitude,
- the latter circuit being an A/D convertor configured to convert the analog signal into a digital signal to supply the digital signal to the control circuit,
- wherein the control circuit is configured to produce the digital code from the digital signal.

8. The proximity sensor of claim 6, wherein
- the control circuit comprises a comparison circuit configured to compare the amplitude signal with a threshold,
- the control circuit being configured to decide whether or not to change the resistance value of the digital potentiometer base on a comparison result of the comparison circuit to increase or decrease the digital code one by one when changing the resistance value.

9. The proximity sensor of claim 6, wherein the control circuit comprises a timing circuit configured to generate a signal having a frequency for defining an output timing of a digital code, the frequency for defining an output timing being lower than that of the oscillating signal.

10. The proximity sensor of claim 6, wherein the signal processing circuit comprises an output adjustment circuit configured to add at least one of an offset and a gain to the digital code supplied from the control circuit.

11. The proximity sensor of claim 10, wherein each of the offset and the gain is variable.

12. The proximity sensor of claim 1,
- wherein the control circuit is configured to produce a digital code for setting negative conductance of the oscillation control circuit to said critical value,
- wherein the oscillation control circuit comprises a current control circuit configured to function as a D/A converter which generates an electric current corresponding to the digital code,
- the oscillation control circuit being configured to supply the LC resonant circuit with a feedback current proportionate to the electric current generated through the current control circuit,
- wherein the signal processing circuit is configured to produce said distance signal based on the digital code produced through the control circuit.

13. The proximity sensor of claim 12,
- wherein the current control circuit includes an input transistor and a plurality of output transistors constituting a current mirror circuit, as well as a plurality switches,
- the input transistor and the plurality of output transistors being connected with a reference supply,
- each of the plurality of output transistors producing a mirror current in response to a reference current corresponding to the oscillating voltage which is supplied to the input transistor and generated across the LC resonant circuit, the mirror current being proportionate to the reference, current,
- wherein the plurality switches is controlled based on the digital code, and controlled based on the digital code and is configured, if at least a mirror current is obtained from the plurality of output transistors, to produce the feedback circuit from the at least a mirror current.

14. The proximity sensor of claim 13, wherein each of the plurality switches is connected between a corresponding output transistor and the input transistor, or between the corresponding output transistor and the reference supply.

15. The proximity sensor of claim 13, wherein each of the plurality switches is configured to draw the reference current produced through a corresponding output transistor out of the feedback current.

16. The proximity sensor of claim 13, wherein at lease one of the output transistors is different in transistor size from the other output transistors.

17. The proximity sensor of claim 13, wherein the current mirror circuit includes a plurality of resistance circuits for limiting mirror currents,
- the plurality of resistance circuits being connected between the plurality of output transistors and the reference supply, respectively,
- a resistance value of at least one of the resistance circuits being different from each resistance value of the other resistance circuits.

18. The proximity sensor of claim 17, wherein the plurality of the switches are connected between the plurality of resistance circuits and the reference supply, respectively.

19. The proximity sensor of claim 12,
- wherein the plurality of switches are related to a plurality of bits of the digital code, respectively,
- each of the switches being controlled by means of its own related bit value, wherein a ratio of a mirror current produced through each of the output transistors to the reference current is given by
2(n−1),
where the reference current is a mirror current corresponding to a first bit value in the digital code, and n is ordinal number of each bit in the digital code.

20. The proximity sensor of claim 13, wherein the output transistors respectively corresponding to the switches include at least an output transistor for offset, which is connected with the reference supply and constantly produces a mirror current proportionate in magnitude to the reference current.

21. The proximity sensor of claim 12,
wherein the oscillation control circuit comprises a feedback circuit having an input transistor and an output transistor constituting a current mirror circuit, the input transistor and the output transistor being connected with the reference supply, the output transistor producing a mirror current in response to a reference current that is an electric current from the current control circuit, said mirror current being the feedback current and proportionate in magnitude to the reference current,
wherein the current control circuit comprises:
a plurality of amplifying circuits each of which is configured to produce an amplification current in response to the oscillating voltage generated across the LC resonant circuit; and
a plurality of switches which are controlled based on the digital code and configured, if at least an amplification current is obtained from the plurality of amplifying circuits, to produce the reference current from the at least an amplification current.

22. The proximity sensor of claim 21,
wherein the oscillation control circuit comprises a level shift circuit configured to perform level shift of said oscillating voltage,
wherein each of the amplifying circuits comprises an amplifying transistor which has a pair of controlled electrodes, and a control electrode for controlling an energization amount between the controlled electrodes, the controlled electrodes being electrically connected to the input transistor and the side of reference potential, respectively, the control electrode being electrically connected with the output of the level shift circuit,
wherein the plurality of switches are respectively connected between the reference potential and the amplifying transistors, or between the output of the level shift circuit and the control electrodes of the amplifying transistors.

23. The proximity sensor of claim 21, wherein each of the switches is configured to draw an amplification current produced through a corresponding amplifying circuit out of the reference current.

24. The proximity sensor of claim 21,
wherein the oscillation control circuit comprises a level shift circuit configured to perform level shift of said oscillating voltage,
wherein each of the amplifying circuits comprises an amplifying transistor and a resistance circuit for limiting an amplification current,
the amplifying transistor having a pair of controlled electrodes, and a control electrode for controlling an energization amount between the controlled electrodes, the controlled electrodes being electrically connected to the input transistor and the side of reference potential, respectively, the control electrode being electrically connected with the output of the level shift circuit, the resistance circuit being connected between the amplifying transistor and the reference potential,
wherein at least a resistance circuit of the amplifying circuits is different in resistance value from the other resistance circuits.

25. The proximity sensor of claim 24,
wherein the plurality of switches are related to a plurality of bits of the digital code, respectively,
each of the switches being controlled by means of its own related bit value,
wherein a ratio of an amplification current produced through each of the amplifying transistors to the reference amplification current is given by
2(n−1),
where the reference amplification current is an amplification current corresponding to a first bit value in the digital code, and n is ordinal number of each bit in the digital code.

26. The proximity sensor of claim 21, wherein the amplifying circuits respectively corresponding to the plurality of switches include an amplifying circuit for offset configured to supply the input transistor with an amplification current in response to the oscillating voltage generated across the LC resonant circuit.

27. The proximity sensor of claim 12,
wherein the amplitude measurement circuit comprises a former circuit and a latter circuit,
the former circuit being configured to measure amplitude of the oscillating voltage generated across the LC resonant circuit to produce an analog signal corresponding to the amplitude,
the latter circuit being an A/D convertor configured to convert the analog signal into a digital signal to supply the digital signal to the control signal.

28. The proximity sensor of claim 12,
wherein the current control circuit is configured to monotonically increase the electric current generated with the current control circuit in response to the digital code,
wherein the control circuit comprises:
a comparison circuit configured to determine whether or not the amplitude signal exceeds a threshold; and
an arithmetic processing circuit configured to change the digital code if the amplitude signal exceeds the threshold and also to keep the digital code if the amplitude signal does not exceed the threshold,
wherein the arithmetic processing circuit adds or subtracts 1 to or from the least significant bit of the digital code when changing the digital code.

29. The proximity sensor of claim 12,
wherein the current control circuit is configured to monotonically increase the electric current generated with the current control circuit in response to the digital code,
wherein the control circuit comprises a comparison circuit and an arithmetic processing circuit,
the comparison circuit having an upper limit threshold and a lower limit threshold with respect to the amplitude signal,
the comparison circuit being configured to determine that the amplitude signal exceeds the upper limit threshold, falls below the lower limit threshold or exists between the thresholds,
the arithmetic processing circuit being configured: to decrease the digital code if the amplitude signal exceeds the upper limit threshold; to increase the digital code if the amplitude signal falls below the lower limit threshold; or to keep the digital code if the amplitude signal exists between the thresholds, the arithmetic processing circuit being configured: to subtract 1 from the least significant bit of the digital code when decreasing the digital code; and to add 1 to the least significant bit of the digital code when increasing the digital code.

30. The proximity sensor of claim 12, wherein the control circuit comprises a timing circuit configured to generate a signal, for defining a timing by which the digital code is supplied to the current control circuit, based on a specified frequency lower than that of the oscillating signal.

31. The proximity sensor of claim 12, wherein the signal processing circuit is configured to perform at least one of an offset processing for adding a specified addition value to the digital code and a gain processing for multiplying the digital code by a specified multiplication value.

32. The proximity sensor of claim 31, wherein the addition value and the multiplication value are variable.

33. The proximity sensor of claim 1,
wherein the oscillation control circuit comprises:
a current generation circuit configured to produce an electric current corresponding to the oscillation voltage generated across the LC resonant circuit; and
a feedback circuit configured to supply the LC resonant circuit with a feedback current according to magnitude of the electric current generated with the current generation circuit,
wherein the oscillation control circuit and the control circuit comprise a resistance circuit and a PWM control circuit, respectively,
the resistance circuit having a plurality of resistors, and a semiconductor switching device connected in series or parallel to any resistor of the plurality of resistors, the resistance circuit being configured to adjust magnitude of the electric current produced with the current generation circuit by adjusting a resistance value of the resistance circuit through the semiconductor switching device,
the PWM control circuit being configured: to set a duty ratio of a PWM signal so that the negative conductance of the oscillation control circuit is said critical value; and to supply the PWM signal to the semiconductor switching device to turn the semiconductor switching device on and off by PWM control,
wherein the signal processing circuit is configured to produce said distance signal based on an electric signal relevant to the duty ratio.

34. The proximity sensor of claim 33, wherein the PWM signal has a frequency at least three times higher than the oscillating signal.

35. The proximity sensor of claim 33,
wherein the PWM control circuit is configured to supply said PWM signal to the semiconductor switching device and the signal processing circuit,
wherein the signal processing circuit is configured to produce the distance signal by setting the PWM signal from the PWM control circuit for the distance signal.

36. The proximity sensor of claim 33,
wherein the PWM control circuit is configured to supply said PWM signal to the semiconductor switching device and the signal processing circuit,
wherein the signal processing circuit is configured to convert the PWM signal from the PWM control circuit into a signal having an electrical potential corresponding a duty ratio of the PWM signal to produce the distance signal.

37. The proximity sensor of claim 33, wherein the semiconductor switching device is used as a resistor of the resistance circuit.

38. The proximity sensor of claim 33,
wherein the negative conductance set to said critical value corresponds to:
the maximal value of conductance of the sensing coil in a variability region of distance between the object and the sensing coil when the duty ratio is 100%; and
the minimum value of conductance of the sensing coil in a variability region of distance between the object and the sensing coil when the duty ratio is 0%

39. The proximity sensor of claim 33,
wherein the amplitude measurement circuit is configured to produce an analog signal corresponding to amplitude of the oscillating voltage generated across the LC resonant circuit,
wherein the PWM control circuit comprises an A/D converter configured to convert the analog signal into a digital signal to generate a digital code, the PWM control circuit being configured to set said duty ratio based on the digital code.

40. The proximity sensor of claim 33,
wherein the PWM control circuit comprises a comparison circuit, a digital code setting circuit and a duty ratio setting circuit,
the comparison circuit being configured to determine whether or not the amplitude signal exceeds a threshold,
the digital code setting circuit is configured to adjust the digital code by:
adding 1 to the least significant bit of the digital code if the amplitude signal exceeds the threshold; and also
subtracting 1 from the least significant bit of the digital code if the amplitude signal falls below the threshold,
the duty ratio setting circuit being configured to monotonically increase said duty ratio in response to the digital code adjusted by the digital code setting circuit.

41. The proximity sensor of claim 33,
wherein the PWM control circuit comprises a comparison circuit, a digital code setting circuit and a duty ratio setting circuit,
the comparison circuit having an upper limit threshold and a lower limit threshold with respect to the amplitude signal,
the comparison circuit being configured to determine that the amplitude signal exceeds the upper limit threshold, falls below the lower limit threshold or exists between the thresholds,
the digital code setting circuit is configured to adjust the digital code by:
adding 1 to the least significant bit of the digital code if the amplitude signal exceeds the upper limit threshold;
subtracting 1 from the least significant bit of the digital code if the amplitude signal falls below the lower limit threshold; or
keeping the digital code if the amplitude signal exists between the thresholds,
the duty ratio setting circuit being configured to monotonically increase said duty ratio in response to the digital code adjusted by the digital code setting circuit.

42. The proximity sensor of claim 33, wherein the PWM control circuit comprises:
an amplifying circuit configured to amplify the amplitude signal;
a triangular wave generating circuit configured to generate triangular wave pulses; and a comparison circuit configured to compare the amplitude signal with triangular wave pulses to thereby produce a PWM signal of which pulse width is adjusted in a period of time during which a level of the amplitude signal exceeds a level of the triangular wave pulses.

43. The proximity sensor of claim 39, wherein the signal processing circuit is configured to perform at least one of an offset processing for adding a specified addition value to the digital code and a gain processing for multiplying the digital code by a specified multiplication value.

44. The proximity sensor of claim 43, wherein the addition value and the multiplication value are variable.

45. The proximity sensor of claim 12 or 39, comprising a temperature measurement circuit configured to measure an ambient temperature, wherein the signal processing circuit comprises a temperature compensation circuit configured to perform temperature compensation of the digital code by multiplying the digital code by a correction coefficient corresponding to the ambient temperature.

46. The proximity sensor of claim 45, wherein the correction coefficient is variable.

47. The proximity sensor of any one of claims 1, 2, 3, 4, 12 and 33, wherein the oscillation control circuit, the amplitude measurement circuit, the control circuit and the signal processing circuit are mounted on a monolithic IC.

48. The proximity sensor of claim 6, comprising a temperature measurement circuit configured to measure an ambient temperature, wherein the signal processing circuit comprises a temperature compensation circuit configured to perform temperature compensation of the digital code by multiplying the digital code by a correction coefficient corresponding to the ambient temperature.

49. The proximity sensor of claim 48, wherein the correction coefficient is variable.

* * * * *